(12) United States Patent
Tsuchi

(10) Patent No.: US 6,614,295 B2
(45) Date of Patent: Sep. 2, 2003

(54) FEEDBACK-TYPE AMPLIFIER CIRCUIT AND DRIVER CIRCUIT

(75) Inventor: Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/028,779

(22) Filed: Dec. 28, 2001

(65) Prior Publication Data

US 2002/0084840 A1 Jul. 4, 2002

(30) Foreign Application Priority Data

Dec. 28, 2000 (JP) .......................................... 2000-402079
Dec. 6, 2001 (JP) .......................................... 2001-373302

(51) Int. Cl.[7] .................................................. G06G 7/12
(52) U.S. Cl. ........................................ 327/563; 327/541
(58) Field of Search ................................. 327/72, 73, 77, 327/52, 54, 65, 67, 112, 560–563, 131, 134, 170, 541, 543

(56) References Cited

U.S. PATENT DOCUMENTS 5,592,121 A * 1/1997 Jung et al. ................... 327/541

6,111,457 A * 8/2000 Lim et al. .................... 327/541

FOREIGN PATENT DOCUMENTS

| JP | 11-259052 | 9/1999 |
| JP | 2000-338461 | 12/2000 |

OTHER PUBLICATIONS

H. Tsuchi et al., "A New Low–Power TFT–LCD Driver for Portable Devices", SID00 Digest, pp. 46–149.

* cited by examiner

Primary Examiner—Toan Tran
(74) Attorney, Agent, or Firm—Young & Thompson

(57) ABSTRACT

Disclosed is a feedback-type amplifier circuit including feedback-type charging means, which operates as a voltage follower, having a differential stage which receives an input-terminal voltage and an output-terminal voltage differentially as inputs and charging means for performing a charging operation at the output terminal based upon an output from the differential stage; and follower-type discharging means for performing a discharging operation at the output terminal by follower operation of an active element in accordance with a voltage difference between the input-terminal voltage and the output-terminal voltage.

75 Claims, 49 Drawing Sheets

FIG. 31

| GRAYSCALE LEVEL | ONE DATA SELECTION TIME PERIOD HIGH-POTENTIAL LEVEL | ONE DATA SELECTION TIME PERIOD LOW-POTENTIAL LEVEL |
|---|---|---|
| CHARGING MEANS 31 | OPERATE | HALT |
| DISCHARGING MEANS 32 | HALT | OPERATE |

FIG. 32

| GRAYSCALE LEVEL / TIMING | ONE DATA SELECTION TIME PERIOD | | ONE DATA SELECTION TIME PERIOD | |
|---|---|---|---|---|
| | HIGH-POTENTIAL LEVEL | | LOW-POTENTIAL LEVEL | |
| | t0-t1 | t1-t2 | t0-t1 | t1-t2 |
| CHARGING MEANS 31 | HALT | OPERATE | OPERATE | HALT |
| DISCHARGING MEANS 32 | OPERATE | HALT | HALT | OPERATE |

FIG . 37

| OUTPUT DELAY TIME WHEN DRIVING WITH 0.2V-6.8V | PROXIMAL END OF LOAD 3τ (95%) | DISTAL END OF LOAD 3τ (95%) |
|---|---|---|
| RISE (0.2V→6.8V) | 0.34μs | 5.83μs |
| FALL (6.8V→0.2V) | 0.42μs | 5.88μs |

*ONE DATA LINE LOAD: 60kΩ, 60pF    POWER-SUPPLY VOLTAGE:0V-7V

ONE DATA LINE LOAD EQUIVALENT CIRCUIT

FEEDBACK-TYPE AMPLIFIER CIRCUIT AND DRIVER CIRCUIT

FIELD OF THE INVENTION

This invention relates to an amplifier and a driver circuit for driving a capacitive load to a desired voltage. More particularly, the invention relates to a driver circuit capable of driving a data line of a capacitive load at a high speed with low power consumption in an active matrix display device (such as a TFT-LCD or TFT-OLED, etc.).

BACKGROUND OF THE INVENTION

FIGS. 33A and 33B are diagrams illustrating conventional circuit structures of simplest feedback-type charging means. As shown in FIG. 33A, the charging means includes N-channel MOS transistors 903 and 904 constituting a differential pair in which the sources are coupled together and connected to one end of a constant-current source 905 and gates are connected to an input terminal 1 (Vin) and an output terminal 2 (Vout), respectively; a P-channel MOS transistor 901 (a transistor on the current output side of a current mirror) having its source connected to a higher-side potential power supply VDD, its gate connected to the gate of a P-channel MOS transistor 902 and a drain connected the drain of the N-channel MOS transistor 903; a P-channel MOS transistor 902 (a transistor on the current input side of the current mirror) having its source connected to the higher-potential side power supply VDD and its drain and gate tied together and connected to the drain of the N-channel MOS transistor 904; and a P-channel MOS transistor 906 having the output of the differential pair (the drain of the N-channel MOS transistor 903) input to its gate and having its source connected to the higher-side potential power supply VDD and its drain connected to a node between the output terminal 2 (Vout) and a constant-current source 907.

When Vin>Vout holds, the output voltage Vout can be pulled up to Vin at high speed owing to the charging action of the P-channel MOS transistor 906. If the current of the constant-current source 907 is kept sufficiently small, the output voltage Vout can be driven stably to a voltage that is equal to the input voltage Vin.

If the charging capability is very high, however, overshoot occurs owing to a response delay ascribable to parasitic capacitance or the like of the elements in the feedback-type arrangement. But since the discharging capability of the constant-current source 907 is being suppressed, it takes time to recover from the overshoot and to achieve a stable drive in which Vout becomes a voltage equal to Vin. In other words, a problem which arises is that high-speed drive is difficult to achieve.

If the current of current source 907 is increased, the discharging capability is enhanced and overshoot and undershoot are alternately repeated so that oscillation is produced.

In order to prevent such oscillation, a phase compensating capacitor 908 is provided between the connection node of output terminal 2 and the gate of the N-channel MOS transistor 904 and the gate terminal of the P-channel MOS transistor 906, as illustrated in FIG. 33B. As a result, stabilization is achieved rapidly and high-speed drive becomes possible even if the charging capability of P-channel MOS transistor 906 and the discharging capability of constant-current source 907 are both high.

If the phase compensating capacitor 908 is to be charged and discharged at high speed, however, a sufficient current must be made to flow into the current source 905 of the differential stage. As a consequence, a problem which arises is an increase in power consumption.

Reference will now be had to FIG. 35 to describe art proposed by the present inventor in the specification of Japanese Patent Application Laid-Open No. 2000-338461 (Japanese Application No. 11-145768) and in SID00 Digest, pp. 146–149 (distributed on May 14, 2000). As shown in FIG. 35, a circuit 1020 has P-channel MOS transistors 1003 and 1004 whose sources are connected to one ends of constant-current sources 1001 and 1002, respectively, the other ends of which are connected to a higher-potential side power supply VDD. The gate and drain of the P-channel MOS transistor 1003 are tied together and connected to one end of a constant-current source 1005 the other end of which is connected to a lower-potential power supply VSS, the gate of the P-channel MOS transistor 1004 is connected to the gate of the P-channel MOS transistor 1003, the drain of the P-channel MOS transistor 1004 is connected to the power supply VSS, the source of the P-channel MOS transistor 1003 is connected to one output terminal of a changeover switch 1011, and the source of the P-channel MOS transistor 1004 is connected to one input terminal of a changeover switch 1012. A circuit 1030 has N-channel MOS transistors 1007 and 1008 whose sources are connected to one ends of constant-current sources 1009 and 1010, respectively, the other ends of which are connected to the lower-potential side power supply VSS. The gate and drain of the N-channel MOS transistor 1007 are tied together and connected to one end of a constant-current source 1006 the other end of which is connected to the power supply VDD, the gate of the N-channel MOS transistor 1008 is connected to the gate of the N-channel MOS transistor 1007, the drain of the N-channel MOS transistor 1008 is connected to the power supply VDD, the source of the N-channel MOS transistor 1007 is connected to the other output terminal of the changeover switch 1011, and the source of the N-channel MOS transistor 1008 is connected to the other input terminal of the changeover switch 1012. The input terminal of the changeover switch 1011 is connected to the input terminal 1 and the output terminal of the changeover switch 1012 is connected to the output terminal 2. A switch 1013 is connected between the output terminal 2 and the power supply VDD, and a switch 1014 is connected between the output terminal 2 and the power supply VSS.

This circuit performs a driving function by utilizing the source-follower operation of a transistor. In order to achieve a drive with a source-follower operation at all time, when the voltage on the higher-potential side of the output-voltage range is output, the output voltage Vout is pre-charged to the higher-potential side power-supply voltage VDD by a pre-charging circuit 1040, thereby actuating the circuit 1020 and when the voltage on the lower-potential side of the output-voltage range is output, the output voltage Vout is discharged to the power-supply voltage VSS on the low-potential side by the pre-charging circuit 1040, thereby actuating the circuit 1030.

Assume that the circuit 1020 is in a state in which the sources of each of the P-channel MOS transistors 1003 and 1004 have been cut off from the input terminal 1 and output terminal 2. If in this state the currents of the constant-current sources 1001, 1002 and 1005 in circuit 1020 are set in such a manner that the gate-source voltages of the P-channel MOS transistors 1003 and 1004 will become equal, the circuit 1020 will be connected to the input terminal 1 and output terminal 2 and will operate. When the circuit operates, the output terminal 2 that has been pre-charged to the voltage VDD is discharged rapidly by the source-follower operation of the P-channel MOS transistor 1004 and the output voltage Vout is pulled down to a voltage equal to the input voltage, whereby a stable state is achieved.

Similarly, assume that the circuit 1030 is in a state in which the sources of each of the N-channel MOS transistors 1007 and 1008 have been cut off from the input terminal 1 and output terminal 2. If in this state the currents of the constant-current sources 1006, 1009, and 1010 in circuit 1030 are set in such a manner that the gate-source voltages of the N-channel MOS transistors 1007 and 1008 will become equal, the circuit 1030 will be connected to the input terminal 1 and output terminal 2 and will operate. When the circuit operates, the output terminal 2 that has been discharged to the voltage VSS is charged rapidly by the source-follower operation of the N-channel MOS transistor 1008 and the output voltage Vout is pulled up to a voltage equal to the input voltage, whereby stable state is achieved.

Thus, the driver circuit of FIG. 35 controls the pre-charging circuit 1040, the circuit 1020, and the circuit 1030 in an optimal manner in response to the input voltage, thereby making it possible to drive the output voltage Vout to a voltage equal to the input voltage rapidly by source-follower operation.

This circuit is capable of performing drive rapidly based upon source-follower operation merely by flowing a small current in each of the current sources. If a load capacitance is small, the drive can be achieved with a low power consumption. If the load capacitance is large, however, pre-charging or discharging is accompanied by too much charging and discharging and power consumption increases as a result.

Further, much time is required for pre-charging and discharging, making it difficult to achieve high-speed drive.

SUMMARY OF THE DISCLOSURE

In a feedback-type amplifier circuit of an operational amplifier according to the prior art, the charging and discharging operations of the output stage are intense. After drive up to a desired voltage is carried out, therefore, overshoot and undershoot are repeated owing to a delay caused by feedback and a stabilized output is not obtained unless phase compensation means (a phase compensating capacitor) is provided.

If a phase compensating capacitor is provided, then, in order to perform high-speed operation, a large current for charging and discharging the phase compensating capacitance at high speed must been passed. This results in an increase in power consumption.

The larger the phase compensating capacitance, the more stable operation becomes. The higher the operating speed is made, therefore, the larger the phase compensating capacitance that must be provided. This leads to a further increase in power consumption.

A feedback-type amplifier circuit of the conventional type (operational-amplifier type) cannot achieve high-speed, stabilized drive with little consumption of power.

Accordingly, it is an object of the present invention to provide a driver circuit in which output voltage Vout can be driven to a level equal to input voltage Vin at high speed with little operation maintaining current, and in which even a large capacitance load can be driven at high speed with low power consumption because operation is not accompanied by needless charging and discharging, thus making it possible to implement high-performance operation.

It is another object of the present invention to provide a driver circuit which is capable of suppressing vibration of an output waveform of the driver circuit in such a case of driving for example a large capacitance load or the like.

It is still another object of the present invention to provide a driver circuit which un-necessitates a phase compensation capacitor with a configuration other than by adopting a charge circuit or a discharge circuit of follower configuration.

A feedback-type amplifier circuit in accordance with the present invention comprises a combination of feedback-type charging means (mainly a voltage-follower circuit) not having a phase compensating capacitor, and source-follower discharging means. More specifically, a feedback-type amplifier circuit in accordance with the present invention comprises: feedback-type charging means, including a differential stage for receiving an input-terminal voltage and an output-terminal voltage differentially as inputs and charging means for performing a charging operation at the output terminal based on an output from said differential stage, said feedback-type charging means operating as a voltage follower in which the output-terminal voltage is in-phase with the input-terminal voltage; and follower-type discharging means for performing a discharging operation at the output terminal by a follower operation of an active element based on a voltage difference between the input-terminal voltage and the output-terminal voltage.

In the amplifier circuit according to the present invention, said follower-type discharging means includes: bias control means, which receives the input-terminal voltage, for controlling an output bias voltage; and a follower transistor connected between the output terminal and a lower-potential side power supply and receiving the bias voltage output from said bias control means applied thereto as an input, wherein output current is controlled on the basis of a difference voltage between the output-terminal voltage and the bias voltage.

According to the present invention, the foregoing object is accomplished by providing a feedback-type amplifier circuit comprising a combination of feedback-type discharging means (mainly a voltage-follower circuit) not having a phase compensating capacitor, and source-follower charging means. More specifically, a feedback-type amplifier circuit in accordance with the present invention comprises: feedback-type discharging means, including a differential stage for receiving an input-terminal voltage and an output-terminal voltage differentially as inputs and discharging means for performing a discharging operation at the output terminal based on an output from the differential stage, said feedback-type discharging means operating as a follower in which the output-terminal voltage is in-phase with the input-terminal voltage; and follower-type charging means for performing a charging operation at the output terminal by a follower operation of an active element based on a voltage difference between the input terminal voltage and the output terminal voltage.

In the amplifier circuit according to the present invention, the follower-type charging means includes: bias control means, which receives the input-terminal voltage, for controlling an output bias voltage; and a follower transistor connected between a higher-potential side power supply and the output terminal and receiving the bias voltage output from said bias control means applied thereto as an input, an output current of said follower transistor controlled on the basis of a difference voltage between the output-terminal voltage and the bias voltage.

In a feed-back type amplifier circuit in accordance with the present invention, there may be provided a capacitor between an output of an differential pair constituting a feed-back type charging means and output terminal for suppressing vibration of an output waveform.

In a feed-back type amplifier circuit in accordance with the present invention, there may be provided a capacitor for suppressing vibration of an output waveform between an output of an differential pair constituting a feed-back type discharging means and output terminal.

A feed-back type amplifier circuit in accordance with the present invention may comprises feedback-type charging means which is capable of pulling up an output voltage by a charging operation based on two inputs of an input voltage and the output voltage, and source-follower discharging may be replaced by a non-feed-back type charging means, which does not adopt a source-follower configuration, operating with a voltage difference between a desired voltage in accordance with an input voltage and an output voltage, independently of the operation of the feedback-type charging means.

A feed-back type amplifier circuit in accordance with the present invention comprises feedback-type charging means, which includes a differential stage for receiving an input-terminal voltage and an output-terminal voltage differentially as inputs, and charging means for performing a charging operation at the output terminal based on an output from said differential stage, said feedback-type charging means operating as a voltage follower in which the output-terminal voltage is in-phase with the input-terminal voltage; and discharging means including a transistor connected across said output terminal and a lower potential side power supply, and bias control means for controlling the bias voltage applied to a control terminal of said transistor; said discharging means having a bias voltage supply terminal for providing a predetermined bias voltage to the control terminal of said transistor, and voltage holding means for sampling and latching a difference voltage between the input-terminal voltage and the bias voltage from the bias voltage supply terminal to hold the latched difference voltage between the output terminal and the control terminal of said transistor.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 31 is a table illustrating a control method in a case where the driver circuit is used as the buffer of a data driver for a liquid crystal display device;

FIG. 32 is a table illustrating a modification of FIG. 31;

FIG. 37 shows the output delay time in FIG. 36;

PREFERRED EMBODIMENTS OF THE INVENTION

Preferred embodiments of the invention will be described below.

Figure 1:
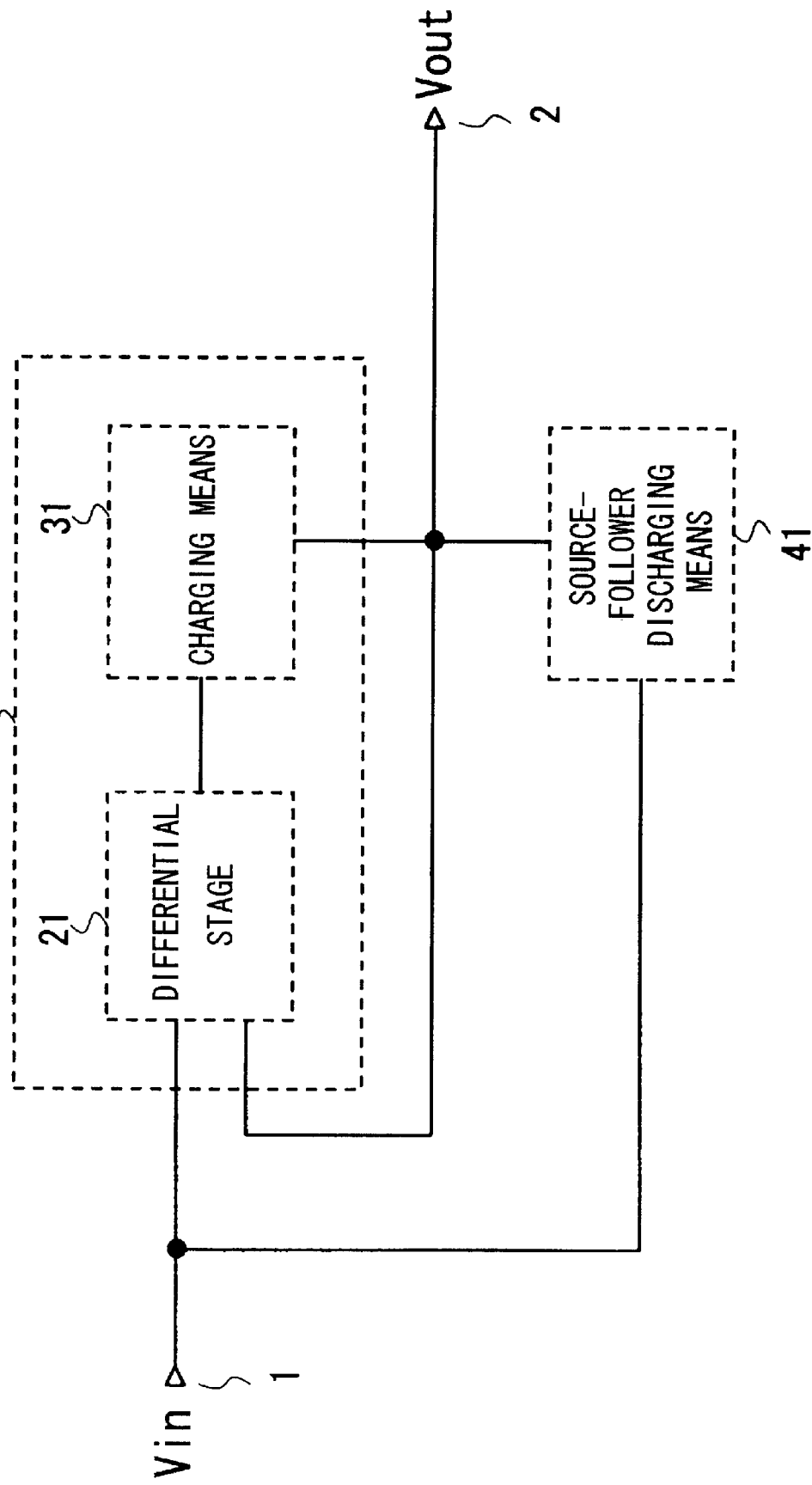
FIGS. 1 and 2 are block diagrams respectively illustrating the structures of first and second embodiments according to the present invention.

In accordance with a preferred embodiment of the present invention, as shown in FIG. 1, a feedback-type amplifier circuit comprises: feedback-type charging means (11), which has a differential stage (21) which receives a voltage of an input terminal (1) and a voltage of an output terminal (2) differentially as inputs and charging means (31) for performing a charging operation at the output terminal (2) based upon an output from the differential stage, for operating as a voltage follower; and follower-type discharging means (41) for performing a discharging operation at the output terminal (2) by a follower operation of a transistor in accordance with a voltage difference between the input-terminal voltage and the output-terminal voltage.

Figure 3A:
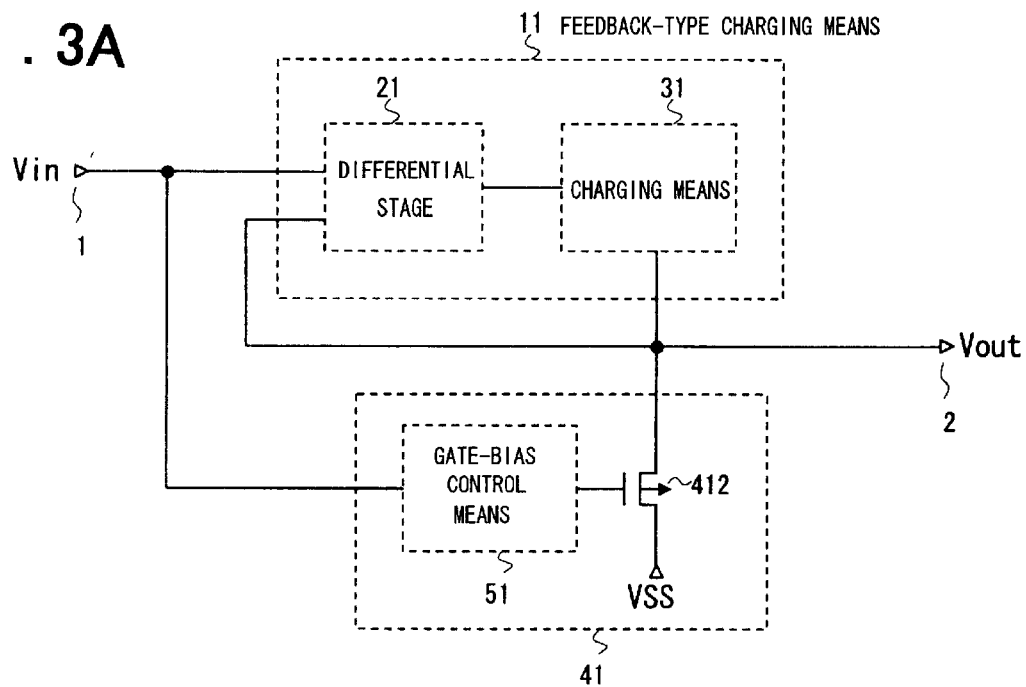
FIG. 3 is a diagram illustrating the structure of source-follower discharging means according to the first embodiment.

As shown in FIG. 3A, the follower-type discharging means (41) includes bias control means (51), which receives the input-terminal voltage, for controlling output bias voltage, and a follower transistor (412) connected between the output terminal (2) and a lower-potential side power supply (VSS) and receiving the bias voltage output from the bias control means (51) applied thereto as an input.

Figure 2:
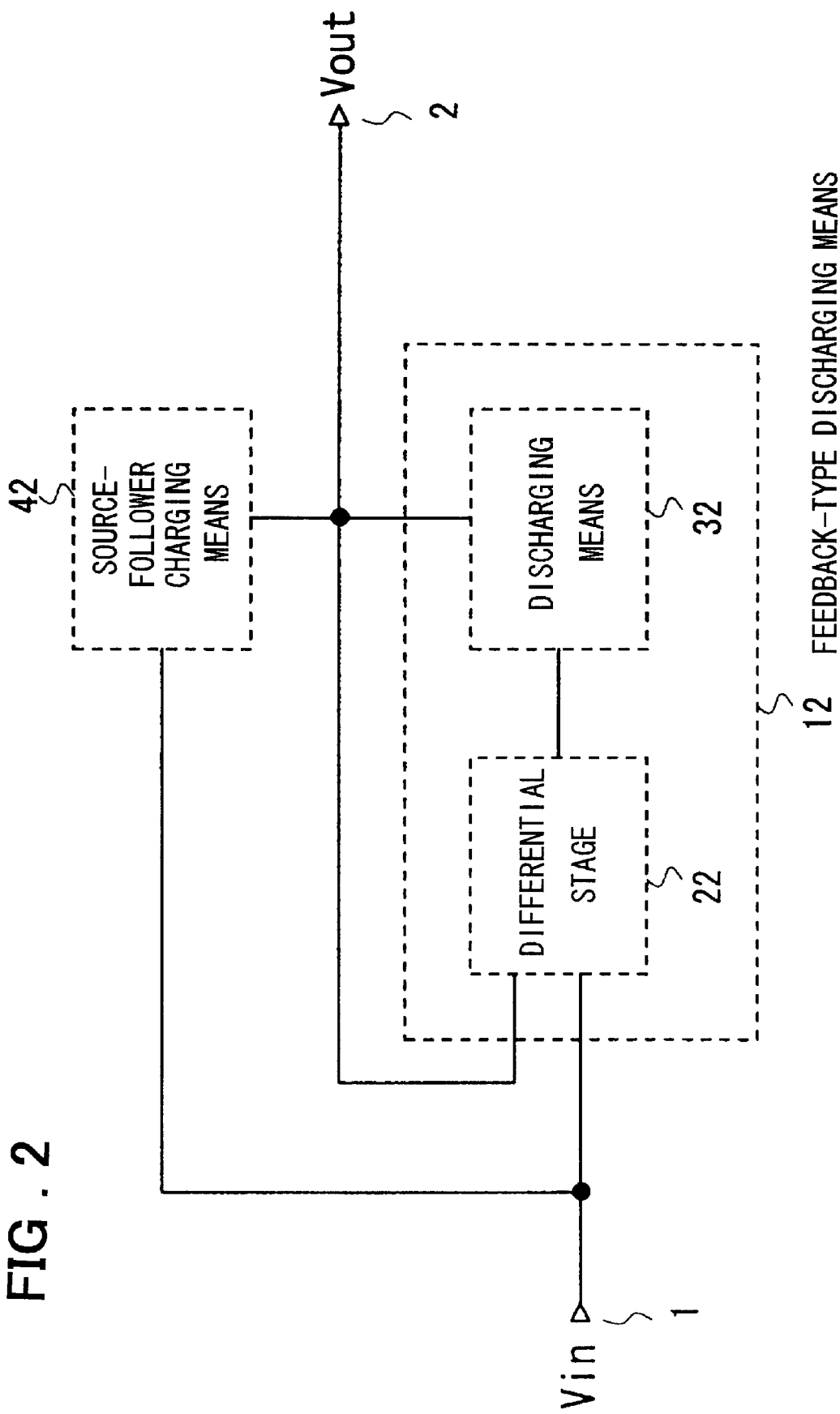

According to the present invention, as shown in FIG. 2, a feedback-type amplifier circuit comprises: feedback-type discharging means (12), which has a differential stage (22) to which an input-terminal voltage and an output-terminal voltage are input differentially and discharging means (32) for performing a discharging operation at the output terminal (2) based upon an output from the differential stage, for operating as a voltage follower; and follower-type charging means (42) for performing a charging operation at the output terminal by a follower operation of a transistor in accordance with a voltage difference between the input-terminal voltage and the output-terminal voltage.

Figure 6A:
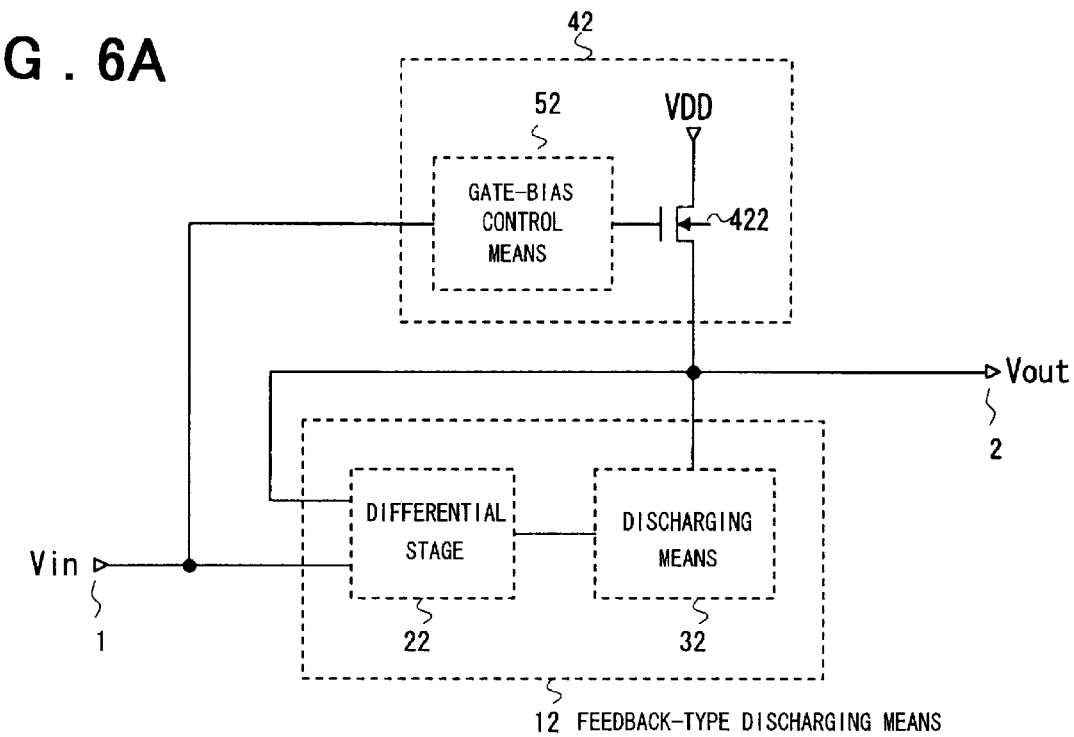
FIG. 6 is a diagram illustrating the structure of source-follower charging means according to the second embodiment.

As shown in FIG. 6A, the follower-type charging means (42) includes bias control means (52), which receives the input-terminal voltage, for controlling output bias voltage, and a follower transistor (422) connected between a higher-potential side power supply (VDD) and the output terminal and having the bias voltage output from the bias control means applied thereto as an input.

In the driving of a capacitive load, the load capacitance is charged at high speed by the feedback-type charging means (11 in FIG. 1) but some overshoot occurs owing to a response delay caused by feedback.

In the present invention, the source-follower discharging means (41 in FIG. 1) pulls down the overshoot output voltage to a desired voltage rapidly by a discharge capability that conforms to the overshoot, thereby making it possible to drive a desired voltage stably. Owing to the provision of the source-follower discharging means, oscillation can be suppressed even if a phase compensating capacitance is not provided.

Further, in the driving of a capacitive load, the load capacitance is discharged at high speed by the feedback-type discharging means (12 in FIG. 2) but some undershoot occurs owing to a response delay caused by feedback.

In the present invention, the source-follower charging means (42 in FIG. 2) pulls up the undershoot output voltage to a desired voltage rapidly by a charge capability that conforms to the undershoot, thereby making it possible to drive a desired voltage stably. Owing to the provision of the source-follower charging means, oscillation can be suppressed even if a phase compensating capacitance is not provided.

Since a phase compensating capacitor is not provided in the present invention, high-speed operation is possible with low consumption of power. Further, owing to the absence of a phase compensating capacitor, there is only a slight response delay ascribable to the parasitic capacitance of circuit elements. As a result, even if overshoot or undershoot occurs, this can be held to a sufficiently low level. In addition, overshoot and undershoot are suppressed by the source-follower operation so that voltage can be driven to a desired voltage rapidly. In order to stabilize output at a desired voltage quickly, the ratio of channel width to channel length of the source-follower transistor should be raised. The higher the ratio, the greater the stability attained.

It goes without saying that the element that performs the source-follower operation is not limited to a specific transistor but may be an element having at least two terminals and exhibiting a characteristic in which element current (output current) rises from zero to a sufficiently high level in accordance with an increase in a voltage difference across the two terminals. Owing to the element current, one terminal, which has a charging or discharging function, is connected to an output terminal, and the other terminal is controlled to an optimum constant voltage at the time of a desired output voltage.

A comparative example having a source-follower transistor as discharging means will be described to explain how the present invention is different.

Figure 33A:
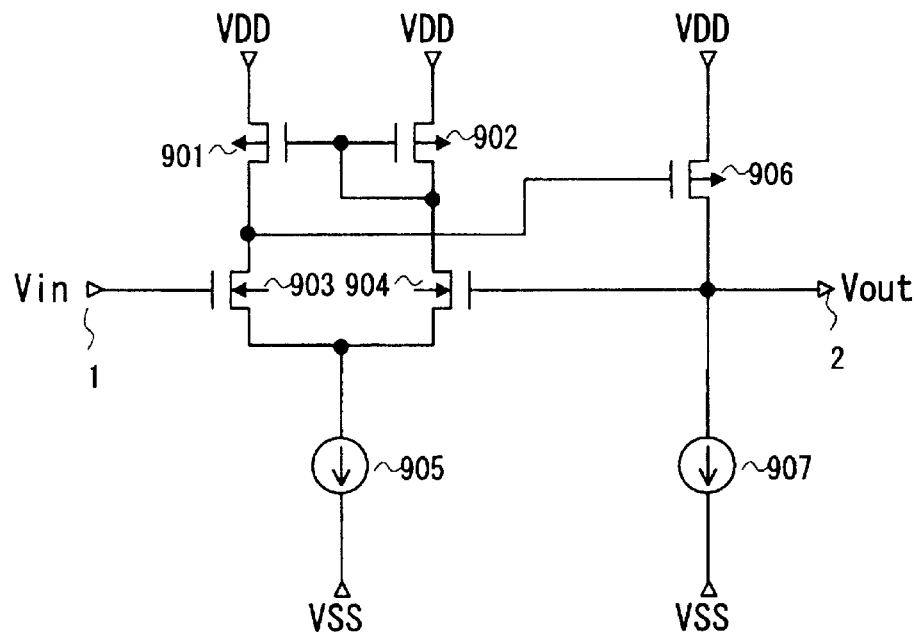
FIGS. 33A and 33B are diagrams illustrating the structures of feedback-type amplifier circuits according to the prior art.
Figure 34:
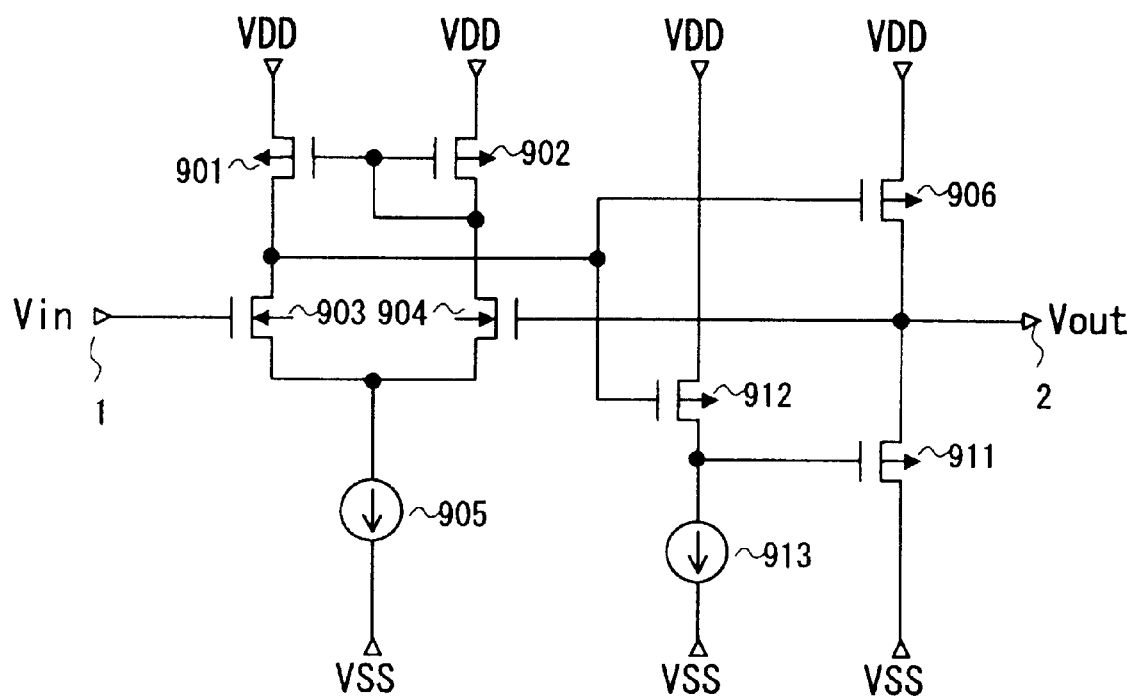
FIG. 34 is a diagram showing the structure of a comparative example in which discharging means is equipped with a source-follower transistor.
Figure 35:
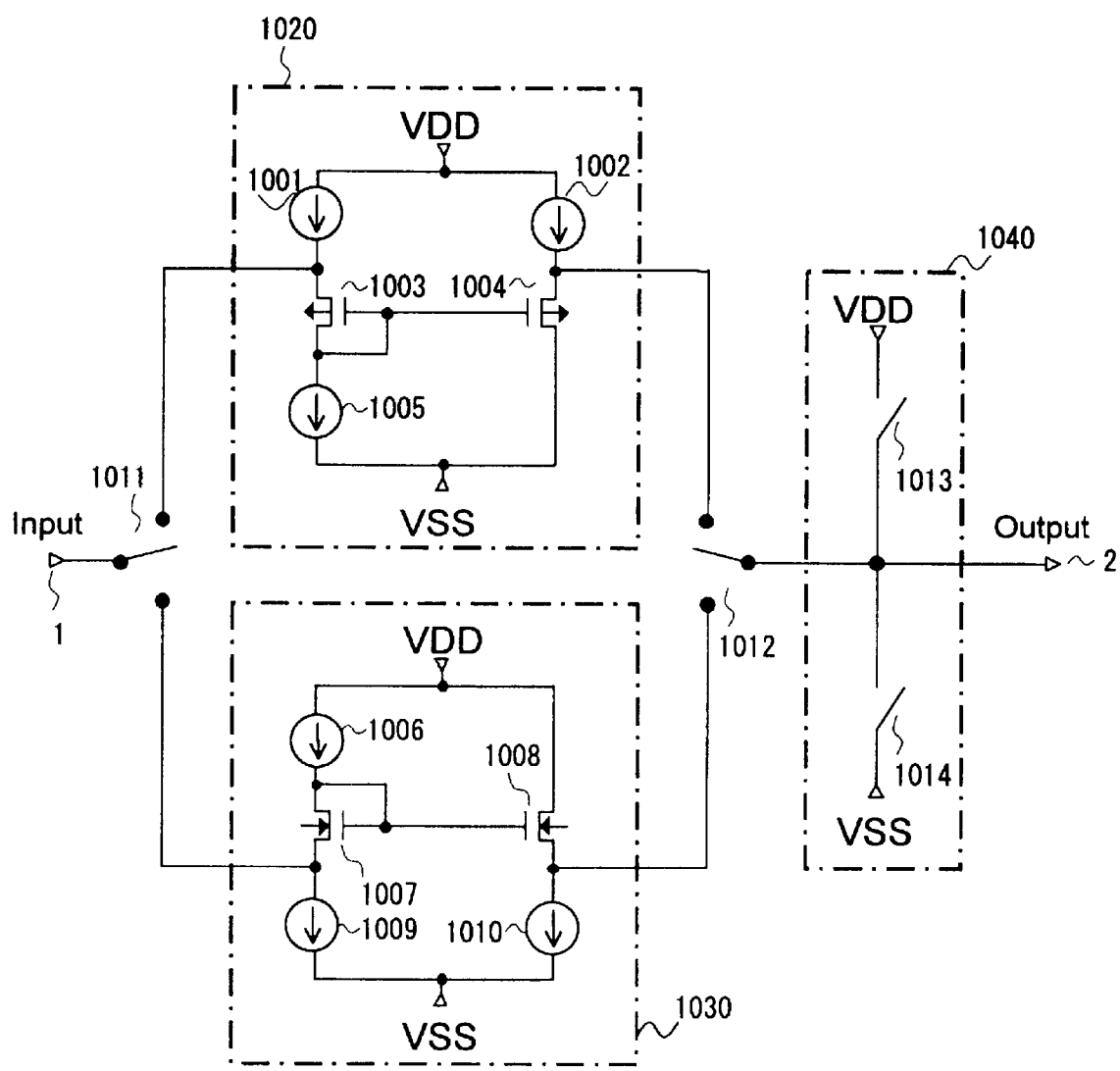
FIG. 35 is a diagram showing the structure of another feedback-type amplifier circuit according to the prior art.

FIG. 34 is a diagram showing a comparative example having a source-follower transistor as discharging means. In the comparative example shown in FIG. 34, the discharging means of the output stage in the arrangement of FIG. 33A constitutes the source follower of a P-channel MOS transistor 911. The output of the differential pair (the drain of the N-channel MOS transistor 903) is connected to the gate of a P-channel MOS transistor 906 whose source is connected to the higher-potential side power supply VDD and whose drain is connected to the output terminal 2, and is input to the gate of a P-channel MOS transistor 912 whose source is connected to the higher-potential side power supply VDD. The drain of the P-channel MOS transistor 912 is connected to a constant-current source 913 and to the gate of the P-channel MOS transistor 911 whose source is connected to the output terminal 2 and whose drain is connected to the lower-potential side power supply VSS.

In the present invention, the arrangement is such that the source-follower discharging means (41 in FIG. 1) is independent of the operation of the differential stage (21 in FIG. 1) and of the charging means (31 in FIG. 1).

In the arrangement of the comparative example shown in FIG. 34, the potential at the gate of the transistor 911 constituting the discharging means fluctuates by a great amount owing to the output of the differential stage (the voltage at the node between the drain of the N-channel MOS transistor 903 and the drain of the P-channel MOS transistor 901). In other words, in the comparative example shown in FIG. 34, the gate voltage of the P-channel MOS transistor 911 constituting the discharging means is not controlled to a constant bias that conforms to the input voltage.

As a consequence, with the arrangement of the comparative example shown in FIG. 34, the P-channel MOS transistor 911 turns off at Vin>Vout. That is, when the voltage Vout at output terminal 2 is smaller than the voltage Vin of input terminal 1, the drain voltage of the N-channel MOS transistor 903 declines, the P-channel MOS transistor 906 constituting the charging means turns on and charges the output terminal 2 (the output voltage Vout of output terminal 2 rises). At this time the P-channel MOS transistor 912 also turns on so that the gate of the P-channel MOS transistor 911 is coupled to the side of the higher-potential side power supply VDD. Hence the P-channel MOS transistor 911 of the charging means is turned off.

The arrangement is such that the P-channel MOS transistor 911 turns on and exhibits a strong discharge capability when Vin<Vout holds. That is, at Vin<Vout, the P-channel MOS transistor 912 turns off and the gate voltage of the P-channel MOS transistor 911 assumes the VSS level so that the transistor 911 turns on. At this time the P-channel MOS transistor 906 constituting the charging means turns off.

Thus, when the output voltage Vout is in the vicinity of Vin, charging and discharging alternate and the charging capability of the P-channel MOS transistor 906 and discharging capability of the P-channel MOS transistor 911 are both high. As a consequence, oscillation occurs in the comparative example of FIG. 34 if a phase compensating capacitor is not provided.

Figure 33B:
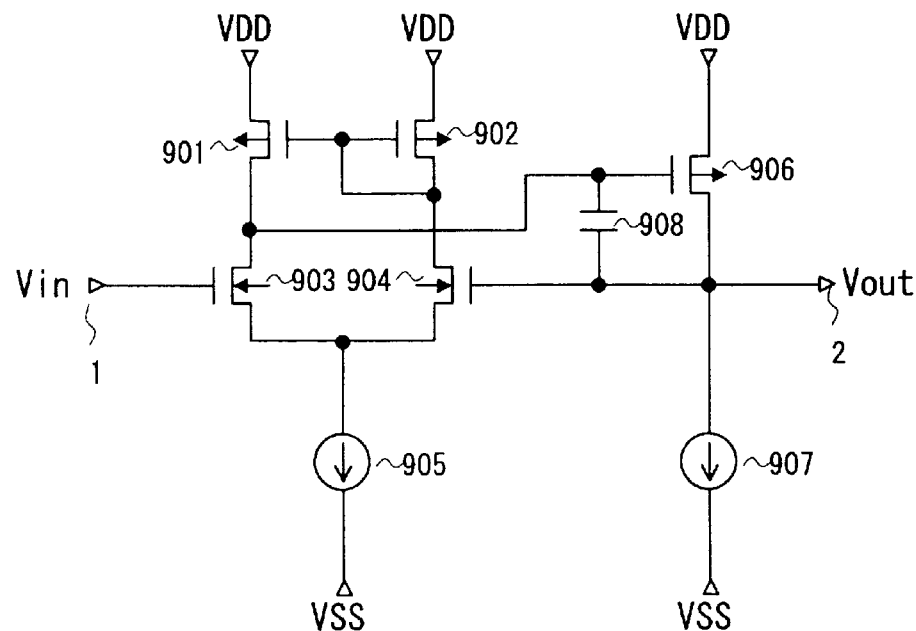

If the comparative example shown in FIG. 34 is provided with a phase compensating capacitor, however, a problem which arises is an increase in power consumption, just as in the circuit arrangement shown in FIG. 33.

By contrast, in the present invention, the arrangement is such that the source-follower discharging means has as its input the bias voltage output from the gate-bias control means, with its output current being controlled based upon the difference between the output-terminal voltage and bias voltage. As a result, it is unnecessary to provide a phase compensating capacitor.

In a feed-back type amplifier circuit in accordance with the embodiment of the present invention, there may be provided a sufficiently small capacitor between an output of an differential pair and an output terminal for suppressing vibration of an output waveform in driving a load. For example, capacitors (216, 217 in FIG. 17) for suppressing vibration of an output waveform in driving a load may be arranged between an output of a first differential stage (213, 314 in FIG., 15) and an output terminal (2), and between an output of a second differential stage (223, 324) and an output terminal (2).

In accordance with an another embodiment of the present invention, a feed-back type amplifier circuit and driver circuit which do not need a phase compensation capacitor may be realised by a non feed-back configuration having substantially no delay by adopting other than a follower configuration.

Figure 47:
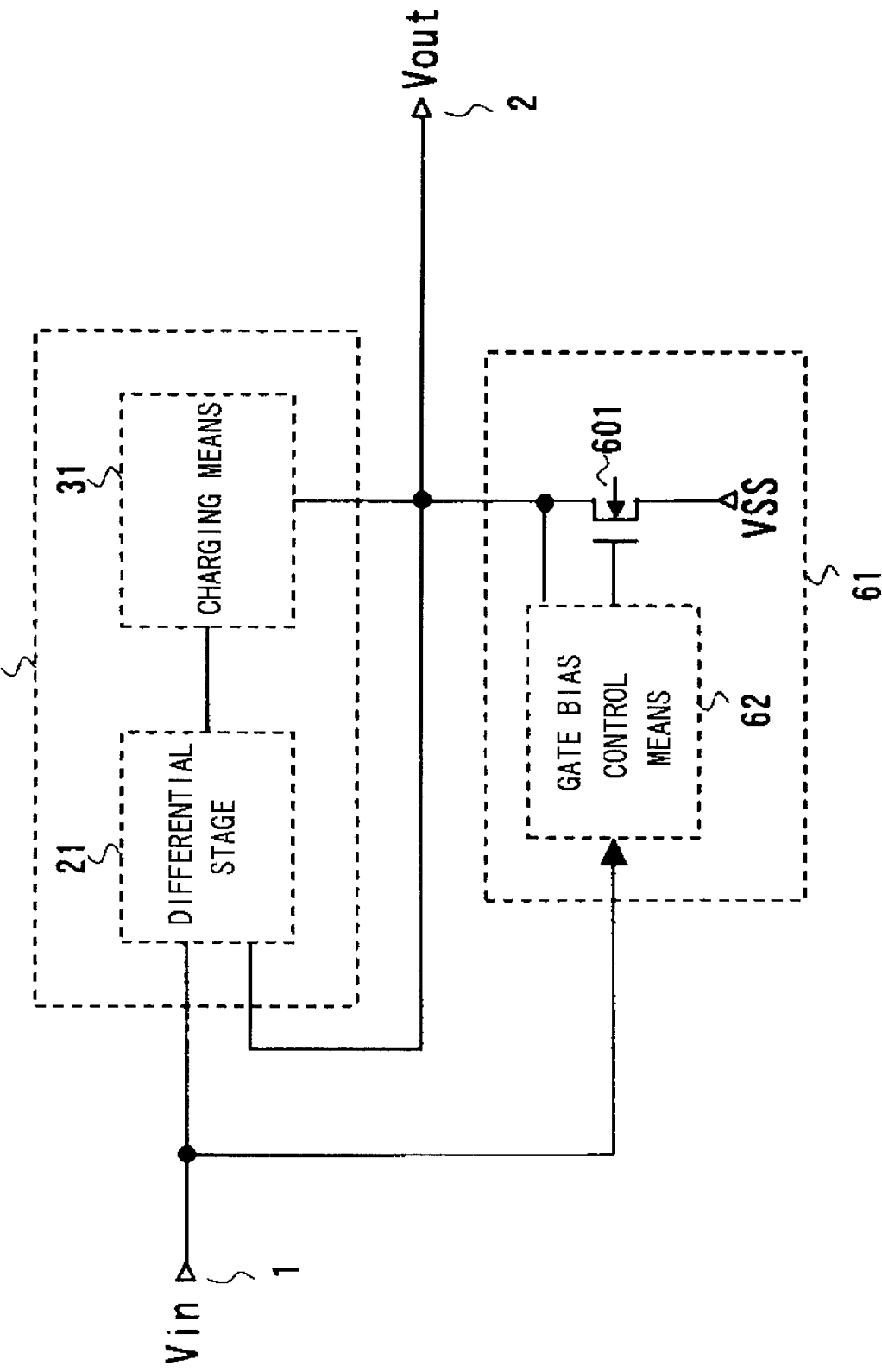
FIG. 47 shows the structure of another embodiment of the present invention.

As an instance of this embodiment, by referring to FIG. 47, there is provided feedback-type charging means (11; the same configuration as one designated by a reference numeral 11 in FIG. 1), which includes a differential stage (21) for receiving an input-terminal voltage and an output-terminal voltage differentially as inputs and charging means (31) for performing a charging operation at the output terminal based on an output from said differential stage (21), said feedback-type charging means operating as a voltage follower in which the output-terminal voltage is in-phase with the input-terminal voltage; and in place of the follower type discharging means there is provided discharging means (61) which includes a transistor (601) connected across said output terminal and a lower potential side power supply, and bias control means (62) for controlling the bias voltage applied to a control terminal of said transistor.

The bias control means (62) of this discharging means (61) has a bias voltage supply terminal for providing a predetermined bias voltage (Vref) to the control terminal of the transistor (601), and voltage holding means for sampling and latching a difference voltage between the input-terminal voltage and the bias voltage from the bias voltage supply terminal to maintain the latched difference voltage between the output terminal and the control terminal of the transistor.

The bias control means (62) of the discharging means (61) is so configured as the voltage holding means that a predetermined bias voltage being supplied to the control terminal of the transistor at the beginning of an output period, there being provided a capacitor having one end and the opposite end fed with said input terminal voltage and with said bias voltage, through a switch turned in an ON-state, respectively, to hold a differential voltage between the input terminal voltage and the bias voltage; a switching action of switches then being carried out for connecting said output terminal and said control terminal of said transistor to the one end and the opposite end of the capacitor, respectively.

Figure 48:
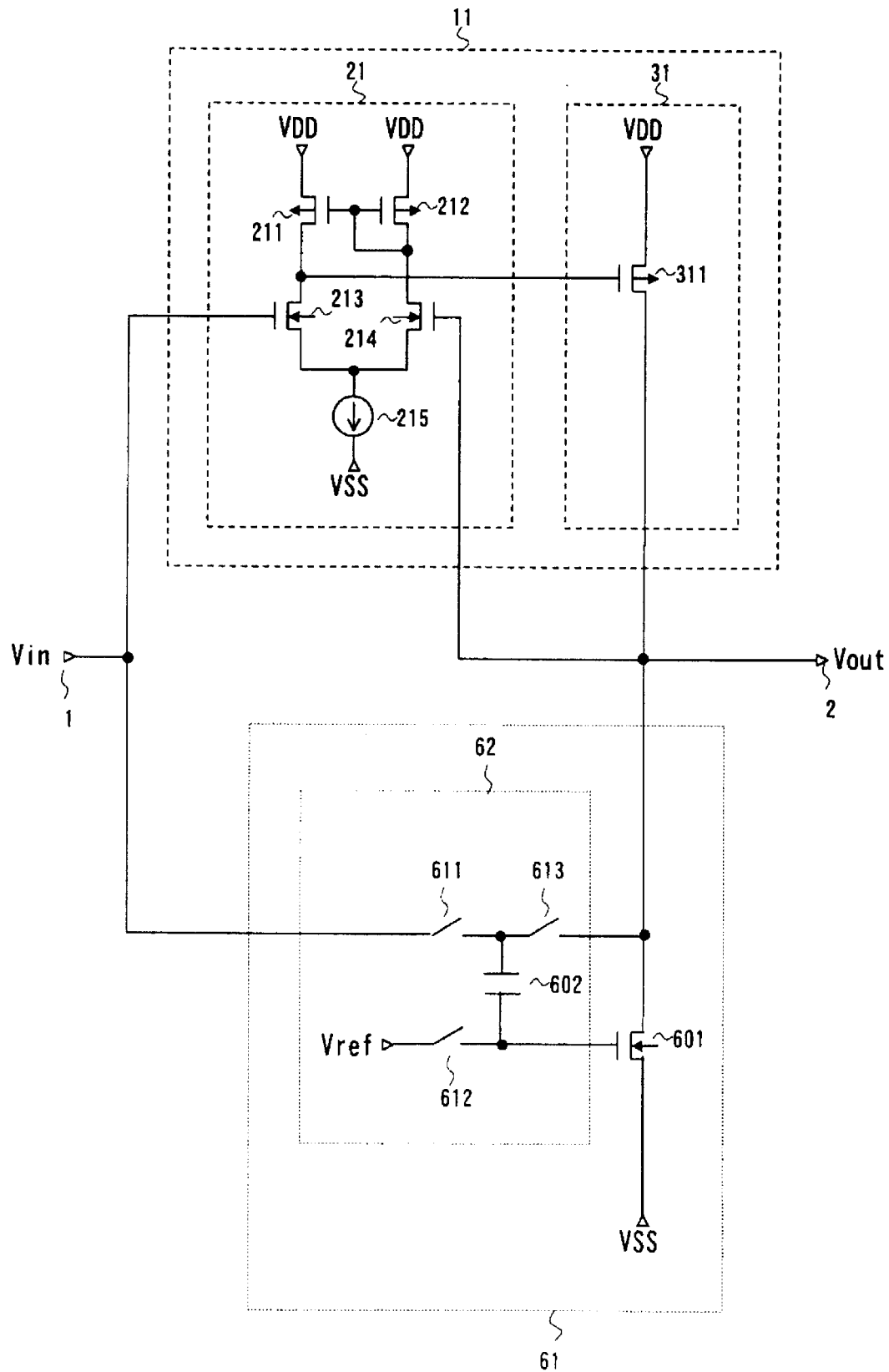
FIG. 48 shows specific examples of discharging means 61 and feed back type charging means 11 in FIG. 47.

More specifically, by referring to FIG. 48, the discharging means (61) comprises an MOS transistor (601) having a drain and a source connected to an output terminal (2) and to a higher potential side power supply, respectively; first switch (612) connected across a gate of said MOS transistor (601) and a gate bias voltage input terminal (Vref); a capacitor device (602) having one end connected to the gate of said MOS transistor (601); a second switch (611) connected across the said input terminal (1) and the opposite end of said capacitor device (602); and a third switch (613) connected across the said output terminal (2) and the opposite end of the capacitor device (602); wherein the first and second switches (612, 611) being turned on and said third switch (613) being turned off at the beginning of said output period; said first and second switches (612, 611) being turned off and said third switch (613) being turned on, subsequently.

As the capacitor device (602), there may well be provided voltage holding means which accomplishes the same effect. The voltage holding means performs sampling and latching of a difference voltage between the input-terminal voltage Vin and the bias voltage Vref to maintain the latched difference voltage between the output terminal (2) and the control terminal of the MOS transistor (601).

Similar with those above mentioned, the configuration other than the follower-type charging means may well be provided. More specifically, there is provided feedback-type discharging means, which includes a differential stage for receiving an input-terminal voltage and an output-terminal voltage differentially as inputs and discharging means for performing a discharging operation at the output terminal based on an output from the differential stage, said feedback-type discharging means operating as a follower in which the output-terminal voltage is in-phase with the input-terminal voltage; and charging means which includes a transistor connected across said output terminal and a higher potential side power supply, and bias control means for controlling the bias voltage applied to a control terminal of said transistor, wherein the charging means has a bias voltage supply terminal for providing a predetermined bias voltage to the control terminal of said transistor, and voltage holding means for sampling and latching a difference voltage between the input-terminal voltage and the bias voltage from the bias voltage supply terminal to maintain the latched difference voltage between the output terminal and the control terminal of said transistor. In an another example of the charging means, a predetermined preset bias voltage is supplied to the control terminal of said transistor at the beginning of an output period, and there is provided a capacitor which has one end and the opposite end fed with said input terminal voltage and with said bias voltage, through a switch turned in an ON-state, respectively, to hold a differential voltage between the input terminal voltage and the bias voltage; a switching action of switches then being carried out for connecting said output terminal and said control terminal of the transistor to the one end and the opposite end of the capacitor, respectively.

Embodiments of the present invention will now be described further in greater detail with reference to the drawings.

FIG. 1 is a block diagram illustrating the structure of a first embodiment of the present invention.

As shown in FIG. 1, the circuit according to the first embodiment of the invention comprises feedback-type charging means 11, which is capable of pulling up an output voltage Vout by producing a charging effect by the two inputs applied thereto, i.e., the input voltage Vin and output voltage Vout, and source-follower discharging means 41 which, through an operation independent from that of the feedback-type charging means 11, is for producing a discharging effect based upon the source-follower operation of a transistor in accordance with a voltage difference between the input voltage Vin and output voltage Vout.

The feedback-type charging means 11 has a differential stage 21, which operates in accordance with a voltage difference between the input voltage Vin and output voltage Vout, and charging means 31 for producing a charging effect in dependence upon the output of the differential stage 21.

This embodiment makes it possible to perform high-speed drive with low power consumption by employing an arrangement in which phase compensating means (a phase compensating capacitor) is not provided.

In a driver circuit that outputs a desired voltage as the output voltage Vout in accordance with the input voltage Vin, the feedback-type charging means 11 operates in dependence upon the voltage difference between Vin and Vout and pulls the output voltage Vout up to the desired voltage by a charging operation in a case where the output voltage Vout is lower than the desired voltage.

The feedback-type charging means 11 is capable of operating at high speed with low power consumption because phase compensating means is not provided. With the feedback-type arrangement, however, parasitic capacitance, etc., of the circuit elements gives rise to a slight amount of response delay until the change in the output voltage Vout is reflected in the charging action. Hence there are cases where overshoot (excessive charging) occurs.

On the other hand, if the source-follower discharging means 41 has a discharge capability that conforms to the voltage difference between the input voltage Vin and output voltage Vout and the output voltage Vout is greater than a desired voltage, the output voltage Vout can be pulled down to a desired voltage by a discharge effect based upon the source-follower operation of the transistor.

The source-follower discharging means 41 exhibits a high discharge capability when the voltage difference between the input voltage Vin and output voltage Vout is large. The discharge capability diminishes with a decline in the voltage difference. As a consequence, a change in the output voltage Vout due to the discharge action moderates as the voltage approaches the desired voltage. The source-follower discharging means 41 therefore has the effect of changing the output voltage Vout to the desired voltage rapidly and of causing the output voltage Vout to stabilize at the desired voltage.

When the output voltage Vout is lower than the desired voltage, therefore, it is pulled up to the desired voltage at high speed by the feedback-type charging means 11. Even if overshoot (excessive charging) occurs at this time, the output voltage Vout is pulled down to the desired voltage rapidly by the source-follower discharging means 41, whereby a stable output is obtained.

If the output voltage Vout is greater than the desired voltage, on the other hand, the feedback-type charging means 11 does not perform a charging operation and the output voltage Vout is pulled down to the desired voltage by the source-follower discharging means 41 owing to the source-follower discharge operation that conforms to the voltage difference between Vin and Vout. The result is a stable output.

Further, because a phase compensating capacitor is not provided, the feedback-type charging means 11 exhibits only a slight response delay ascribable to parasitic capacitance of the circuit elements. Even if overshoot occurs, therefore, it is held to a sufficiently low level. This facilitates stabilization of the output voltage.

Thus, by virtue of the combination of the feedback-type charging means 11 and source-follower discharging means 41, output voltage can be stabilized at the desired voltage rapidly along with high-speed charging when charging is carried out.

A second embodiment of the present invention will now be described.

FIG. 2 is a block diagram illustrating the structure of a second embodiment of the present invention.

As shown in FIG. 2, the circuit according to the second embodiment of the invention comprises feedback-type discharging means 12, which is capable of pulling down the output voltage Vout by producing a discharging effect by the two inputs applied thereto, i.e., an input voltage Vin and output voltage Vout, and source-follower charging means 42 which, through an operation independent from that of the feedback-type discharging means 12, is for producing a charging effect based upon the source-follower operation of a transistor in accordance with a voltage difference between the input voltage Vin and output voltage Vout.

The feedback-type discharging means 12 has a differential stage 22, which operates in accordance with a voltage difference between the input voltage Vin and output voltage Vout, and discharging means 32 for producing a discharging effect in dependence upon the output of the differential stage 22. In this embodiment also it is possible to perform high-speed drive with low power consumption because phase compensating means is not provided.

In a driver circuit that outputs a desired voltage as the output voltage Vout in accordance with the input voltage Vin, the feedback-type discharging means 12 operates in dependence upon the voltage difference between Vin and Vout and pulls the output voltage Vout down to the desired voltage by a discharging operation in a case where the output voltage Vout is higher than the desired voltage.

The feedback-type discharging means 12 is capable of operating at high speed with low power consumption because phase compensating means is not provided. With the feedback-type arrangement, however, parasitic capacitance, etc., of the circuit elements gives rise to a slight amount of response delay until the change in output voltage Vout is reflected in the discharging operation. Hence there are cases where undershoot (excessive discharge) occurs.

On the other hand, if the source-follower charging means 42 has a charge capability that conforms to the voltage difference between input voltage Vin and output voltage Vout and output voltage Vout is less than a desired voltage, output voltage Vout can be pulled up to a desired voltage by a charging effect based upon the source-follower operation of the transistor.

The source-follower charging means 42 exhibits a high charging capability when the voltage difference between input voltage Vin and output voltage Vout is large. The charging capability diminishes with a decline in the voltage difference. As a consequence, a change in output voltage Vout due to the charging action moderates as the voltage approaches the desired voltage. The source-follower charging means 42 therefore has the effect of changing the output voltage Vout to the desired voltage rapidly and of causing the output voltage Vout to stabilize at the desired voltage.

When output voltage Vout is higher than the desired voltage, therefore, it is pulled down to the desired voltage at high speed by the feedback-type discharging means 12. Even if undershoot (excessive discharging) occurs at this time, the output voltage Vout is pulled up to the desired voltage rapidly by the source-follower charging means 42, whereby a stable output is obtained.

If the output voltage Vout is less than the desired voltage, on the other hand, the feedback-type discharging means 12 does not perform a discharging operation and the output voltage Vout is pulled up to the desired voltage by the source-follower charging means 42 owing to the source-follower charging action that conforms to the voltage difference between Vin and Vout. The result is a stable output.

Further, because a phase compensating capacitor is not provided, the feedback-type discharging means 12 exhibits only a slight response delay ascribable to parasitic capacitance of the circuit elements. Even if undershoot occurs, therefore, it is held to a sufficiently low level. This facilitates stabilization of the output voltage.

Thus, by virtue of the combination of the feedback-type discharging means 11 and source-follower charging means 42, the output voltage can be stabilized at the desired voltage rapidly along with high-speed discharge when discharge is carried out.

FIG. 3A is a diagram illustrating a specific example of the structure of the source-follower discharging means 41. In a driver circuit for outputting the output voltage Vout at a desired voltage in accordance with the input voltage Vin, the source-follower discharging means 41 includes a P-channel MOS transistor 412 having its source connected to the output terminal 2 and its drain connected to lower-potential side power supply voltage VSS, and gate-bias control means 51, which receives the input voltage Vin, for controlling the gate of the P-channel MOS transistor 412 to a constant voltage.

The gate-bias control means 51 controls the gate of P-channel MOS transistor 412 to a constant voltage in such a manner that the gate-source voltage will approach a threshold-value voltage when the source of the P-channel MOS transistor 412 is at the desired voltage in a period in which the desired output voltage is driven.

The operation of the source-follower discharging means 41 will now be described.

In a case where the output voltage Vout is higher than the desired voltage in the process during which output voltage Vout changes to the desired voltage, the larger the voltage difference between the output voltage Vout and the desired voltage, the greater the gate-source voltage of the P-channel MOS transistor 412 and the higher the discharge capability. If the output voltage Vout declines, on the other hand, the gate-source voltage also declines and the discharge capability diminishes as the desired voltage is approached.

As a result, stable output becomes possible without output voltage Vout oscillating. If the output voltage Vout is lower than the desired voltage, on the other hand, the gate-source voltage of the P-channel MOS transistor 412 falls below the threshold-value voltage, the P-channel MOS transistor 412 turns off and no discharge action is produced.

In order to stabilize the output voltage Vout at the desired voltage rapidly, the ratio (W/L) of channel width W to channel length L of the P-channel MOS transistor 412 is raised, thereby enhancing stability.

Figure 3B:
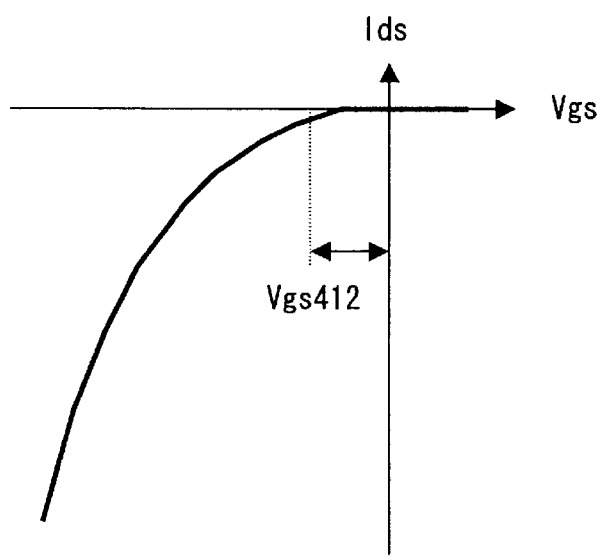

The P-channel MOS transistor 412 is not limited to a specific transistor. This may be an element having at least two terminals and exhibiting a characteristic (see FIG. 3B) in which element current rises from zero to a sufficiently high level in accordance with an increase in a voltage difference across the two terminals. Owing to the element current, one terminal, which has a discharging function, is connected to an output terminal, and the other terminal is controlled to an optimum constant voltage by the gate-bias control means 51 at the time of a desired output voltage.

Figure 4:
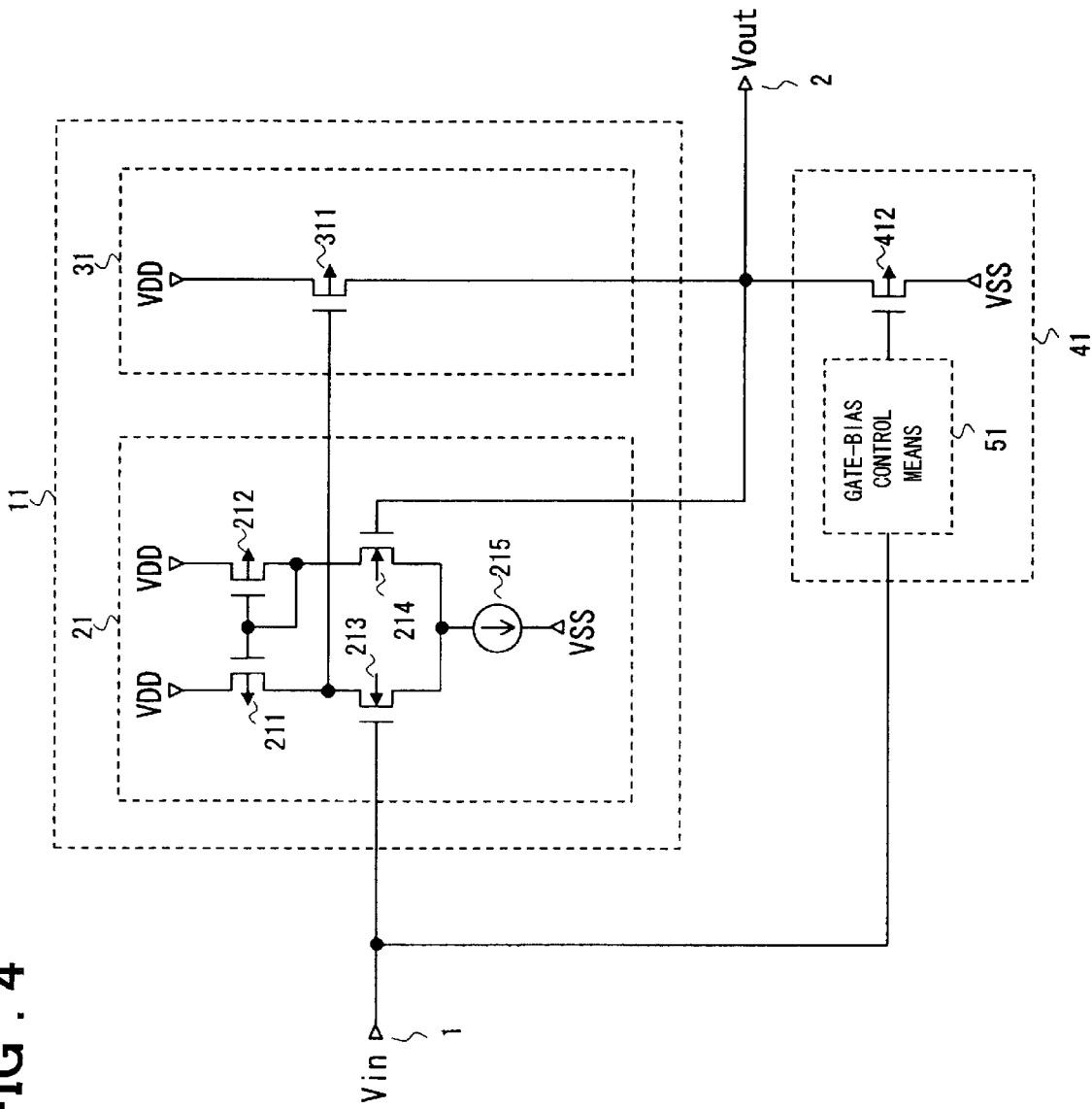
FIG. 4 is a diagram illustrating the structure of feedback-type charging means according to the first embodiment.

FIG. 4 is a diagram illustrating a specific example of the structure of the feedback-type charging means 11 shown in FIG. 1.

In the feedback-type charging means 11 of FIG. 4, which constitutes a driver circuit for driving the output voltage Vout to a voltage equal to the input voltage Vin, the differential stage 21 includes a differential input pair of N-channel MOS transistors 213 and 214, and a current-mirror circuit, which comprises P-channel MOS transistors 211 and 212, serving as an active load. The circuit configuration is of a feedback-type that the output voltage Vout is returned to the input.

Normal operation does not take place in the range of voltages in which the N-channel MOS transistor 213 turns off with the input voltage Vin in the vicinity of the lower-potential side power supply voltage VSS.

The charging means 31 comprises a P-channel MOS transistor 311 that receives the output of the differential stage at its gate and has its drain connected to the output terminal 2 and its source connected to the higher-potential side power-supply voltage VDD.

When Vout<Vin holds, the differential stage 21 and charging means 31 forming the feedback-type charging means 11 produce a charging effect owing to the transistor 311 and pull the output voltage Vout up to Vin. When Vout>Vin holds, the transistor 311 turns off and no charging effect is produced. However, in a case where the output voltage Vout changes to Vin rapidly at Vout<Vin, there is a small response delay until the change in the output voltage Vout is reflected in the charging effect. Overshoot (excessive charging) occurs as a consequence.

In the source-follower discharging means 41, on the other hand, the output of the gate-bias control means 51 is connected to the gate of the P-channel MOS transistor 412. When the source of the P-channel MOS transistor 412 becomes equal to Vin, the gate of transistor 412 is controlled in such a manner that the gate-source voltage of transistor 412 will approach a threshold-value voltage Vth. When this is done, a discharge effect is produced at Vout>Vin and the output voltage Vout can be pulled down to a voltage equal to the input voltage Vin by the source-follower discharge action of the transistor 412 in accordance with the voltage difference between Vin and Vout.

Because phase compensating means is not provided, the feedback-type charging means 11 can cause the gate voltage of the transistor 311 of charging means 31 to change rapidly even though the current of a current source 215 of differential stage 21 is kept small. Further, since there is only slight response delay ascribable to parasitic capacitance of circuit elements owing to the absence of a phase compensating capacitor, any overshoot that occurs is held to a sufficiently low level. As a result, even if overshoot occurs, a voltage equal to the input voltage Vin can be output rapidly and stably by the source-follower discharging means.

In a case where output voltage Vout varies at an extremely high speed owing to the charging action of the feedback-type charging means 11, overshoot becomes somewhat larger and therefore the gate-source voltage of transistor 412 also increases to speed up the discharge operation of the source-follower discharging means 41.

As a result, when the voltage resulting from overshoot is pulled down to the voltage Vin, there are instances where the gate voltage of the transistor 412 also is pulled down momentarily via gate-to-source capacitance, thereby causing the output voltage Vout to be pulled down below the voltage Vin momentarily. As a consequence, the feedback-type charging means 11 operates again and produces the charging effect, a small amount of overshoot occurs again and the source-follower discharging means 41 operates again. This operation is performed repeatedly. In this case also, however, the gate of the transistor 412 is controlled in such a manner that the discharge capability of the source-follower discharging means 41 is diminished as the voltage Vin is approached. As a result, the output voltage Vout eventually converges to the voltage Vin while undergoing successively attenuated oscillation.

In order to enhance output stability further, the ratio W/L of channel width W to channel length L of the transistor 412 of source-follower discharging means 41 is increased.

Further, in a case where the source-follower discharging means 41 is so designed that little drain current of transistor 412 will flow by virtue of the gate-bias control means 51 in the stable state in which output voltage Vout becomes the voltage Vin, stability will be attained in a state in which a current of the same magnitude flows into the transistor 311 as well.

Figure 5:
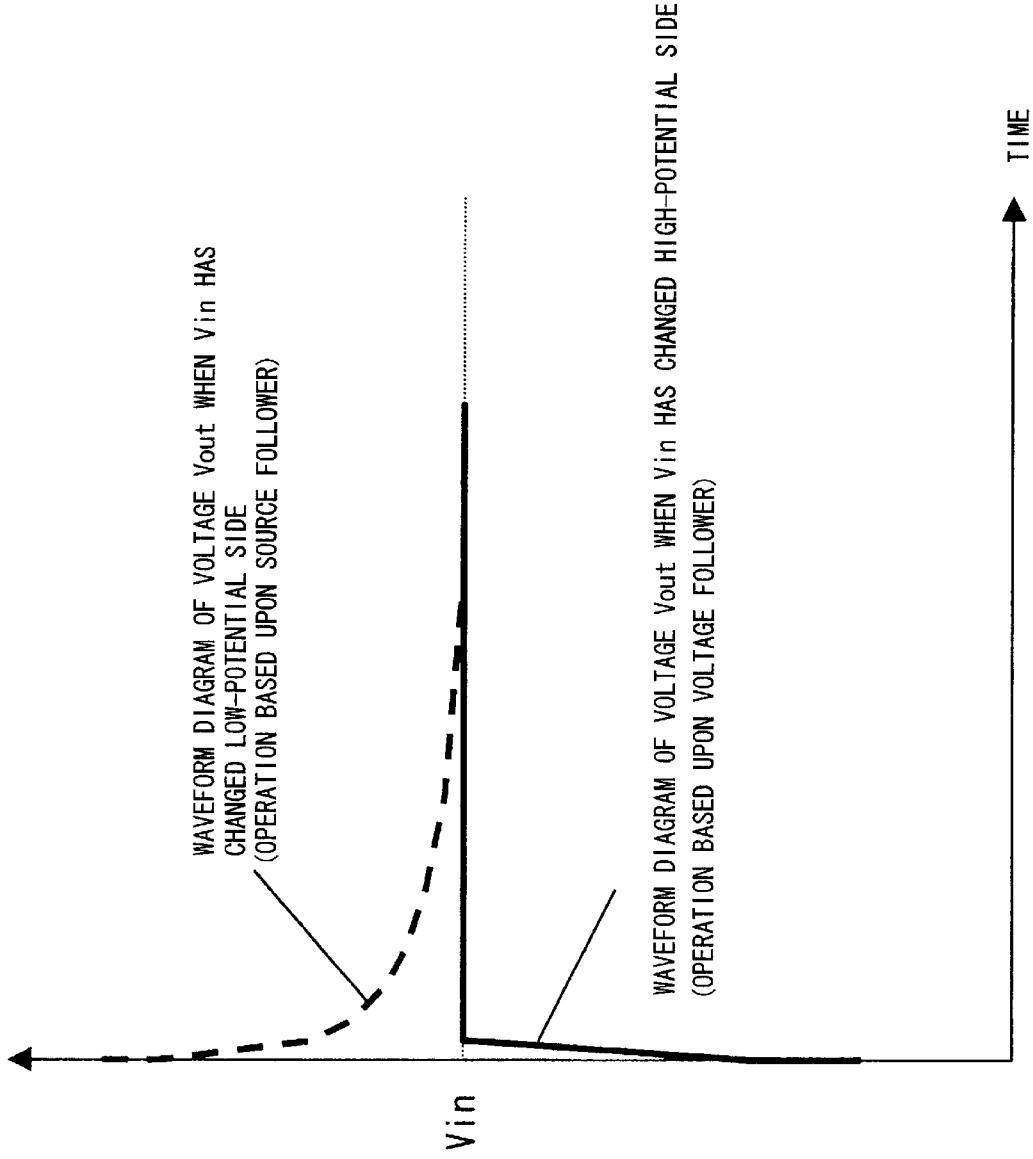
FIG. 5 is a diagram showing voltage-output waveforms according to the first embodiment.

FIG. 5 is a diagram illustrating output waveforms of the driver circuit of FIG. 4 when a capacitive load is driven. The solid line is the waveform of output voltage Vout in a case where Vin has changed to the high-voltage side from the state in which Vin=Vout holds, and the dashed line is the waveform of output voltage Vout in a case where Vin has changed to the low-voltage side from the state in which Vin=Vout holds.

If Vin has changed to the higher-voltage side, the output voltage Vout is pulled up to the voltage Vin at high speed by the feedback-type charging means 11 in accordance with a high discharge capability. Even if overshoot occurs, the output voltage Vout is driven to the voltage Vin rapidly by the action of the source-follower discharging means 41, whereby stability is obtained.

If Vin has changed to the low-voltage side, on the other hand, only the source-follower discharging means 41 operates and the output voltage Vout is pulled down at high speed in accordance with a high discharge capability when the voltage difference between Vin and Vout is large and the discharging capability is diminished as Vout approaches Vin.

Thus, the driver circuit of FIG. 4 is such that charging can be performed at high speed. Discharging, however, is somewhat slow in comparison with charging.

FIG. 6A is a diagram illustrating a specific example of the structure of the source-follower charging means 42. In a driver circuit for outputting a desired voltage at output voltage Vout in accordance with the input voltage Vin, as shown in FIG. 6A, the source-follower charging means 42 includes an N-channel MOS transistor 422 having its source connected to the output terminal 2 and its drain connected to higher-potential side power supply voltage VDD, and gate-bias control means 52, which receives the input voltage Vin, for controlling the gate of the N-channel MOS transistor 422 to a constant voltage.

The gate-bias control means 52 controls the gate of N-channel MOS transistor 422 to a constant voltage in such a manner that the gate-source voltage will approach a threshold-value voltage when the source of the N-channel MOS transistor 422 is at the desired voltage in a period in which the desired output voltage is driven.

The operation of the source-follower charging means 42 will now be described.

In a case where the output voltage Vout is lower than the desired voltage in the process during which the output voltage Vout changes to the desired voltage, the larger the voltage difference between the output voltage Vout and the desired voltage, the greater the gate-source voltage of the N-channel MOS transistor 422 and the higher the charging capability. If the output voltage Vout rises, on the other hand, the gate-source voltage of the transistor 422 declines and the charging capability diminishes as the desired voltage is approached.

As a result, stable output becomes possible without output voltage Vout oscillating. If the output voltage Vout is higher than the desired voltage, on the other hand, the gate-source voltage of the N-channel MOS transistor 422 falls below the threshold-value voltage, the N-channel MOS transistor 422 turns off and no charging action is produced.

In order to stabilize the output voltage Vout at the desired voltage rapidly, the ratio (W/L) of channel width W to channel length L of the N-channel MOS transistor 422 is raised, thereby enhancing stability.

Figure 6B:
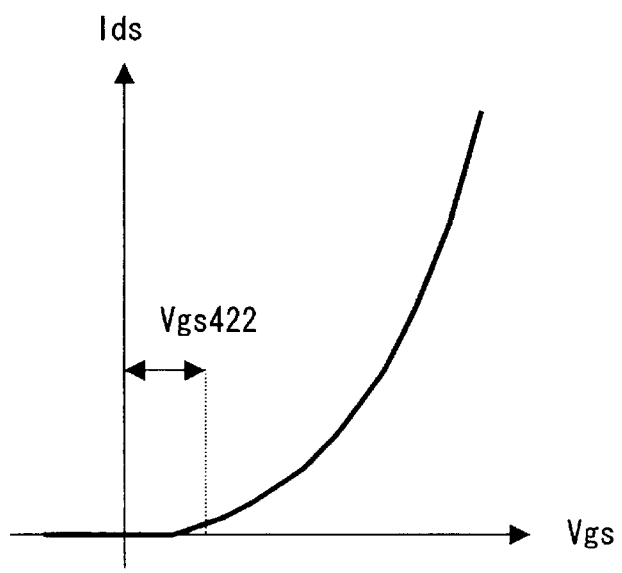

The N-channel MOS transistor 422 is not limited to a specific transistor. This may be an element having at least two terminals and exhibiting a characteristic (see FIG. 6B) in which element current rises from zero to a sufficiently high level in accordance with an increase in a voltage difference across the two terminals. Owing to the element current, one terminal, which has a charging function, is connected to an output terminal, and the other terminal is controlled to an optimum constant voltage by the gate-bias control means 52 at the time of a desired output voltage.

Figure 7:
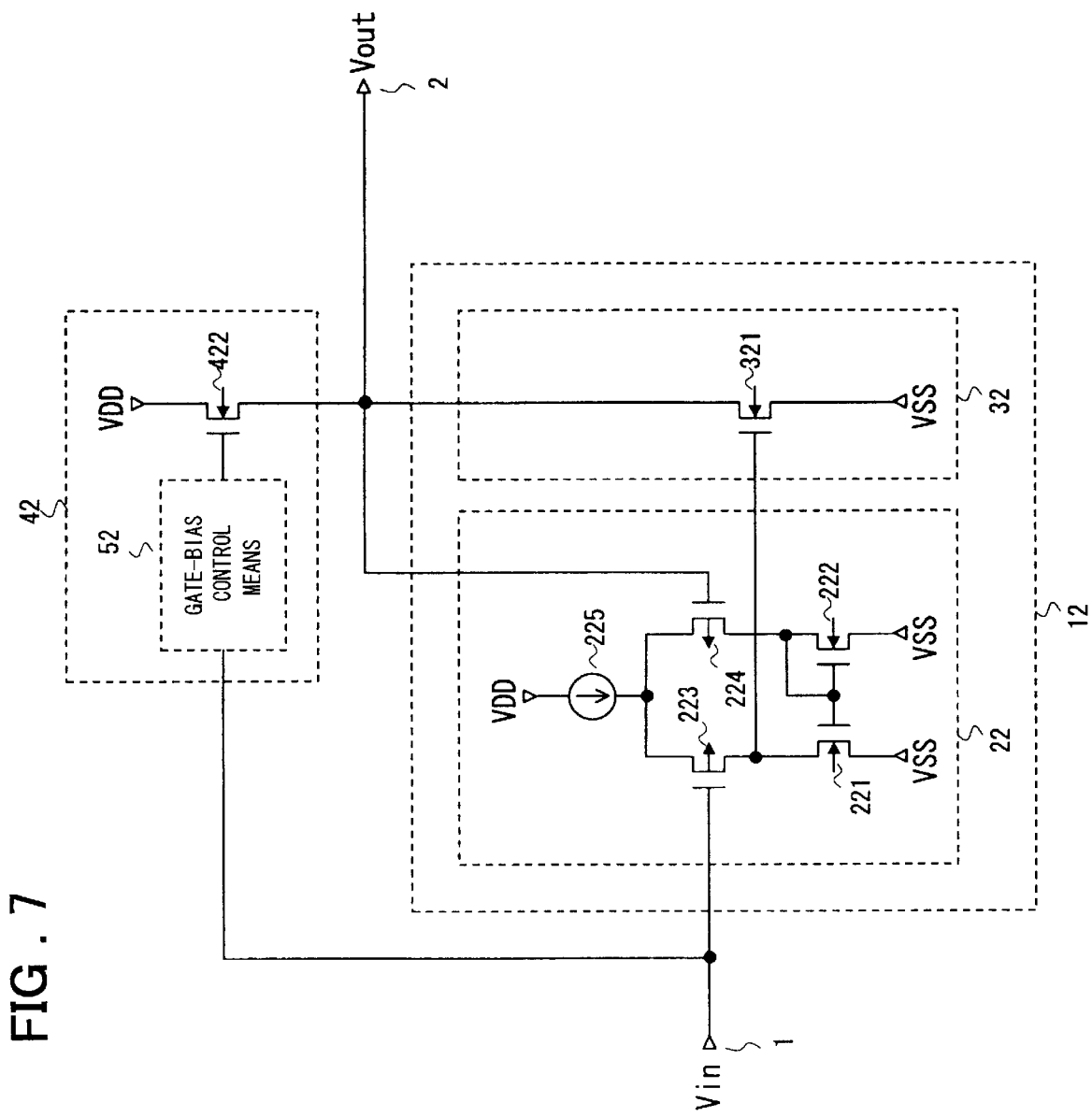
FIG. 7 is a diagram illustrating the structure of feedback-type discharging means according to the second embodiment.

FIG. 7 is a diagram illustrating a specific example of the structure of the feedback-type discharging means 12 shown in FIG. 6.

In the feedback-type discharging means 12 of FIG. 7, which constructs a driver circuit for driving the output voltage Vout to a voltage equal to the input voltage Vin, the differential stage 22 includes a differential input pair of P-channel MOS transistors 223 and 224, and a current-mirror circuit, which comprises N-channel MOS transistors 221 and 222, serving as an active load. The structure is such that the output voltage Vout is returned to the input.

Normal operation does not take place in the range of voltages in which the P-channel MOS transistor 223 turns off with the input voltage Vin in the vicinity of the higher-potential side power supply voltage VDD.

The discharging means 32 comprises an N-channel MOS transistor 321 that receives the output of the differential stage 22 at its gate and has its drain connected to the output terminal 2 and its source connected to the lower-potential side power supply voltage VSS.

When Vout>Vin holds, the differential stage 22 and charging means 32 constructing the feedback-type discharging means 12 produce a discharge effect owing to the transistor 321 and pull the output voltage Vout down to Vin. When Vout<Vin holds, the transistor 321 turns off and no discharge effect is produced. However, in a case where the output voltage Vout changes to Vin rapidly at Vout>Vin, there is a small response delay until the change in the output voltage Vout is reflected in the discharge effect. Undershoot (excessive discharge) occurs as a consequence.

In the source-follower charging means 42, on the other hand, the output of the gate-bias control means 52 is connected to the gate of the N-channel MOS transistor 422. When the source of the N-channel MOS transistor 422 becomes equal to Vin, the gate of the transistor is controlled in such a manner that the gate-source voltage will approach the threshold-value voltage Vth. When this is done, a charging effect is produced at Vout<Vin and the output voltage Vout can be pulled up to a voltage equal to the input voltage Vin by the source-follower charging action of the transistor 422 in accordance with the voltage difference between Vin and Vout.

Because phase compensating means is not provided in the feedback-type discharging means 12, the gate voltage of the transistor 321 of discharging means 32 may be changed rapidly even though the current of a current source 225 of differential stage 22 is kept small. As a result, the fast discharging with low power consumption can be realised. Further, since there is only slight response delay ascribable to parasitic capacitance of circuit elements owing to the absence of a phase compensating capacitor, any undershoot that occurs is held to a sufficiently low level. As a result, even if undershoot occurs, a voltage equal to the input voltage Vin can be output rapidly and stably by the source-follower charging means 42.

In a case where output voltage Vout varies at an extremely high speed owing to the discharge action of the feedback-type discharging means 12, undershoot becomes somewhat larger and therefore the gate-source voltage of transistor 422 also increases to speed up the charging operation of the source-follower charging means 42.

As a result, when the voltage resulting from undershoot is pulled down to the voltage Vin, there are instances where the gate voltage of the transistor 422 also is pulled down momentarily via gate-source capacitance, thereby causing the output voltage Vout to be pulled up above the voltage Vin momentarily. As a consequence, the feedback-type discharging means 12 operates again and produces the discharge effect, a small amount of undershoot occurs again and the source-follower charging means 42 operates again. This operation is performed repeatedly. In this case also, however, the gate of the transistor 422 is controlled in such a manner that the charging capability of the source-follower discharging means 42 is diminished as the voltage Vin is approached. As a result, the output voltage Vout eventually converges to the voltage Vin while undergoing successively attenuated oscillation.

In order to enhance output stability further, the ratio W/L of channel width W to channel length L of the transistor 422 of source-follower charging means 42 is raised.

Further, in a case where the source-follower charging means 42 is so designed that little drain current of transistor 422 will flow by virtue of the gate-bias control means 52 in the stable state in which output voltage Vout becomes the voltage Vin, stability will be attained in a state in which a current of the same magnitude flows into the transistor 321 as well.

Figure 8:
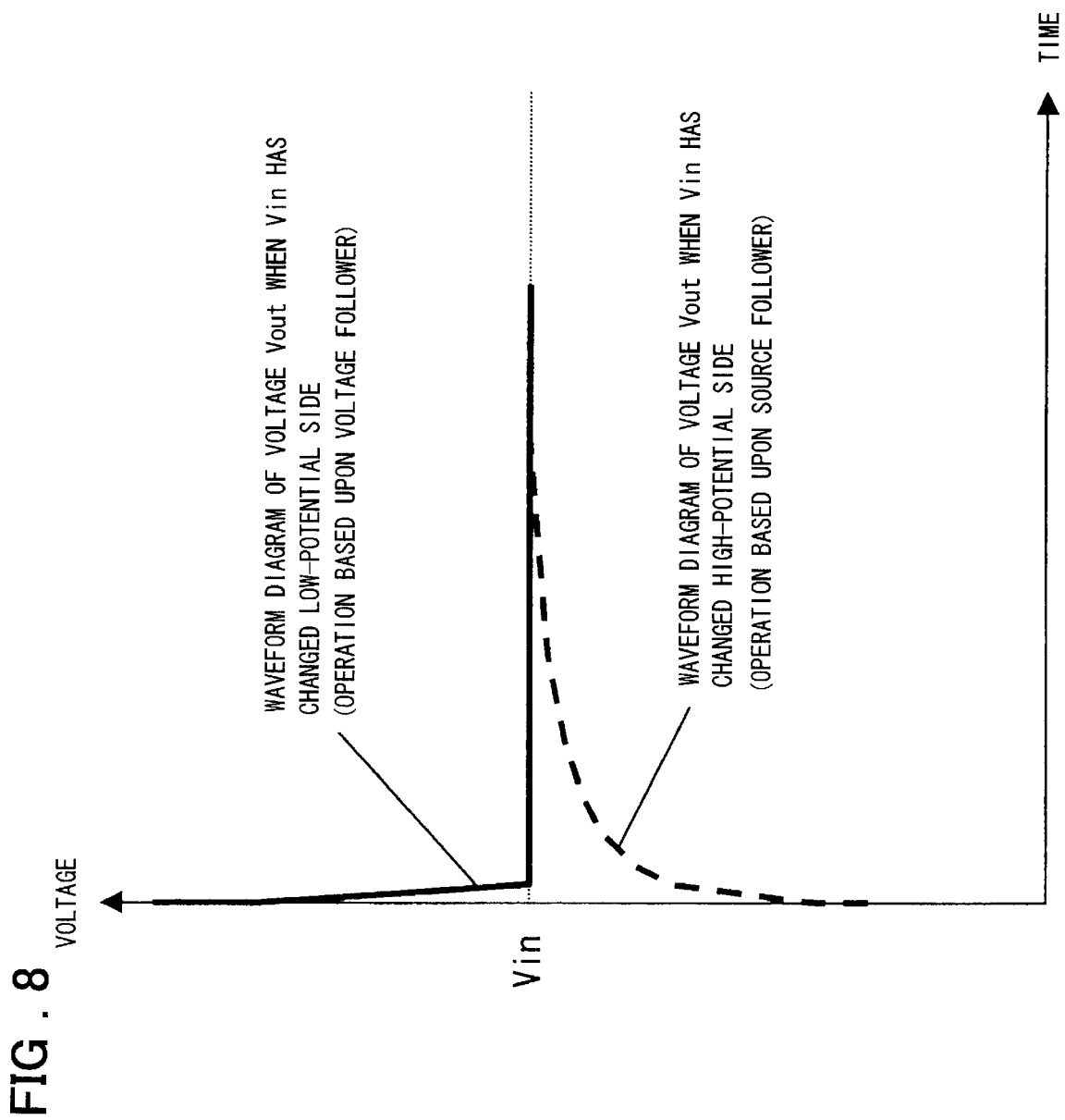
FIG. 8 is a diagram showing voltage-output waveforms according to the second embodiment.

FIG. 8 is a diagram illustrating output waveforms of the driver circuit of FIG. 7 when a capacitive load is driven. The solid line is the waveform of output voltage Vout in a case where Vin has changed to the low-voltage side from the state in which Vin=Vout holds, and the dashed line is the waveform of output voltage Vout in a case where Vin has changed to the high-voltage side from the state in which Vin=Vout holds.

If Vin has changed to the lower-voltage side, the output voltage Vout is pulled down to the voltage Vin at high speed by the feedback-type discharging means 12 in accordance with an enhanced discharge capability. Even if undershoot occurs, output voltage Vout is driven to the voltage Vin rapidly by the action of the source-follower charging means 42, whereby stability is obtained.

If Vin has changed to the higher-voltage side, on the other hand, only the source-follower charging means 42 operates and the output voltage Vout is pulled up at high speed in accordance with a high charging capability when the voltage difference between Vin and Vout is large and the charging capability is diminished as Vout approaches Vin.

Thus, the driver circuit of FIG. 7 is such that charging can be performed at high speed. Discharging, however, is somewhat slow in comparison with charging.

Figure 9:
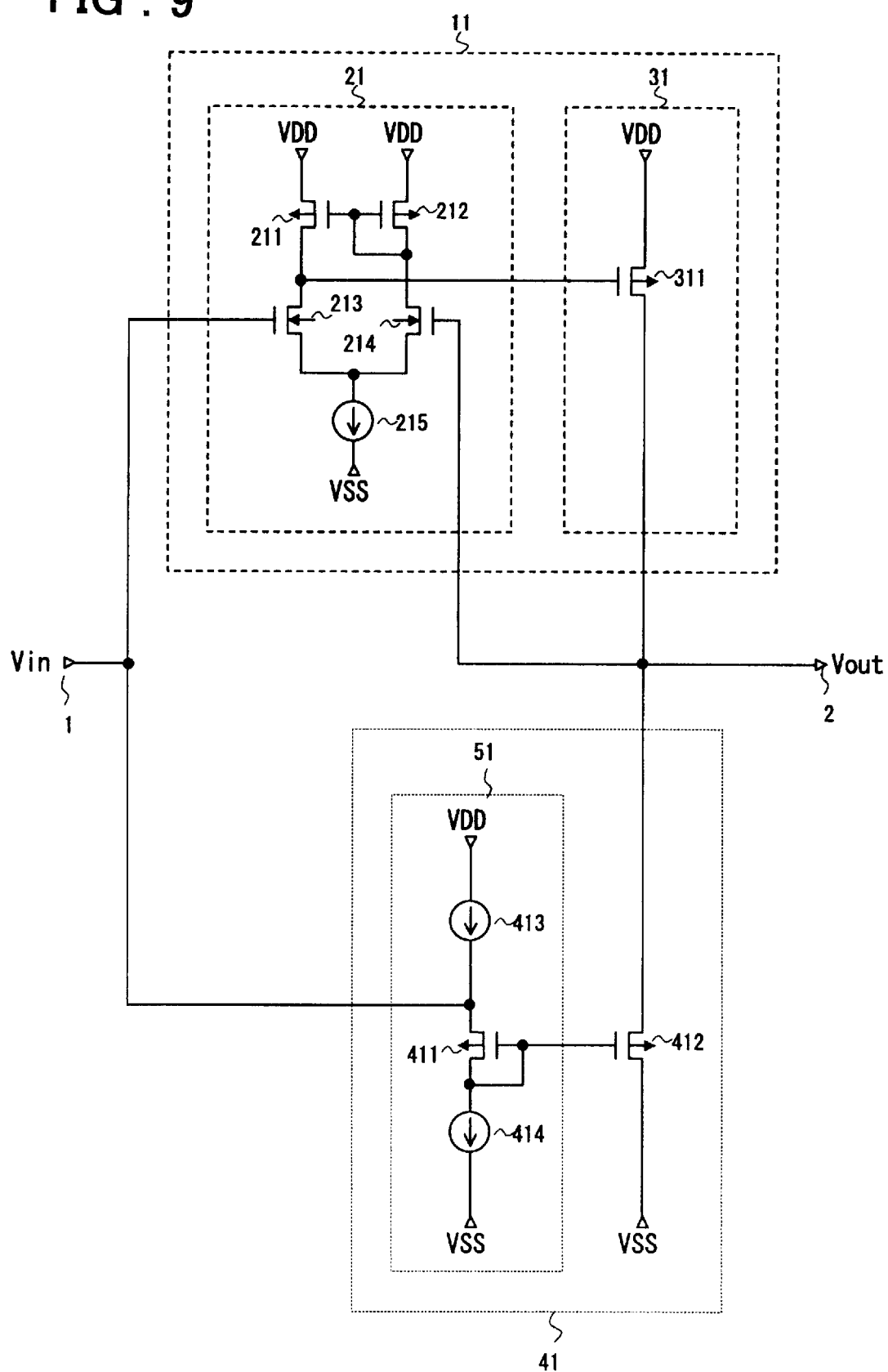
FIG. 9 is a diagram showing the structure of gate-bias control means according to the first embodiment.

FIG. 9 is a diagram illustrating a specific example of the structure of the gate-bias control means 51.

As shown in FIG. 9, the gate-bias control means 51 has a P-channel MOS transistor 411 of the same polarity as the transistor 412, and two constant-current sources 413 and 414. The P-channel MOS transistor 411 has its source connected to the input terminal 1 and to the higher-potential side power supply VDD via the constant-current source 413, and has its drain and gate tied together and connected to the lower-potential side power supply VSS via the constant-current source 414. The size of the transistor 411 and the current from the constant-current source 414 are set in such a manner that the gate-source voltages of the transistors 411, 412 will become equal and approach the vicinity of a threshold-value voltage when the source of the transistor 412 is the voltage Vin.

As a result, the gate-source voltage of the transistor 411 is set by the current of the constant-current source 414. The common gate voltage of the transistors 411 and 412 therefore is controlled to a fixed voltage in dependence upon the input voltage Vin and the output of the transistor 412 is stabilized at such time that the output voltage Vout is pulled down to the input voltage Vin during the source-follower discharge operation. Further, the constant-current source 413 is set to a current that is equal to that of the constant-current source 414. As a result, the common gate voltage of the transistors 411 and 412 can be controlled to a constant value even if the current supply capability of the input terminal 1, which applies the input voltage Vin, is low. In simplest form, it will suffice if the transistors 411 and 412 are designed to have the same size and the currents of the current sources 413, 414 are set to be sufficiently small. It should be noted that the current source 413 may be dispensed with if the current supply capability of the input terminal 1 that applies the input voltage Vin is high.

The source-follower discharging means 41 is capable of providing a novel effect, namely high-speed drive when used in combination with the feedback-type charging means 11. Further, the source-follower discharging means 41 consumes little power because the current sources 413 and 414 are set to sufficiently small currents. Accordingly, the feedback-type charging means 11 and source-follower discharging means 41 consume little power and, hence, the driver circuit obtained by combining these also consumes little power.

The operating range of the circuit shown in FIG. 9 is a voltage range that excludes the vicinity of the lower-potential side power supply voltage VSS and extends on the side of higher potential up to the higher-potential side power supply voltage VDD. The reason for this is as follows: The differential stage 21 does not operate in a voltage range in which the transistor 213 turns off when the input voltage Vin is in the vicinity of lower-potential side power supply voltage VSS. Further, the source-follower discharging means 41 can only pull the output voltage Vout down to a voltage higher than the lower-potential side power supply voltage VSS by an amount equivalent to the threshold-voltage of the transistor 412.

Figure 10:
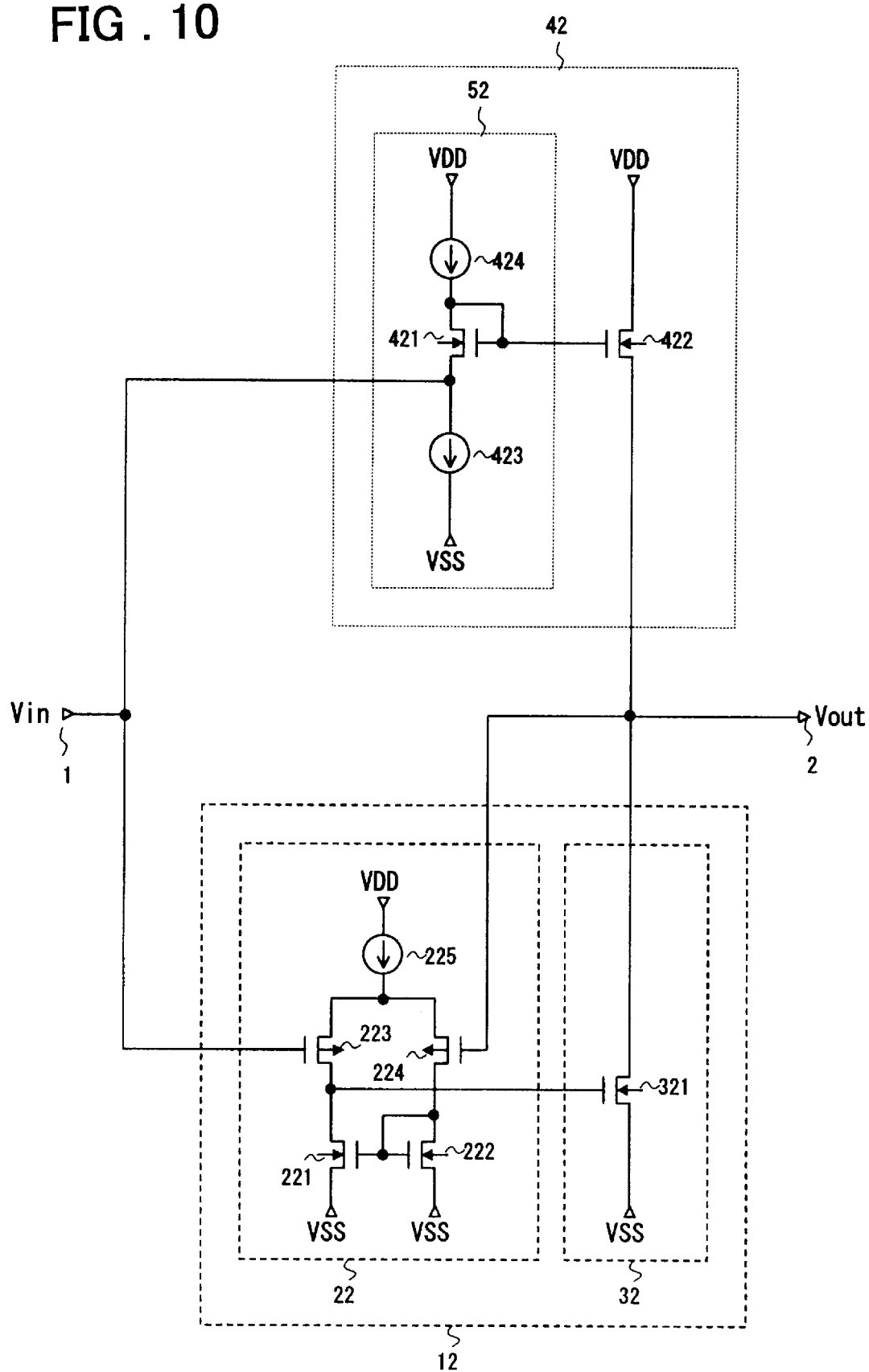
FIG. 10 is a diagram showing the structure of gate-bias control means according to the second embodiment.

FIG. 10 is a diagram illustrating a specific example of the structure of the gate-bias control means 52.

As shown in FIG. 10, the gate-bias control means 52 has an N-channel MOS transistor 421 of the same polarity as the transistor 422, and two constant-current sources 423 and 424. The N-channel MOS transistor 421 has its source connected to the input terminal 1 and to the lower-potential side power supply VSS via the constant-current source 423, and has its drain and gate tied together and connected to the lower-potential side power supply VSS via the constant-current source 424. The size of the transistor 421 and the current from the constant-current source 424 are set in such a manner that the gate-source voltages of the transistors 421 and 422 will become equal and approach the vicinity of a threshold-voltage when the source of the transistor 422 is the voltage Vin.

As a result, the gate-source voltage of the transistor 421 is set by the current of the constant-current source 424. The common gate voltage of the transistors 421 and 422 therefore is controlled to a fixed voltage in dependence upon the input voltage Vin and the output of the transistor 422 is stabilized at such time that the output voltage Vout is pulled up to the input voltage Vin during the source-follower charge operation. Further, the constant-current source 423 is set to a current that is equal to that of the constant-current source 424. As a result, the common gate voltage of the transistors 421 and 422 can be controlled to a constant value even if the current supply capability of the input terminal 1, which applies the input voltage Vin, is low. In simplest form, it will suffice if the transistors 421 and 422 are designed to have the same size and the currents of the current sources 423 and 424 are set to be sufficiently small. It should be noted that the current source 423 may be dispensed with if the current supply capability of the input terminal 1 that applies the input voltage Vin is high.

The source-follower charging means 42 is capable of providing a novel effect, namely high-speed drive when used in combination with the feedback-type discharging means 12. Further, the source-follower charging means 42 consumes low power because the current sources 423 and 424 are set to sufficiently small currents. Accordingly, the feedback-type discharging means 12 and source-follower charging means 42 consume low power and, hence, the driver circuit obtained by combining these also consumes low power.

The operating range of the circuit shown in FIG. 10 is a voltage range that excludes the vicinity of the higher-potential side power supply voltage VDD and extends down to the lower-potential side power supply voltage VSS on the side of lower potential. The reason for this is as follows: The differential stage 22 does not operate in a voltage range in which the transistor 223 turns off when the input voltage Vin is in the vicinity of higher-potential side power supply voltage VDD. Further, the source-follower charging means 42 can only pull the output voltage Vout up to a voltage lower than the higher-potential side power supply voltage VDD by an amount equivalent to the threshold-value voltage Vth of the transistor 422.

Figure 11:
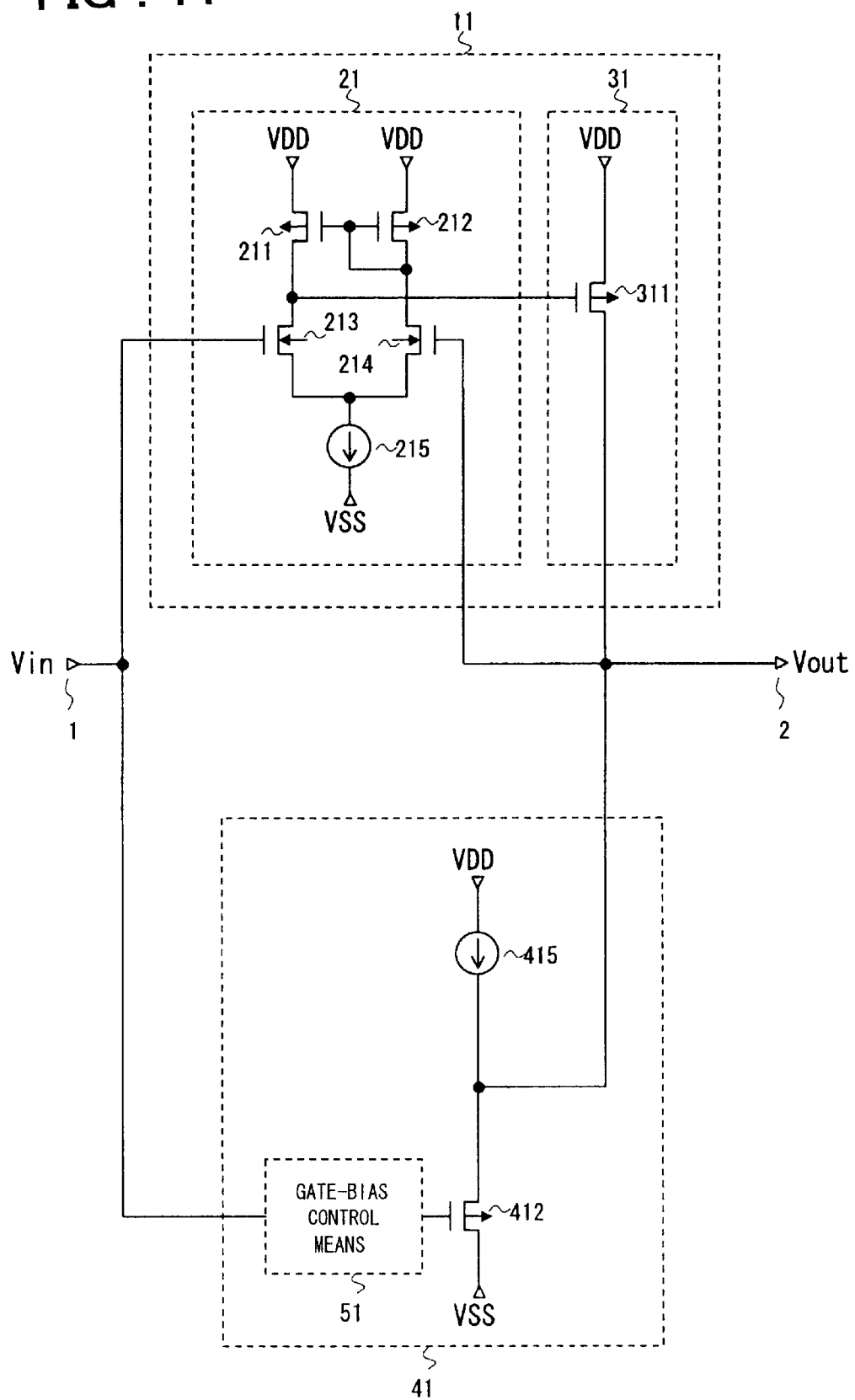
FIG. 11 is a diagram showing a modification of source-follower discharging means of FIG. 4.

FIG. 11 is a diagram showing a modification of source-follower discharging means 41 of FIG. 4. The structure of the modified part of FIG. 11 is applicable to the arrangement of FIG. 7 as well. According to this modification, as shown in FIG. 11, a current source 415 is provided between the higher-potential side power supply VDD and the connection node of the source of the P-channel MOS transistor 412 of the source-follower discharging means 41, the output terminal 2 and the gate of the N-channel MOS transistor 214. The current source 415 supplies a current the same as the drain current of the transistor 412 in the stable state in which the output voltage Vout becomes equal to the input voltage Vin. By virtue of this structure, it can be so arranged that a drain current will not flow into the transistor 311 in the stable state.

In a case where a drain current flows into the transistor 311 in the stable state in which the output voltage Vout becomes equal to the input voltage Vin, it is necessary that the output of the differential stage 21 be stable. With the arrangement shown in FIG. 11, no drain current flows into the transistor 311 in the stable state. As a result, the output of the differential stage 21 in the stable state can take on any potential at which the transistor 311 turns off. Accordingly, it is also possible to use a differential stage in which the operating point at which the output of the differential stage is stable is a potential at which the transistor 311 turns off.

Figure 12:
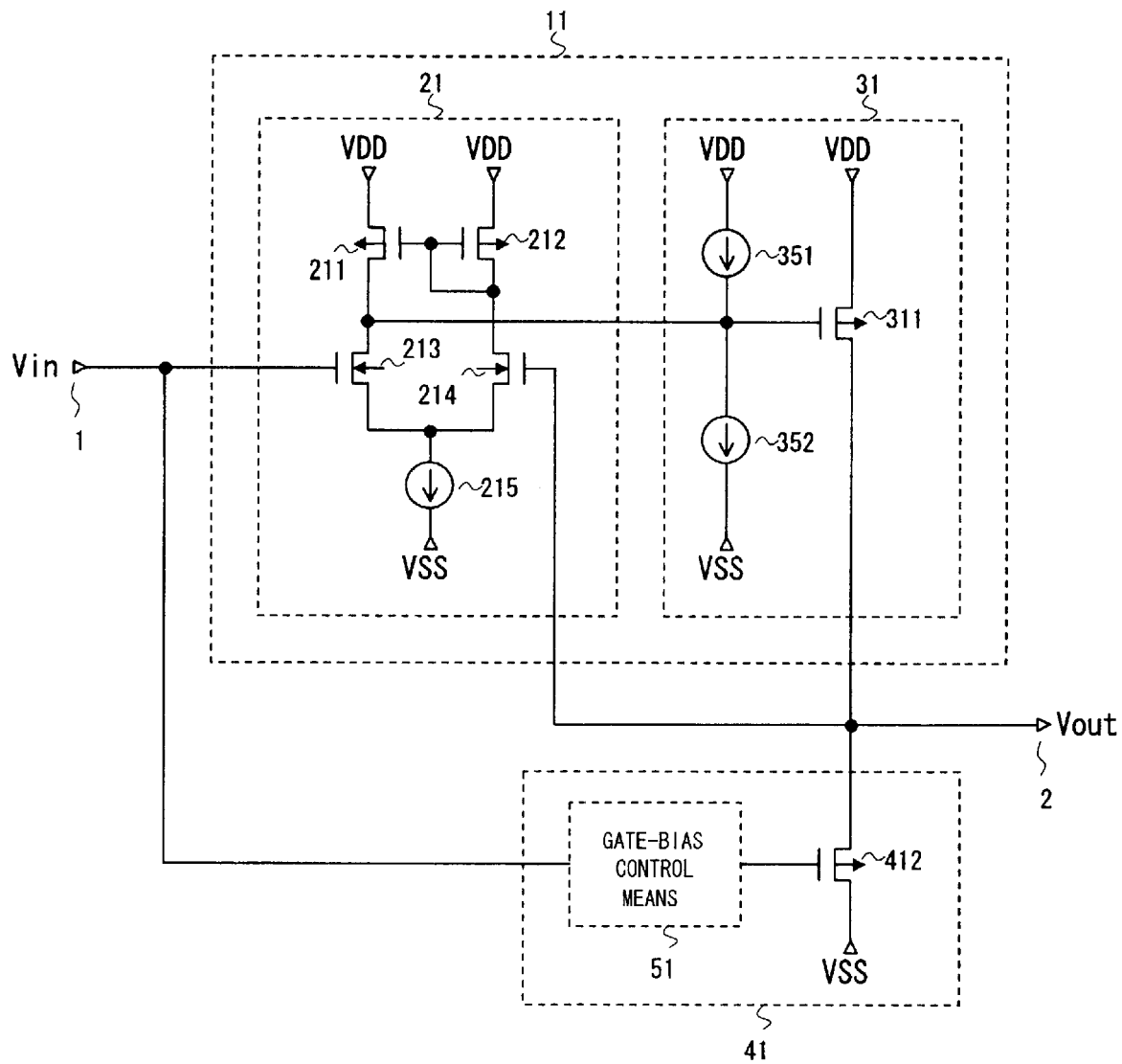
FIG. 12 is a diagram showing a modification of charging means of FIG. 4.

FIG. 12 is a diagram showing a modification of the charging means 31 of FIG. 4. The structure of the modified part of FIG. 12 is applicable to the arrangement of FIG. 7 as well. According to this modification, as shown in FIG. 12, current sources 351 and 352, which supply equal currents, are provided between the gate of the transistor 11 and the higher-potential side power supply VDD and lower-potential side power supply VSS, respectively.

In a case where the transistor 311 in the arrangement of FIG. 4 has a large size, the gate capacitance of the transistor 311 is large and so is the response delay. In order to raise the high-speed stability of the output voltage Vout, therefore, it is necessary to enlarge the current of the current source 215 in the differential stage. Even if the current of the current source 215 is enlarged, however, only about half of this current contributes to a change in the gate voltage of the transistor 311.

By contrast, with the arrangement shown in FIG. 12, all of the current that flows into the current sources 351 and 352 contributes to a change in the gate voltage of the transistor 311. As a result, the gate voltage of the transistor 311 can be changed rapidly with an increase in current smaller than that when the current of the current source 215 of the differential stage is increased.

Figure 13:
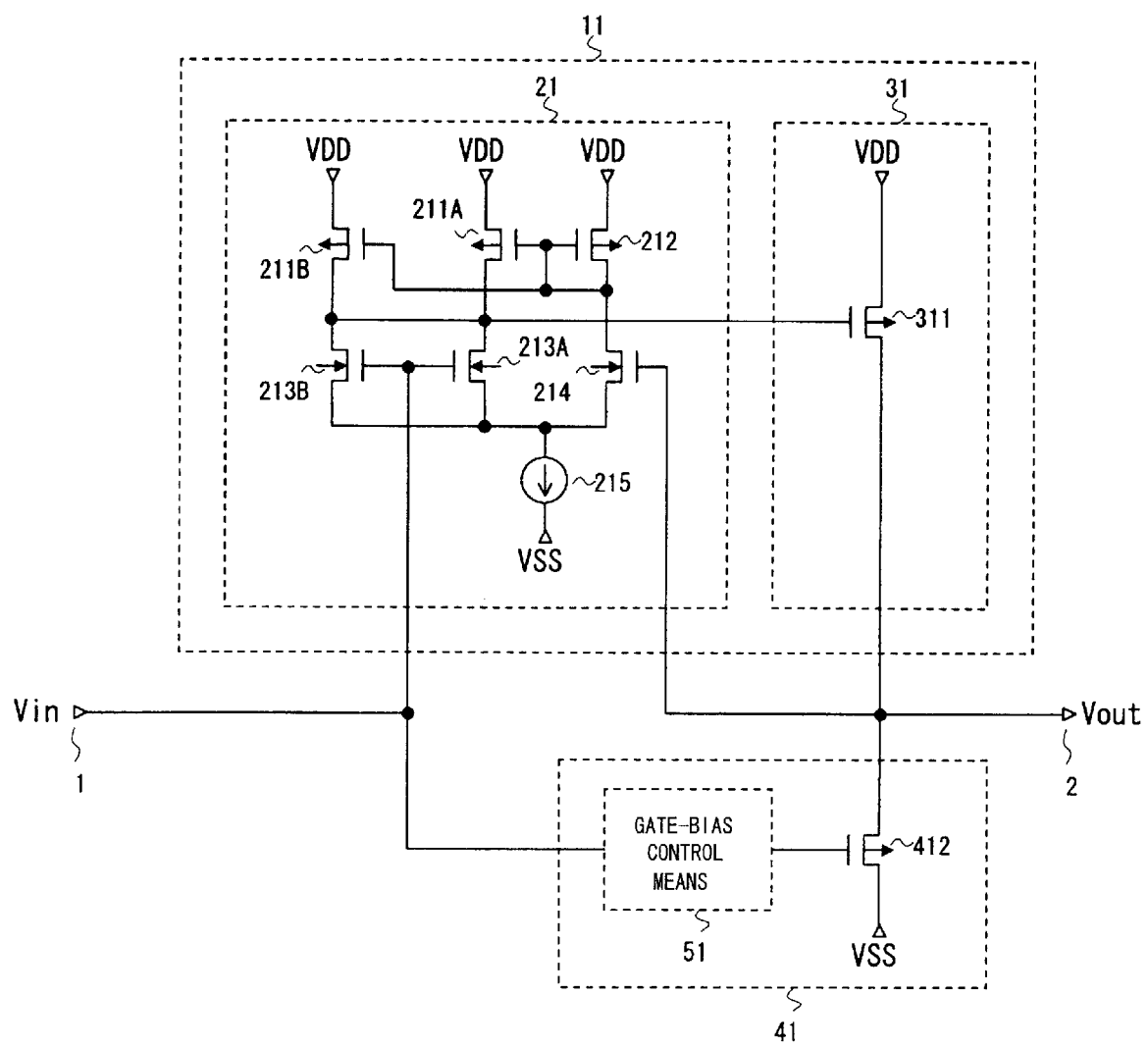
FIG. 13 is a diagram showing a modification of the feedback-type charging means of FIG. 4.

FIG. 13 is a diagram showing a modification of the differential stage 21 of FIG. 4. The structure of the modified part of FIG. 13 is applicable to the arrangement of FIG. 7 as well.

Referring to FIG. 13, the transistors 211 and 213 of differential stage 21 in FIG. 4 are connected in parallel. The drain, gate and source of a transistor 211A are connected to those of a transistor 211B, and the drain, gate and source of a transistor 213A are connected to those of a transistor 213B. The sizes of transistors 211A, 211B and 212 are equal to one another, and the sizes of transistors 213A, 213B and 214 are equal to one another.

In FIG. 4, the differential stage 21 is so designed that that the transistors 211 and 212 are equal to each other and so that the transistors 213 and 214 are equal to each other in order to prevent a variance in transistor characteristics ascribable to the manufacturing process. In this case, however, only half of the current of current source 215 flows to the side of transistors 211 and 213. If the size of transistor 311 is large, therefore, it may be difficult for the output voltage to stabilize owing to a response delay ascribable to gate capacitance.

Accordingly, if the transistors 211 and 213 are each replaced by two transistors of the same size, namely transistors 211A and 211B, and, 213A and 213B, respectively, as shown in FIG. 13, then two-thirds of the current of current source 215 will participate in changing the gate voltage of the transistor 311. As a consequence, the response delay of transistor 311 can be suppressed even through the current of current source 215 is not increased. This also makes it possible to prevent a variance in transistor characteristics caused by the manufacturing process. In this case, an arrangement may also be adopted in which one transistor is used for the transistors 211A and 211B to make the current driving capability of the one transistor twice that of the transistor 212, and one transistor is used for the transistors 213A and 213B to make the current driving capability of the one transistor twice that of the transistor 214.

Figure 14:
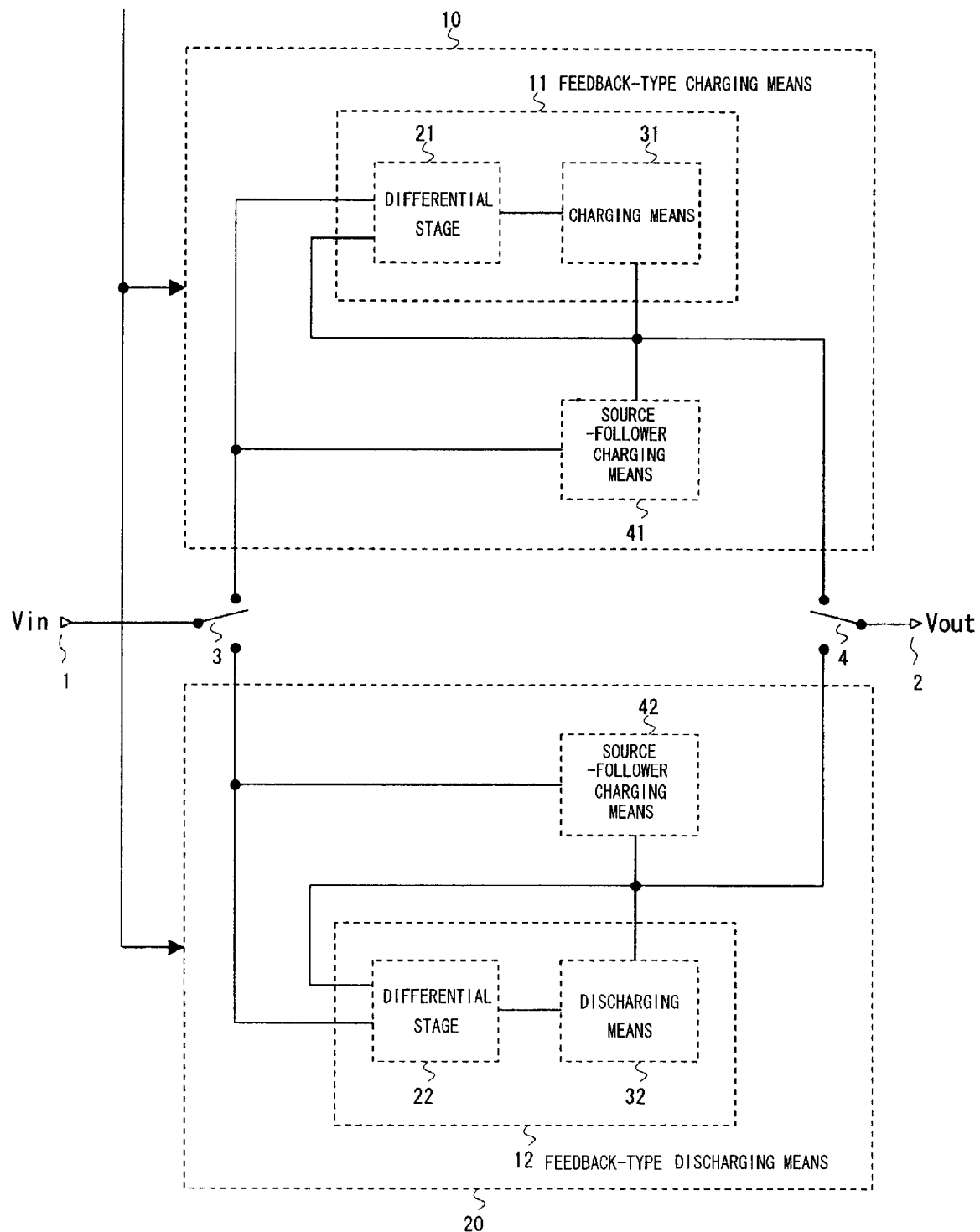
FIG. 14 is a block diagram illustrating the structure of a third embodiment of the present invention.

FIG. 14 is a block diagram illustrating a driver circuit obtained by combining a driver circuit 10 of high-speed charging capability (the circuit arrangement shown in FIG. 1) and a driver circuit 20 of high-speed discharging capability (the circuit arrangement shown in FIG. 2). Drive is performed by selecting either driver circuit 10 or driver circuit 20 using changeover switches 3, 4, whereby both charging and discharging can be carried out at high speed.

An operation control signal suppresses consumption of power by halting operation of whichever of the driver circuits has not been selected by the changeover switches 3 and 4. The operation control signal can also terminate the output by halting both of the driver circuits 10 and 20.

Further, even in a case where the driver circuit 10 is a driver circuit of the kind shown in FIG. 9 which does not operate in the vicinity of the lower-potential side power supply voltage VSS and the driver circuit 20 is a driver circuit of the kind shown in FIG. 10 which does not operate in the vicinity of the higher-potential side power supply voltage VDD, operation over a range of power-supply voltages from lower-potential side power supply voltage VSS to higher-potential side power supply voltage VDD becomes possible by switching between the driver circuit 10 and driver circuit 20 in dependence upon the voltage output.

Figure 15:
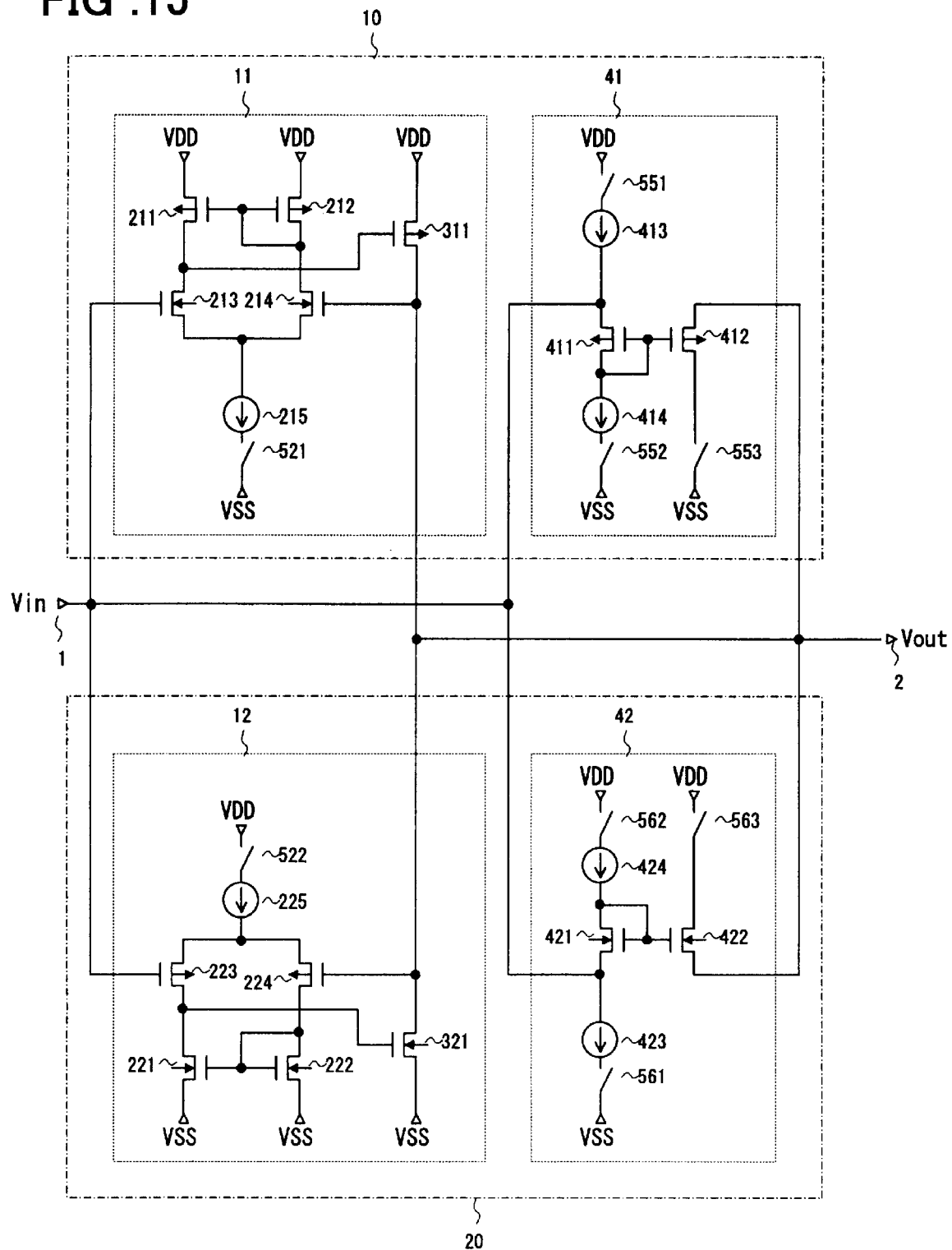
FIG. 15 is a diagram showing a specific example of FIG. 13.

FIG. 15 is a diagram showing a specific example of the circuit arrangement of FIG. 14. The driver circuit 10 of FIG. 14 is configured as shown in FIG. 9, the driver circuit 20 is configured as shown in FIG. 10, and the driver circuits 10 and 20 are provided with switches 521, 551, 552, and 553 and switches 522, 561, 562, and 563, respectively, whose on/off action is controlled by the operation control signal (not shown).

The driver circuit 10 operates when all of the switches 521, 551, 552, and 553 turn on and ceases operating, thereby cutting off all current, when all of these switches turn off. The driver circuit 20 operates when all of the switches 522, 561, 562, and 563 turn on and ceases operating, thereby cutting off all current, when all of these switches turn off. Each switch also has the changeover function of switches 3, 4 in FIG. 14.

The operating range of the circuit shown in FIG. 15 depends upon the driving voltage but is the range of power-supply voltages from lower-potential side power supply voltage VSS to higher-potential side power supply voltage VDD. However, charging cannot be performed in the vicinity of lower-potential side power supply voltage VSS and discharging cannot be performed in the vicinity of higher-potential side power supply voltage VDD. For example, in a case where the higher-potential side voltage and lower-potential side voltage are driven alternately with respect to any intermediate voltage, operation over the range of the power-supply voltages is made possible by causing the driver circuit 10 to operate in a case where the higher-potential side voltage is to be driven and causing the driver circuit 20 to operate in a case where the lower-potential side voltage is to be driven.

Figure 16:
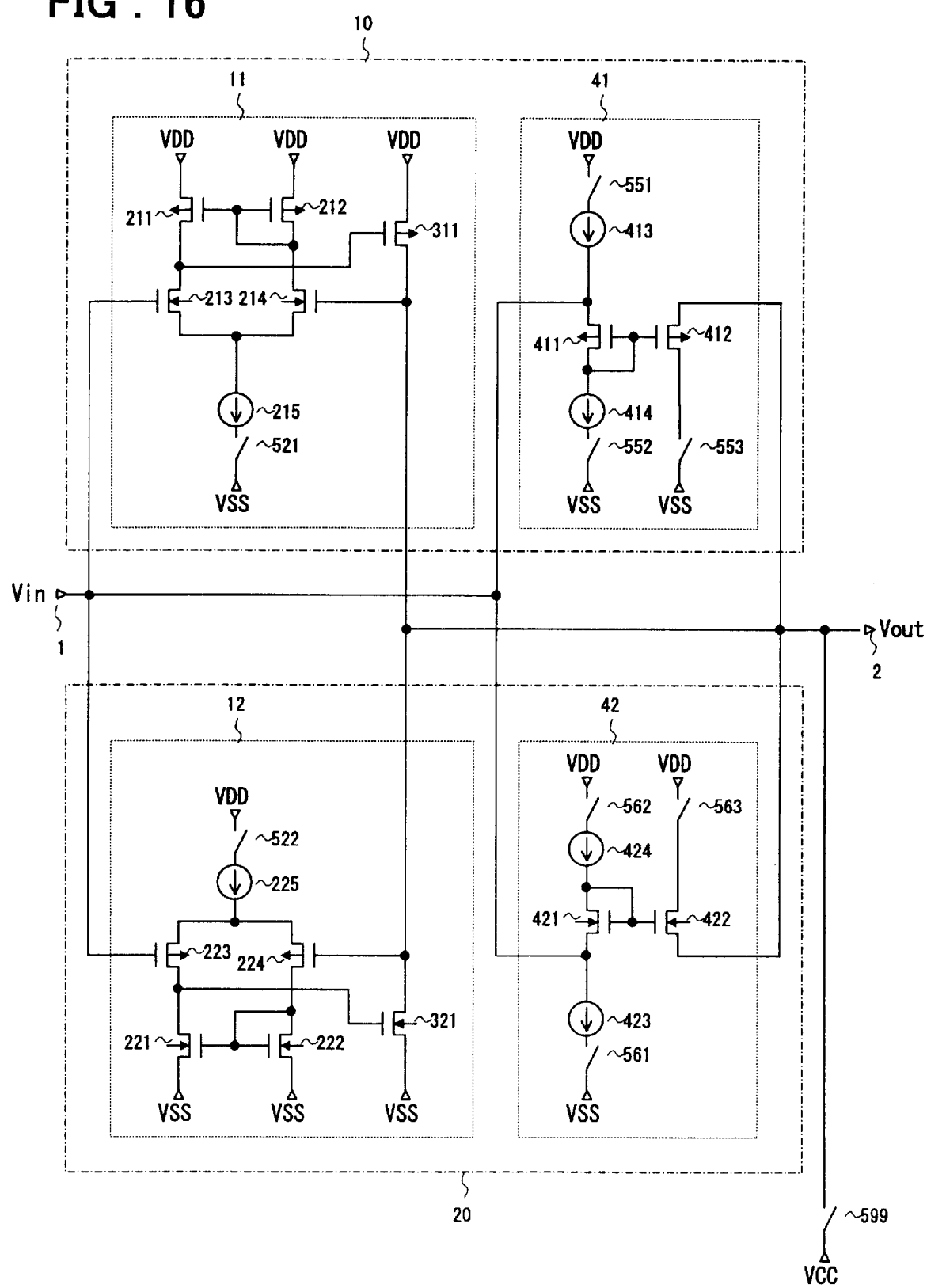
FIG. 16 is a diagram showing a modification of FIG. 15.

FIG. 16 is a diagram showing a modification of FIG. 15. Here the output terminal 2 in FIG. 15 is provided with pre-charging means. The pre-charging means is constructed by connecting a pre-charging voltage VCC to the output terminal 2 via a switch 599. Before the driver circuit 10 or 11 is made to operate, the switch 599 is turned on to pre-charge the output terminal 2 to the voltage VCC.

The driver circuit 10 or 20 is made to operate after the switch 599 is turned off and pre-charging is completed. It should be noted that the pre-charging voltage VCC may be a voltage having a plurality of levels.

As for the operating range of the circuit shown in FIG. 16, setting the pre-charging voltage VCC to an optimum voltage allows the driver circuit 10 to be operated in a case where the higher-potential side voltage is driven with respect to the pre-charging voltage VCC and allows the driver circuit 20 to be operated in a case where the lower-potential side voltage is driven with respect to the pre-charging voltage VCC, thereby making possible operation over the range of power-supply voltages from lower-potential side power supply voltage VSS to higher-potential side power supply voltage VDD with regard to drive of any type.

Figure 17:
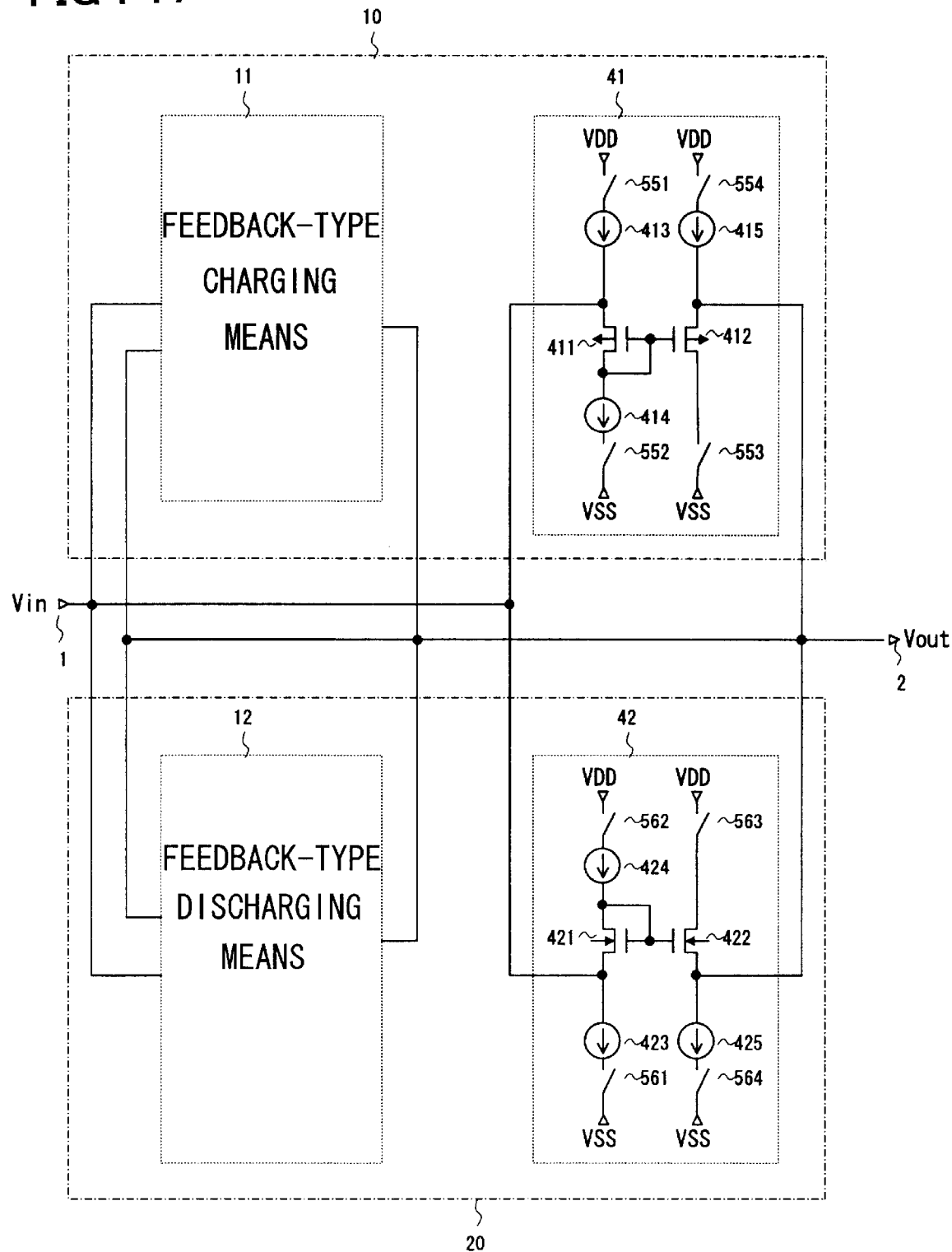
FIG. 17 is a diagram showing a modification of source-follower discharging means and source-follower charging means of FIG. 15.

FIG. 17 is a diagram showing a modification of the source-follower discharging means 41 and source-follower charging means 42 of FIG. 15.

As shown in FIG. 17, this circuit uses the principle of the source-follower discharging means 41 of FIG. 11 and is so adapted that when the output voltage Vout is stable, current will not flow into the output terminal 2 from charging means and discharging means included in the feedback-type charging means 11 and feedback-type discharging means 12, respectively. The source-follower discharging means 41 comprises a switch 554 and a constant-current source 415 provided between the source of the P-channel MOS transistor 412 and the higher-potential side power supply VDD, and the source-follower charging means 42 comprises a switch 564 and a constant-current source 425 provided between the source of the N-channel MOS transistor 422 and the lower-potential side power supply VSS.

Figure 18:
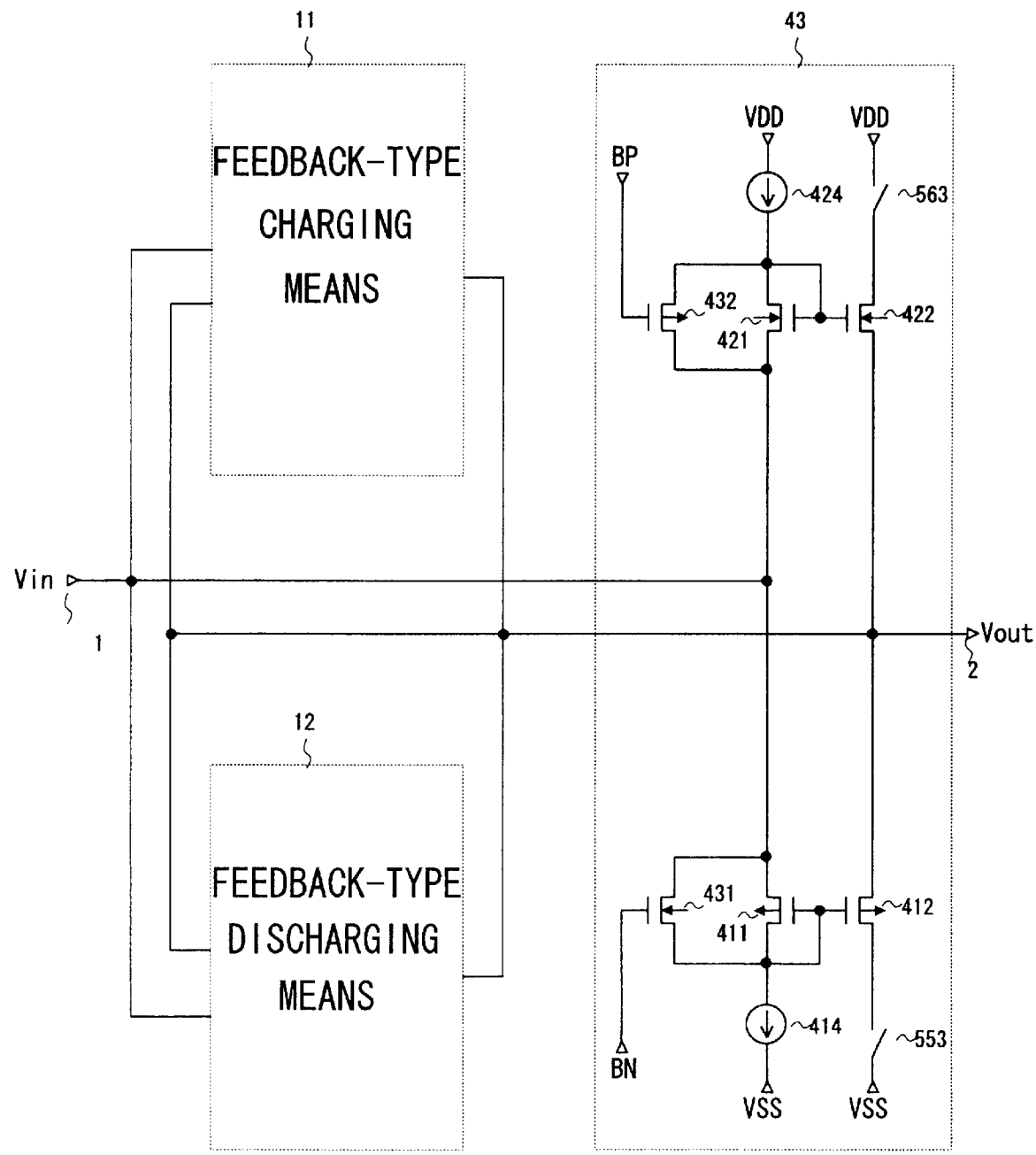
FIGS. 18, 19 and 20 are diagrams showing modifications of FIGS. 15, 14 and 19, respectively.

FIG. 18 is a diagram illustrating a modification of FIG. 15. Referring to FIG. 18, this circuit is constructed to have source-follower charging/discharging means 43 obtained by combining the source-follower discharging means 41 and source-follower charging means 42 into single means. The source-follower charging/discharging means 43 implements the functions of both the source-follower discharging means 41 and source-follower charging means 42 and therefore reduces the number of circuit elements.

The source-follower charging/discharging means 43 uses the transistors 411 and 412, the constant-current source 414 and the switch 553 of the source-follower discharging means 41 and the transistors 421 and 422, constant-current source 424 and switch 563 of the source-follower charging means 42 as is.

Transistors 431 and 432 are additionally provided. The element sizes of the transistors 411 and 412 and the current of the current source 414 are set in such a manner that the gate-source voltages of the transistors 411 and 412 will be equal to each other. Similarly, the element sizes of the transistors 421 and 422 and the current of the current source 424 are set in such a manner that the gate-source voltages of the transistors 421 and 422 will be equal to each other. Furthermore, the current sources 414 and 424 are set to equal currents.

The source-follower charging/discharging means 43 is a circuit that applies the art proposed in the specification of Japanese Patent Application Laid-Open No. 2000-338461 (Japanese Patent Application No. 11-145768). In terms of the operation of source-follower charging/discharging means 43, the switch 553 is turned on to cause the transistor 412 to perform a source-follower discharge operation when the feedback-type charging means 11 is to be activated, and the switch 563 is turned on to cause the transistor 422 to perform a source-follower charging operation when the feedback-type discharging means 12 is to be activated.

Further, gate-bias voltages BN and BP of the transistors 431 and 432, respectively, are controlled to optimum voltages, whereby the currents of current sources 414 and 424 can be made to flow via the transistors 431 and 432 even in a case where the transistor 411 or 421 turns off when the input voltage Vin is in the vicinity of the power-supply voltage VDD or VSS.

The source-follower charging/discharging means 43 is such that the transistor 412 can only pull the output voltage Vout down to a voltage higher than the lower-potential side power supply voltage VSS by an amount equivalent to the threshold-value voltage and such that the transistor 422 can only pull the output voltage Vout up to a voltage lower than the higher-potential side power supply voltage VDD by an amount equivalent to the threshold-value voltage. As a result, in a case where the switches 553 and 563 are changed over so that the source-follower charging operation and source-follower discharge operation are performed, the operating range of FIG. 18 is similar to that shown in FIG. 15.

Further, source-follower charging/discharging means 43 is such that when the feedback-type charging means 11 or feedback-type discharging means 12 is made to operate, both of the switches 553 and 565 are turned on so that the source-follower charging operation and source-follower discharge operation are both capable of being implemented. In this case, the transistor 422 produces the source-follower charging effect if the input voltage Vin is greater than the output voltage Vout, and the transistor 412 produces the source-follower discharge effect if the input voltage Vin is less than the output voltage Vout.

Even though an effect the same as that of the feedback-type charging means 11 or feedback-type discharging means 12 is produced, the effect of the feedback-type charging means 11 or feedback-type discharging means 12 will be stronger (the output current will be larger than that of the source-follower charging/discharging means 43) and there is almost no influence upon the change in output voltage Vout.

However, a charging effect can be produced by the transistor 422 of the source-follower charging/discharging means 43 within a voltage range in which the feedback-type charging means 11 does not operate when the input voltage Vin is in the vicinity of the lower-potential side power supply voltage VSS. Similarly, a discharge effect can be produced by the transistor 412 of the source-follower charging/discharging means 43 within a voltage range in which the feedback-type discharging means 12 does not operate when the input voltage Vin is in the vicinity of the higher-potential side power supply voltage VDD. Accordingly, as for the range of operation of the circuit of FIG. 18 at this time, it is possible to achieve circuit operation over a range of power-supply voltages from lower-potential side power supply voltage VSS to higher-potential side power supply voltage VDD with regard to any of drive.

Figure 19:
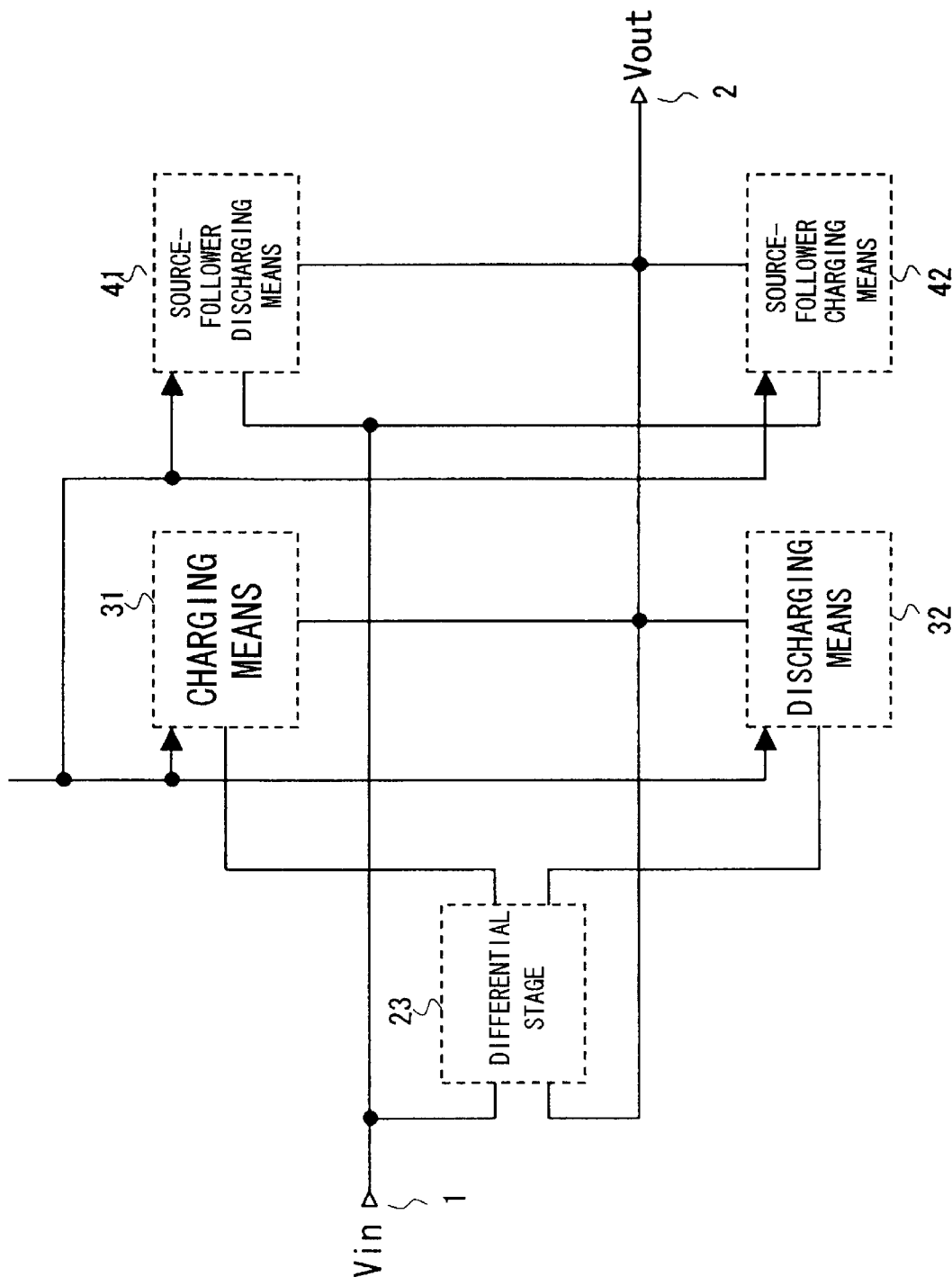

FIG. 19 is a diagram showing a modification of the structure of FIG. 14. Here the differential stages 21 and 22 are replaced by a single differential stage 23 and the charging means 31 and discharging means 32 are controlled by the output of the differential stage 23. The differential stage 23 operates regardless of which of charging means 31 and discharging means 32 operates.

The operation control signal halts at least the discharging means 32 when the charging means 31 and source-follower discharging means 41 operate and halts at least the charging means 31 when the discharging means 32 and source-follower charging means 42 operate.

With the circuit shown in FIG. 14, the driver circuit 10 and driver circuit 20 operate independently of each other. If a variance in element characteristics occurs in the manufacturing process of, e.g., an LSI chip, therefore, the outputs of the driver circuit 10 and driver circuit 20 will develop a variance. Accordingly, in a driver circuit which performs drive by switching between the driver circuit 10 and driver circuit 20 in conformity with the driving voltage, there is an increase in the relative output variance of a plurality of driving voltages.

On the other hand, with the arrangement of FIG. 19 in which the operation of the charging means 31 and discharging means 32 of the differential stage 23 is controlled from the single differential stage 23, the relative output variance of each of the charging means 31 and discharging means 32 can be suppressed if there is a variance in the element characteristics in, say, the manufacturing process of an LSI chip.

The source-follower discharging means 41 and source-follower charging means 42 operate independently of the differential stage 23, charging means 31 and discharging means 32. However, when the driving capability of the charging means 31 and discharging means 32 is sufficiently high in comparison with that of the source-follower discharging means 41 and source-follower charging means 42, the output voltage Vout is decided almost entirely by the charging means 31 or discharging means 32. As a result, the arrangement shown in FIG. 19 makes it possible to suppress relative output variance of a plurality of driving voltages.

Figure 20:
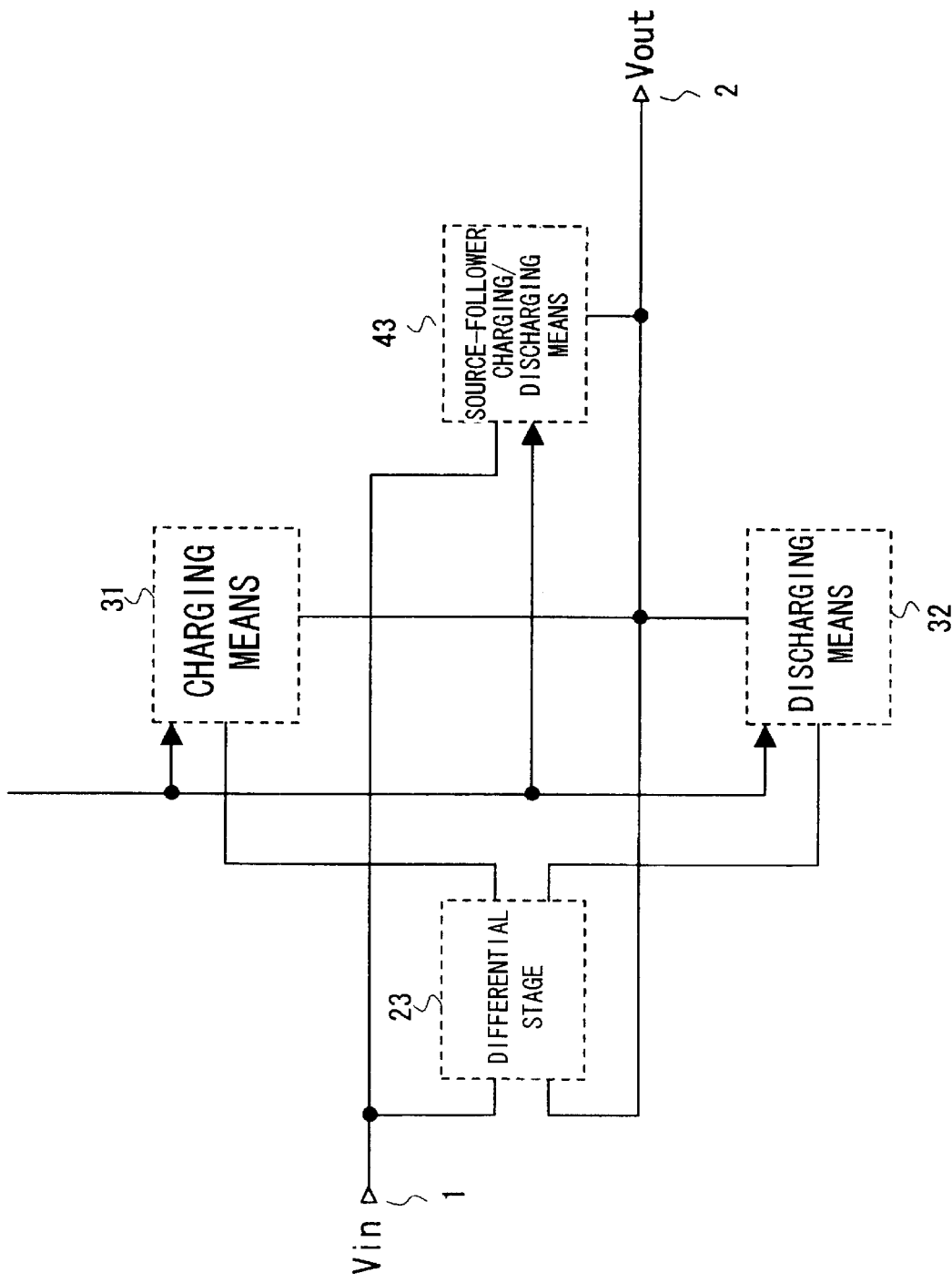

FIG. 20 is a diagram showing a modification of the structure of FIG. 19. In FIG. 19, source-follower discharging means 41 and source-follower charging means 42 are replaced by the source-follower charging/discharging means 43, which is capable of implementing the functions of both means 41 and 42.

Figure 21:
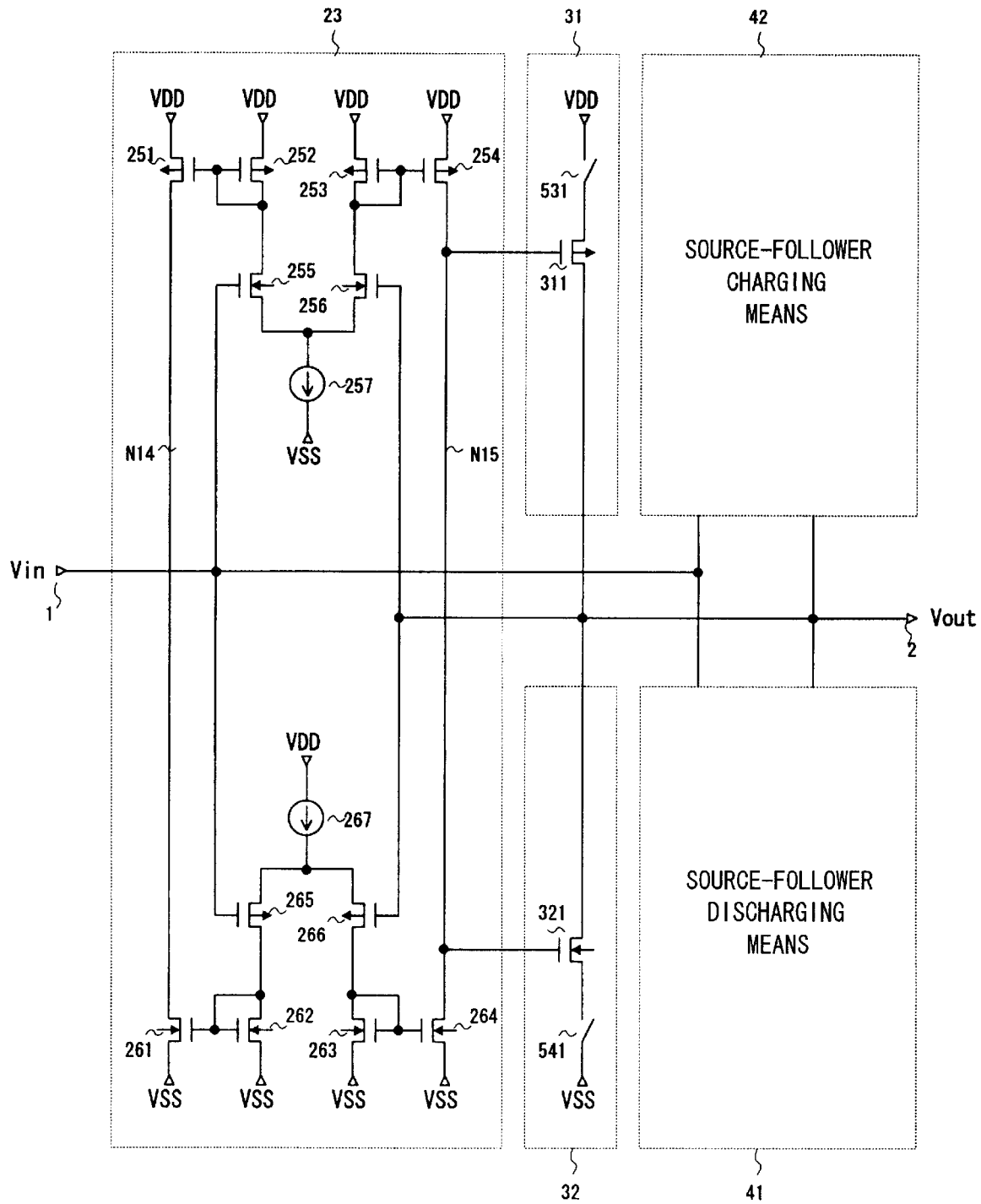
FIG. 21 is a diagram showing a specific example of FIG. 13.

FIG. 21 is a diagram showing a specific example of the structure of FIG. 19 constituted by a single differential pair.

As shown in FIG. 21, this circuit includes a switch 531 for controlling operation of the charging means 31 and a switch 541 for controlling operation of the discharging means 32, wherein the switches 531 and 541 are controlled so as to halt operation of at least one of the charging means 31 and discharging means 32.

The differential stage 23 is constructed by combining an NMOS differential-input circuit (the upper side, which is the side of the higher-potential side power supply VDD), and a PMOS differential-input circuit (the lower side, which is the side of the lower-potential side power supply VSS).

The NMOS differential-input circuit (the upper side) includes N-channel MOS transistors 255 and 256, which constitute a differential pair, having their sources coupled together and connected to a constant-current source 257 and having the input Vin connected to the gate of transistor 255 and the output Vout connected to the gate of transistor 256; P-channel MOS transistors 252 and 253 having their sources connected to the power supply VDD and their drains and gates to the outputs of the differential pair; and P-channel MOS transistors 251 and 254 having their sources connected to the power supply VDD and their gates to the gates of the P-channel MOS transistors 252 and 253, respectively. The drain of the P-channel MOS transistor 254 is connected to the gate of the P-channel MOS transistor 311 of the charging means 31.

The PMOS differential-input circuit (the lower side) includes P-channel MOS transistors 265 and 266, which constitute a differential pair, having their sources tied together and connected to a constant-current source 267 and having the input Vin connected to the gate of transistor 265 and the output Vout connected to the gate of transistor 266; N-channel MOS transistors 262 and 263 having their sources connected to the power supply VSS and their drains and gates to the outputs of the differential pair; and N-channel MOS transistors 261 and 264 having their sources connected to the power supply VSS and their gates to the gates of the N-channel MOS transistors 262 and 263, respectively. The drain of the N-channel MOS transistor 264 is connected to the gate of the N-channel MOS transistor 321 of the discharging means 32 and to the drain of the P-channel MOS transistor 254. The drain of the N-channel MOS transistor 261 is connected to the drain of the P-channel MOS transistor 251.

When Vin>Vout holds, a large current is made to flow in the transistor 255 of the N-channel MOS transistors 255 and 256. As a result, of the drain currents of transistors 251 and 254 that output the drain current of the transistors 255 and 256 as a mirror current, the drain current of transistor 251 becomes greater.

When Vin<Vout holds, on the other hand, of the drain currents of transistors 251 and 254 that output the drain current of the transistors 255 and 256 as a mirror current, the drain current of transistor 254 is greater. The sum of the currents of the differential-pair transistors 251 and 254 is set by the constant-current source 257.

Similarly, when Vin>Vout holds in the PMOS differential-input circuit (the lower side), a large current is made to flow in the transistor 266 of the transistors 265 and 266. As a result, of the drain currents of transistors 261 and 264, the drain current of transistor 264 becomes greater. When Vin<Vout holds, the drain current of the transistor 261 is greater. The sum of the currents of the differential-pair transistors 261 and 264 is set by the constant-current source 267.

The drain terminals of the transistors 251 and 254 are connected to the drain terminals of the transistors 261 and 264. If the current sources 257 and 267 are set to equal currents, the terminal voltage at a common drain terminal N14 of transistors 251 and 261 rises and the terminal voltage at a common drain terminal N15 of transistors 254 and 264 falls when Vin>Vout holds.

When Vin<Vout holds, on the other hand, the terminal voltage at N14 falls and the terminal voltage at N15 rises.

At Vin=Vout, the transistors 251 and 261 have equal drain currents and the transistors 254 and 264 have equal drain currents. As a result, the terminal voltages at N15 and N14 can take on any voltage.

The node N15 is made the output terminals of the differential stage 23 and the common output terminals to the gate of the transistor 311 of charging means 31 and to the gate to the transistor 321 of the discharging means 32.

As a result, at Vin>Vout, the terminal voltage at node N15 declines in a state in which the switch 531 is ON, whereby the charging effect of transistor 311 is produced to pull up the output voltage Vout. At Vin<Vout, the terminal voltage at node N15 rises in a state in which the switch 541 is ON, whereby the discharge effect of transistor 321 is produced to pull down the output voltage Vout.

As Vout approaches Vin, the terminal voltage of node N15 rises to a voltage level at which the gate-source voltage of the transistor 311 is in the vicinity of the threshold-value voltage at charging time. At discharge time, the terminal voltage of node N15 falls to a voltage level at which the gate-source voltage of the transistor 321 is in the vicinity of the threshold-value voltage.

If the input voltage Vin has changed to the vicinity of the higher-potential side power supply voltage VDD when charging is performed, the transistor 265 of differential stage 23 turns off, the transistors 261 and 262 also turn off and the terminal voltage of node N14 rises.

On the other hand, the terminal voltage at node N15 is a low voltage at Vin>Vout, whereby the transistor 311 is made to perform a charging operation and pull-up the output voltage Vout. The rise in the output voltage Vout is accompanied by a rise in the voltage of the node N15 as well.

If the output voltage Vout rises to a level at which the transistor 266 turns off, however, the transistors 263 and 264 also turn off and the terminal voltage of the node N15 rises to the vicinity of the higher-potential side power supply voltage VDD to thereby turn off the transistor 311. As a consequence, the voltage range over which the output voltage Vout is capable of being controlled extends to a voltage at which the upper limit is lower than the higher-potential side power supply voltage VDD by an amount equivalent to the threshold-voltage value of the transistor 266.

If the input voltage Vin has changed to the vicinity of the lower-potential side power supply voltage VSS when discharge is performed, then, in similar fashion, the voltage range over which the output voltage Vout is capable of being controlled extends to a voltage at which the lower limit is higher than the lower-potential side power supply voltage VSS by an amount equivalent to the threshold-voltage value of the transistor 256.

Accordingly, the operating range of the circuit shown in FIG. 21 is such that the circuit operates over an intermediate range of voltages with the exception of the partial voltage ranges in the vicinity of the power-supply voltages VDD and VSS.

Figure 22:
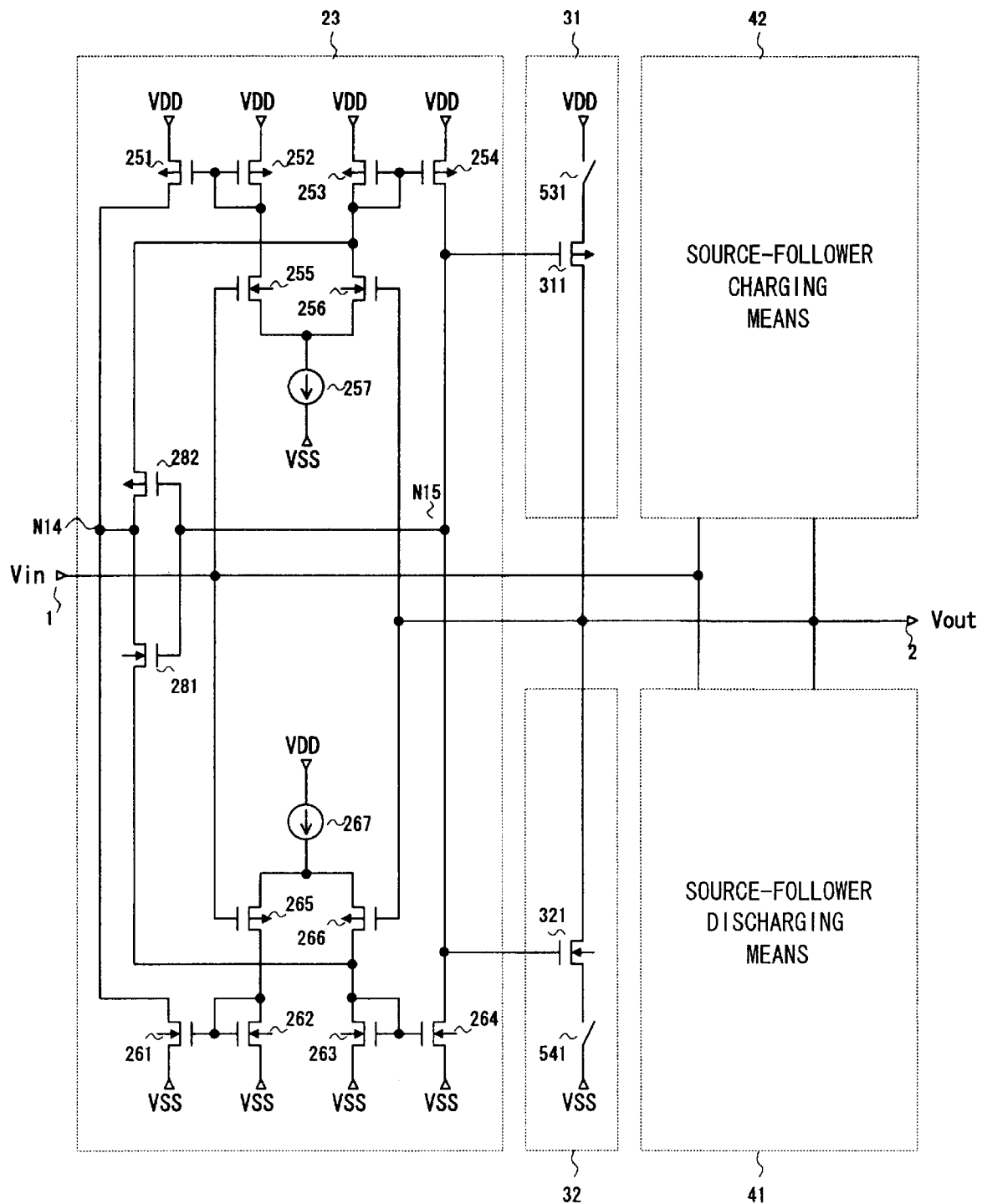
FIG. 22 is a diagram showing a modification of FIG. 21.

FIG. 22 is a diagram illustrating a modification of FIG. 21.

As shown in FIG. 22, the differential stage 23 is additionally provided with an N-channel MOS transistor 281 having its drain, gate and source connected to the node N14, the node N15 and a drain of the P-channel MOS transistor 266, respectively, and a P-channel MOS transistor 282 having its drain, gate and source connected to the node N14, the node N15 and a drain of the N-channel MOS transistor 256, respectively. The operating range of the circuit shown in FIG. 22 is such that the circuit operates over a range of power-supply voltages from lower-potential side power supply voltage VSS to higher-potential side power supply voltage VDD with regard to any type of drive.

When the differential stage 23 is operating normally, the terminal voltages at N14 and N15 fluctuate in mutually contradictory fashion except at Vin=Vout, in a manner similar to that of FIG. 21.

In a case where the differential stage 23 is provided with the transistors 281 and 282, the output voltage Vout rises to the level of the threshold-value voltage of transistor 266 and the terminal voltages of the nodes N14 and N15 both attempt to rise if the input voltage Vin changes to the vicinity of the higher-potential side power supply voltage VDD when charging is performed. The transistor 281 has its drain, gate and source connected to the node N14, the node N15 and the drain of the transistor 263, respectively. If the drain, source and gate of this transistor attempt to assume a high potential, a low potential and a high potential, respectively, at this time, then the transistor 281 turns on and a current path is produced between the node N14 and the drain terminal of the transistor 263.

By virtue of the foregoing, even if the PMOS differential-pair transistors 265 and 266 are in the OFF state, the drain current of transistor 251 flows into transistor 263 and the current-mirror circuit of transistors 263 and 264 operates.

As a result, the terminal voltage of the node N15 exhibits a fluctuation in potential that conforms to a fluctuation in the drain currents of the NMOS differential-pair transistors 255 and 256, whereby it is possible for the transistor 311 to perform a charging operation.

In other words, even in a case where the input voltage Vin has changed to the vicinity of the higher-potential side power supply voltage VDD at the time of charging, the differential stage 23 is such that the terminal voltage at node N15 is made to fluctuate by the operation of the NMOS differential-input circuit (the upper side) and current-mirror circuit based upon the transistors 263 and 264, thereby making it possible to pull the output voltage Vout up to the input voltage Vin.

Similarly, if the input voltage Vin changes to the vicinity of the lower-potential side power supply voltage VSS at the time of discharge, the output voltage Vout falls to the level of the threshold-value voltage of transistor 256 and the terminal voltages of the nodes N14 and N15 both attempt to decline.

The transistor 282 has its drain, gate and source connected to the node N14, the node N15 and the drain of the transistor 253, respectively. If the drain, source and gate of this transistor attempt to assume a low potential, a high potential and a low potential, respectively, at this time, then the transistor 282 turns on and a current path is produced between the drain terminal of the transistor 253 and the node N14.

By virtue of the foregoing, even if the NMOS differential-pair transistors 255 and 256 are in the OFF state, the drain current of transistor 253 flows into transistor 261 and the current-mirror circuit of transistors 253 and 254 operates.

As a result, the terminal voltage of the node N15 exhibits a fluctuation in potential that conforms to a fluctuation in the drain currents of the PMOS differential-pair transistors 265 and 266, whereby it is possible for the transistor 321 to perform a discharge operation.

In other words, even in a case where the input voltage Vin has changed to the vicinity of the lower-potential side power supply voltage VSS at the time of discharge, the differential stage 23 is such that the terminal voltage at node N15 is made to fluctuate by the operation of the PMOS differential-input circuit (the lower side) and current-mirror circuit based upon the transistors 253 and 254, thereby making it possible to pull the output voltage Vout down to the input voltage Vin.

Even at the time of normal operation in which the terminal voltages of the nodes N14 and N15 exhibit fluctuation in mutually contradictory fashion, transistor 281 turns on and the node N14 is shorted to the drain terminal of the transistor 263 in a case where node N14 changes to low potential and node N15 changes to high potential. However, if both are at the low potential, no problem arises despite shorting and, as a result, the change in the potential at node N15 is not affected and neither is the output voltage Vout.

Similarly, transistor 282 also turns on and the node N14 is shorted to the drain terminal of the transistor 253 in a case where node N14 changes to a high potential and node N15 changes to a low potential. However, if both are at the high potential, no problem arises despite shorting and, as a result, the change in the potential at node N15 is not affected and neither is the output voltage Vout.

By thus providing the differential stage 23 with the transistors 281 and 282, the differential stage 23 operates normally with regard to any input voltage Vin within the range of power-supply voltages, and the circuit shown in FIG. 22 is capable of operating within the range of power-supply voltages.

The differential stage 23 is such that the gates of the transistors 311 and 321 are controlled by the common output terminal N15. Even if the characteristics of the transistors constructing the differential stage 23 develop variance, therefore, both the charging action and discharging action produce a shift in output voltage in the same direction. As a result, the relative output-voltage variance of a plurality of driving voltages can be kept sufficiently small.

Figure 23:
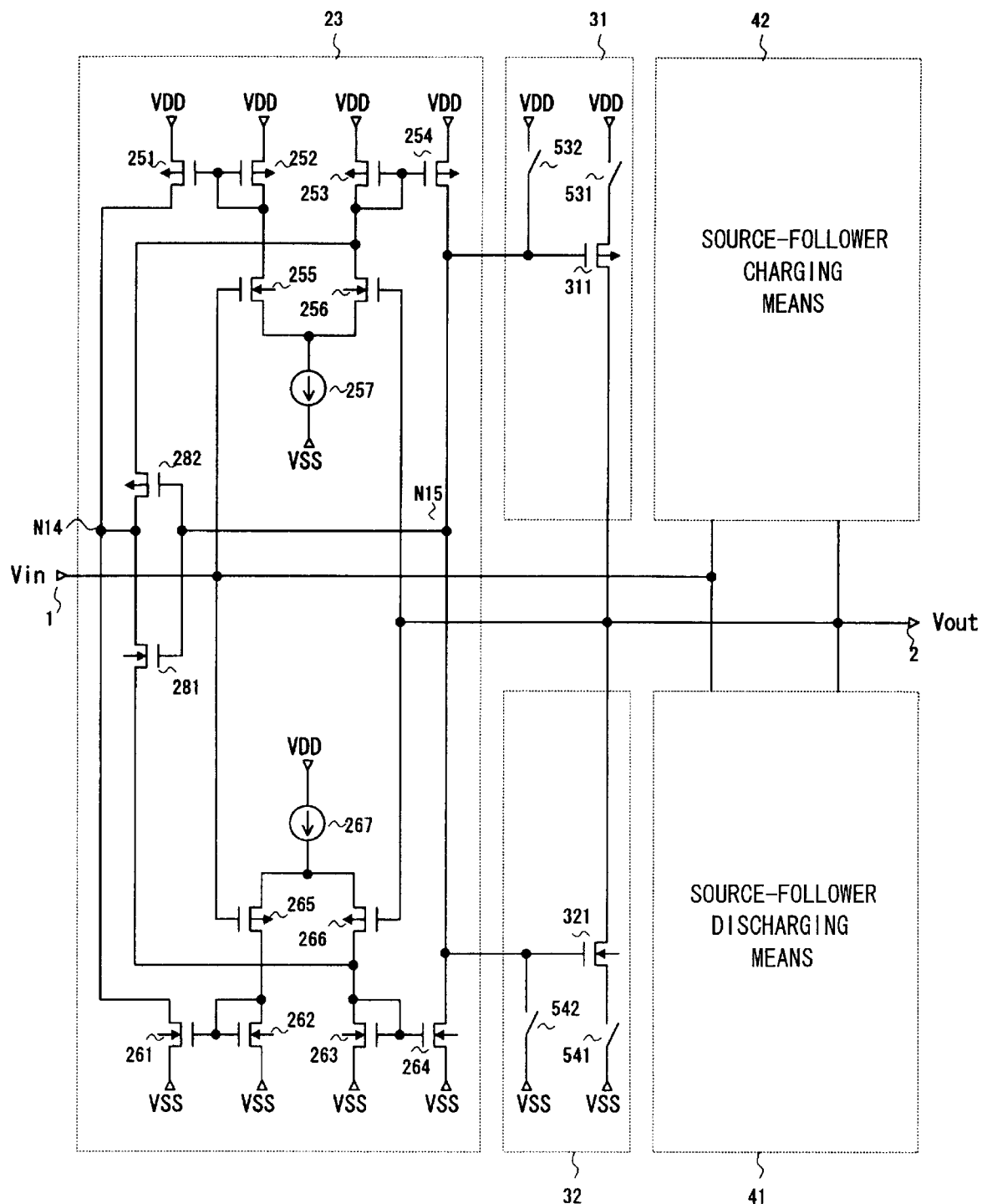
FIG. 23 is a diagram showing a modification of FIG. 22.

FIG. 23 is a diagram illustrating a modification of FIG. 22. This circuit arrangement is applicable to that of FIG. 21 as well.

As shown in FIG. 23, there are provided a switch 532 that places the transistor 311 in the OFF state temporarily before the charging means 31 starts the charging operation, and a switch 542 that places the transistor 321 in the OFF state temporarily before the discharging means 32 starts the discharge operation.

The switches 532 and 542 reset the terminal voltage of node N15 when a changeover is made between charge and discharge by switching the switches 531 and 541 between ON and OFF, and prevent unnecessary voltage fluctuation of the output voltage Vout when a changeover is made between charge and discharge.

As the output voltage Vout approaches the input voltage Vin, the terminal voltage at node N15 of the differential stage 23 rises to and stabilizes as a voltage level at which the gate-source voltage of the transistor 311 is in the vicinity of the threshold-value voltage at the time of charging. At discharge time, the terminal voltage at node N15 of the differential stage 23 falls to and stabilizes at a voltage level at which the gate-source voltage of the transistor 321 is in the vicinity of the threshold-value voltage.

As a consequence, in a case where the switches 532 and 542 are not provided, the operation of the transistor 311 starts from the state of a strong charging action when a changeover is made from discharge to charge, and the operation of the transistor 321 starts from the state of a strong discharging action when a changeover is made from charge to discharge. As a result, there is the possibility that when a changeover is made between charging and discharging, charging or discharging will occur instantaneously without relation to the input voltage Vin, thereby resulting in fluctuation of the output voltage Vout.

Accordingly, the switches 532 and 542 are provided and, when a changeover is made from discharging to charging, control is carried out in such a manner that the switch 532 is placed in the ON state for a short period of time after the switch 541 turns off, thereby pulling the terminal voltage of the node N15 up to the higher-potential side power supply voltage VDD. As a result, when the switch 531 turns on and charging starts, the transistor 311 can be made to start operation from the OFF state.

When a changeover is made from charging to discharging, control is carried out in such a manner that the switch 542 is placed in the ON state for a short period of time after the switch 531 turns off, thereby pulling the terminal voltage of the node N15 down to the lower-potential side power supply voltage VSS. As a result, when the switch 541 turns on and discharging starts, the transistor 321 can be made to start operation from the OFF state.

By thus providing the switches 532 and 542, it is possible to prevent the output voltage Vout from fluctuating without relation to the input voltage Vin when a changeover is made between charging and discharging.

Figure 24:
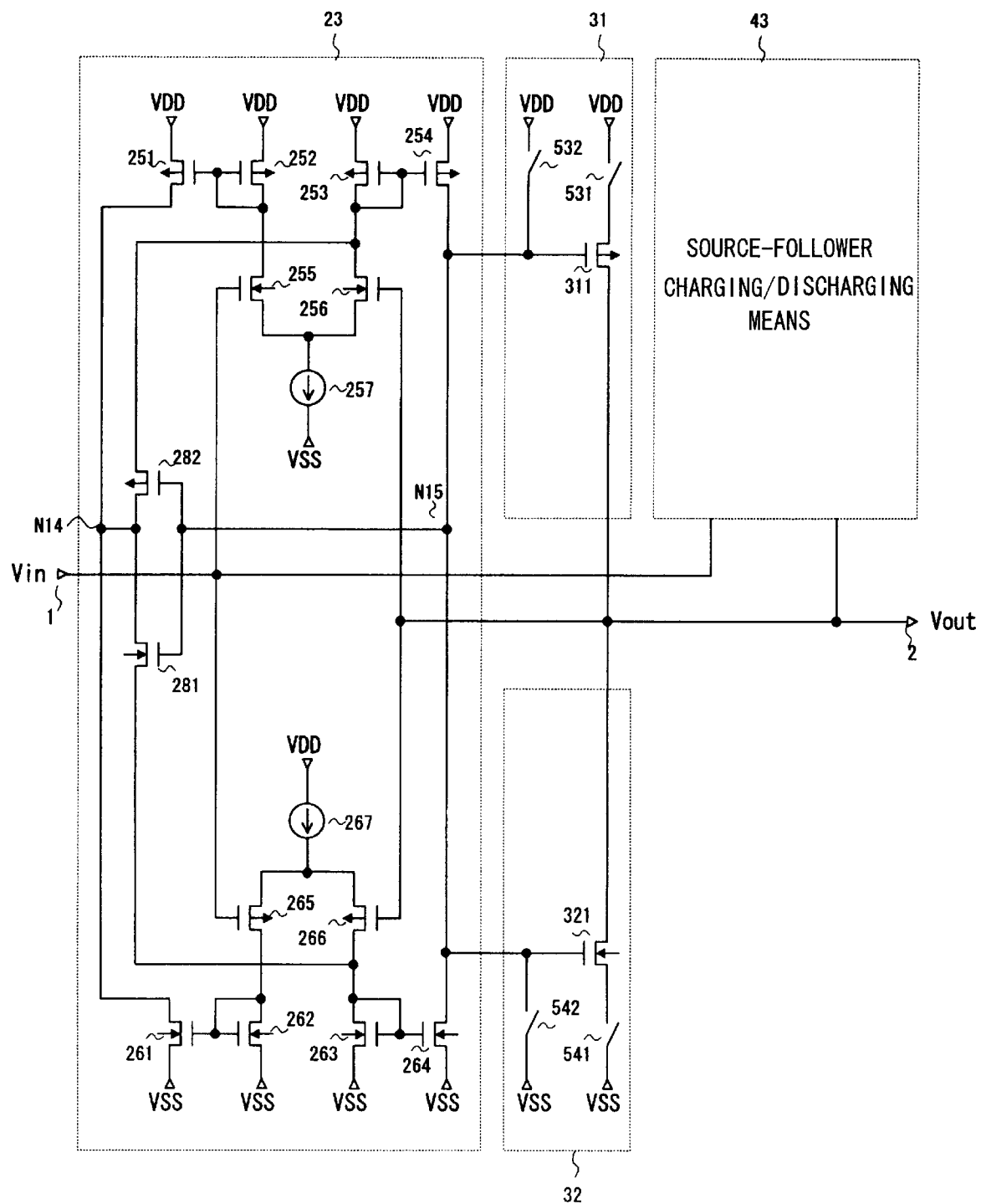
FIG. 24 is a diagram showing a specific example of FIG. 20.

FIG. 24 is a diagram showing a specific example of the circuit illustrated in FIG. 20.

As shown in FIG. 24, this circuit is obtained by substituting the source-follower charging/discharging means 43 for the source-follower discharging means 41 and source-follower charging means 42 of FIG. 23. This arrangement in which the source-follower charging/discharging means 43 is substituted for the source-follower discharging means 41 and source-follower charging means 42 is applicable also to the circuits shown in FIGS. 21, 22 and 23.

Figure 25:
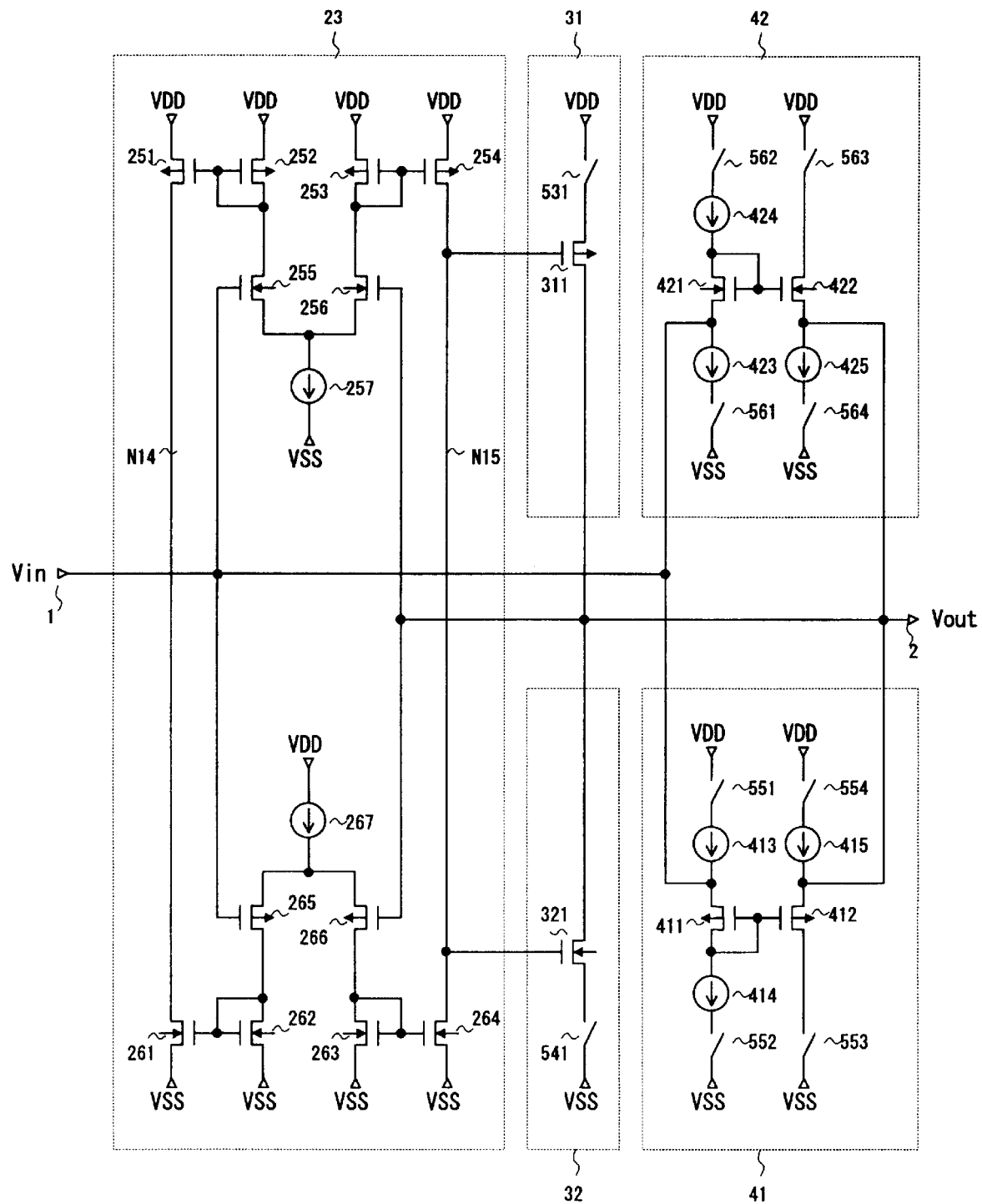
FIG. 25 is a diagram showing a specific example of source-follower discharging means and source-follower charging means of FIG. 21.

FIG. 25 is a diagram showing a specific example of the structures of the source-follower discharging means 41 and source-follower charging means 42 in FIG. 21.

As shown in FIG. 25, the source-follower discharging means 41 and source-follower charging means 42 have circuit arrangements identical with those shown in FIG. 17 and it is so arranged that almost no drain current of the transistor 311 in charging means 31 and of the transistor 321 in discharging means 32 flows when output stability is attained at Vout=Vin.

Figure 26:
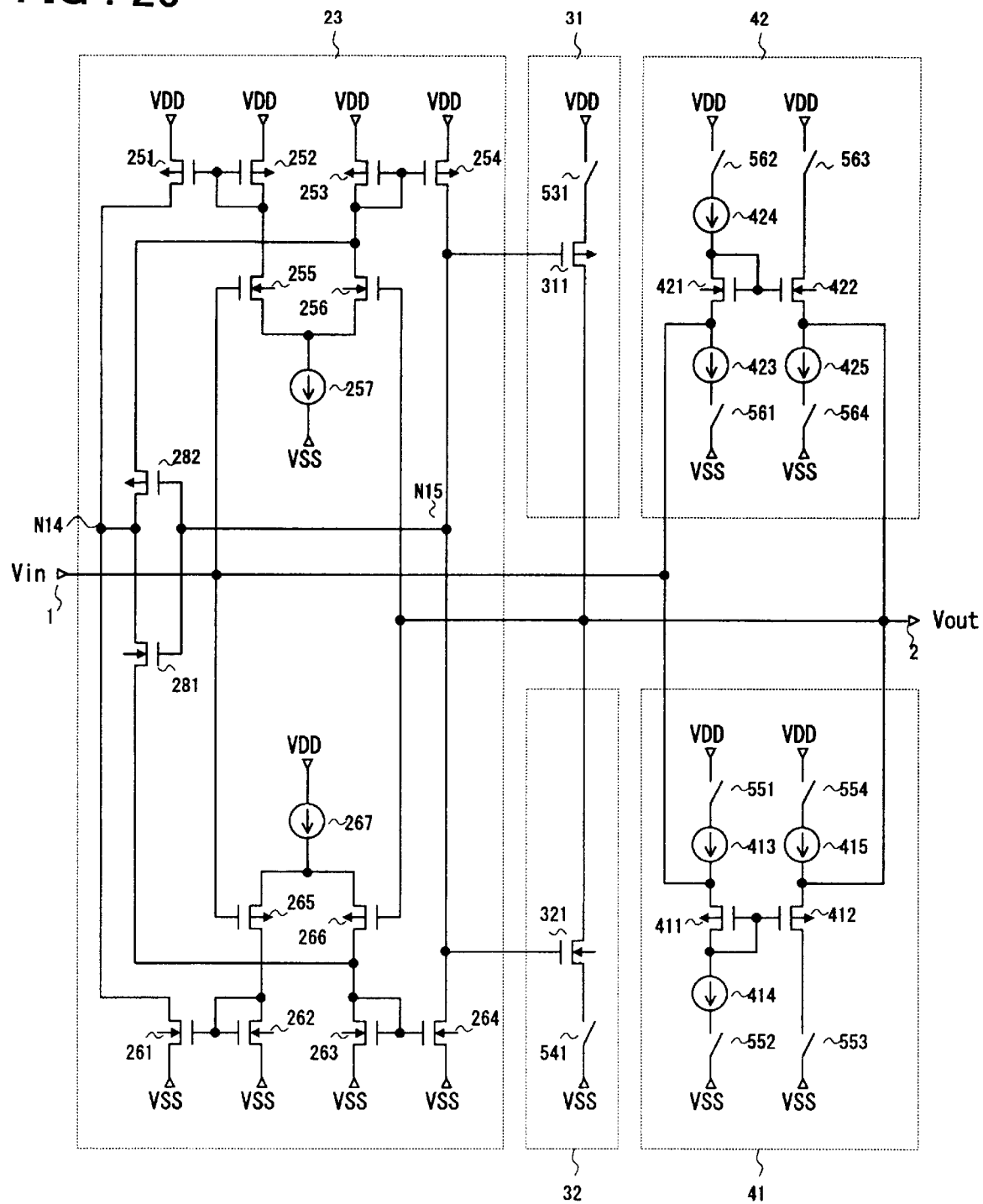
FIG. 26 is a diagram showing a specific example of source-follower discharging means and source-follower charging means of FIG. 22.

FIG. 26 is a diagram showing a specific example of the structures of the source-follower discharging means 41 and source-follower charging means 42 shown in FIG. 22.

As shown in FIG. 26, the source-follower discharging means 41 and source-follower charging means 42 have circuit arrangements identical with those shown in FIG. 17. Operation of this arrangement has already been described with reference to FIG. 17 and need not be described again.

Figure 27:
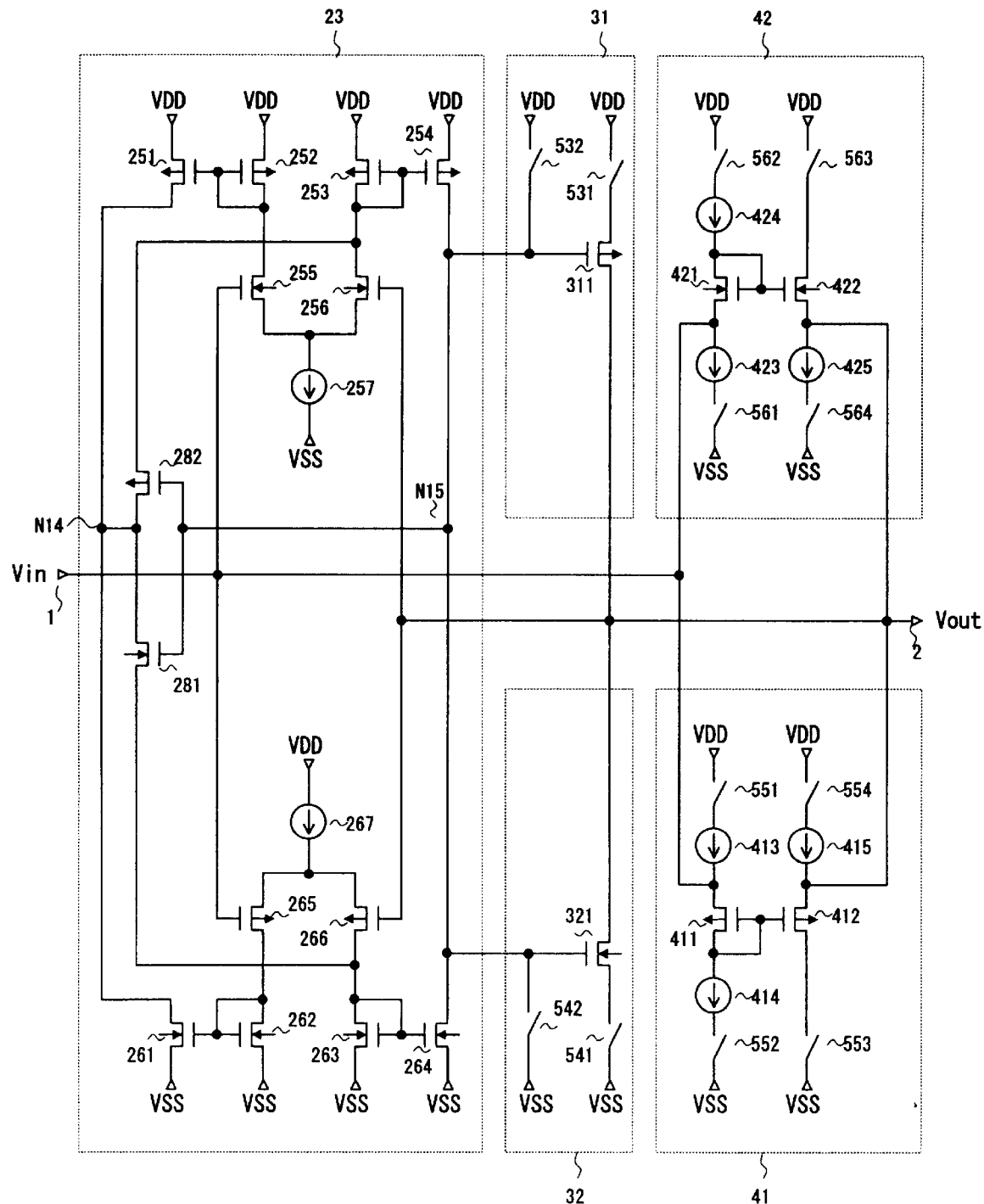
FIG. 27 is a diagram showing a specific example of source-follower discharging means and source-follower charging means of FIG. 23.

FIG. 27 is a diagram showing a specific example of the structures the source-follower discharging means 41 and source-follower charging means 42 in FIG. 23. As shown in FIG. 27, the source-follower discharging means 41 and source-follower charging means 42 have circuit arrangements identical with those shown in FIG. 17. Operation of this arrangement has already been described with reference to FIG. 17 and need not be described again.

Figure 28:
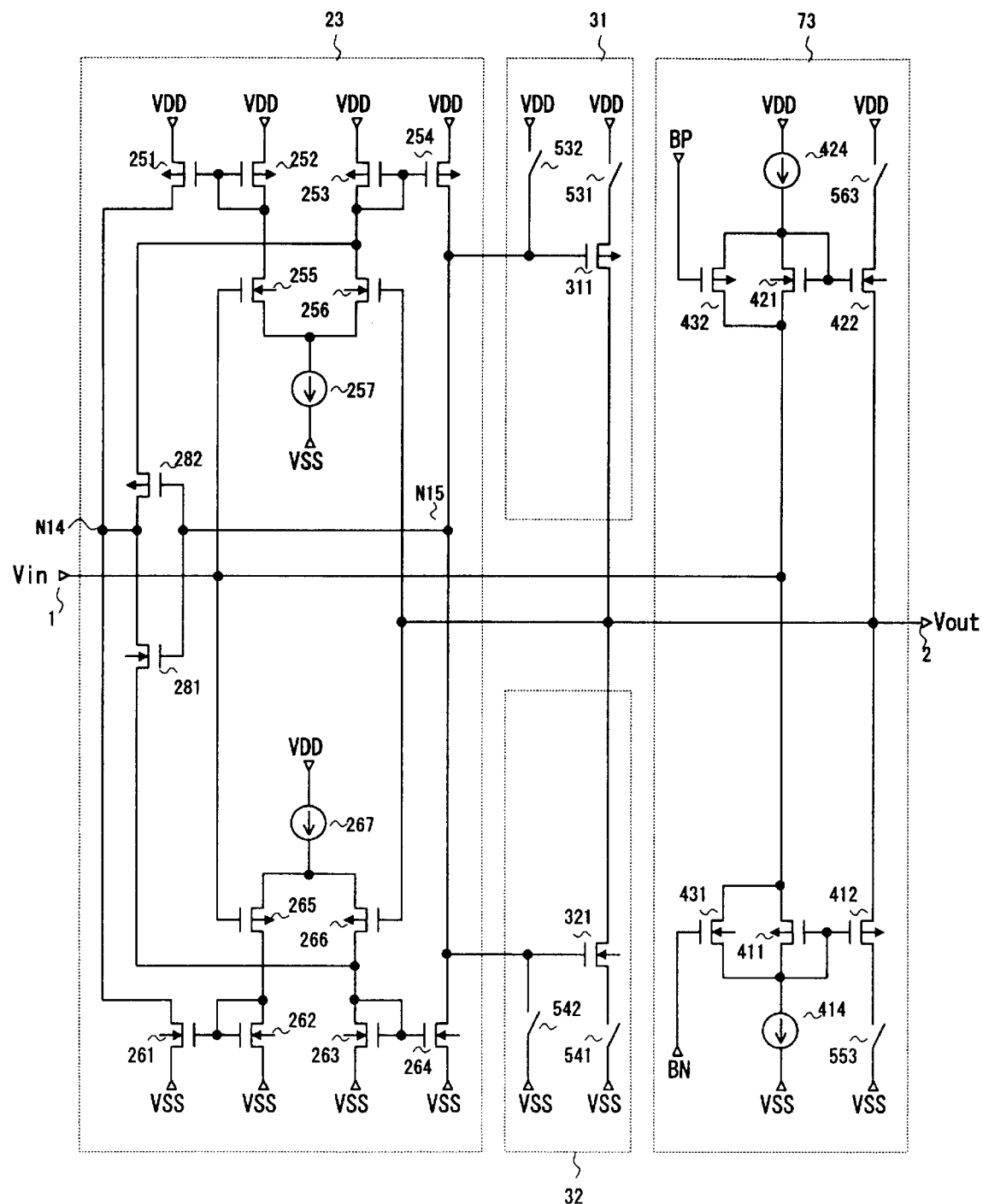
FIG. 28 is a diagram showing a specific example of source-follower charging/discharging means of FIG. 24.

FIG. 28 is a diagram illustrating a specific example of the source-follower charging/discharging means 43 of FIG. 24. The source-follower charging/discharging means 43 has a structure identical with that shown in FIG. 18. Operation of this arrangement has already been described with reference to FIG. 18 and need not be described again.

Figure 29:
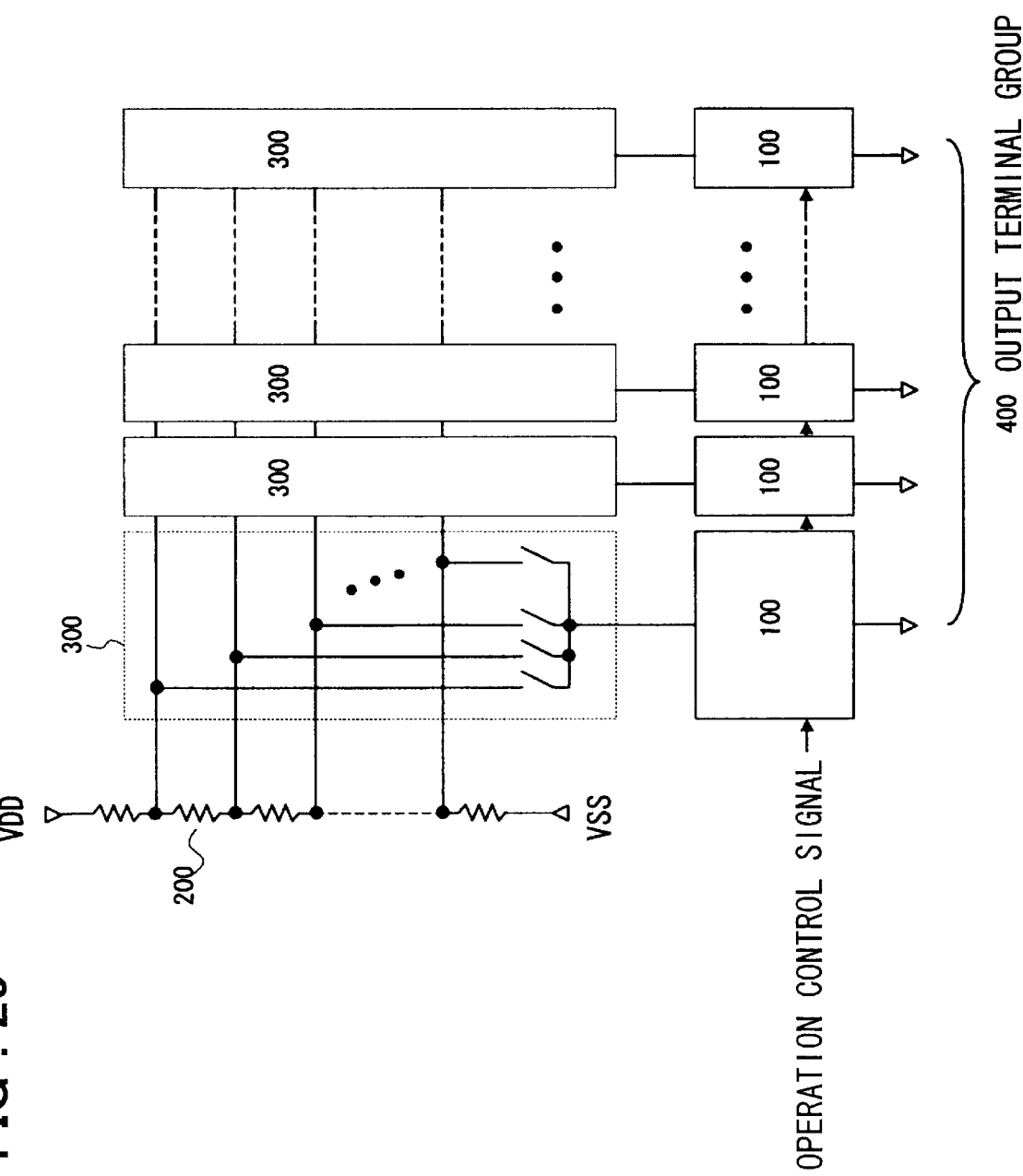
FIG. 29 is a diagram showing the specific structure in a case where a driver circuit in accordance with FIGS. 1 to 28 is used as the buffer of a data driver for a liquid crystal display device.

FIG. 29 is a diagram showing a specific example in a case where driver circuits shown in FIGS. 1 to 28 are used as the buffers 100 of a data driver for a liquid crystal display device.

As shown in FIG. 29, this driver is comprised of a resistor string 200 connected between the higher-potential side power supply VDD and lower-potential side power supply VSS, decoders (selector circuits) 300, an output-terminal group 400 and an output stage 100.

From a plurality of gray-scale voltages produced from the terminals (taps) of the resistor string 200, gray-scale voltages are selected by the decoders 300 on a per-output basis in accordance with a video digital signal, and the selected signals are amplified by the buffers 100 to drive data lines connected to the output terminals 400. Circuits of the embodiments described above with reference to FIGS. 1 to 28 can be applied as the buffer 100.

Figure 30:
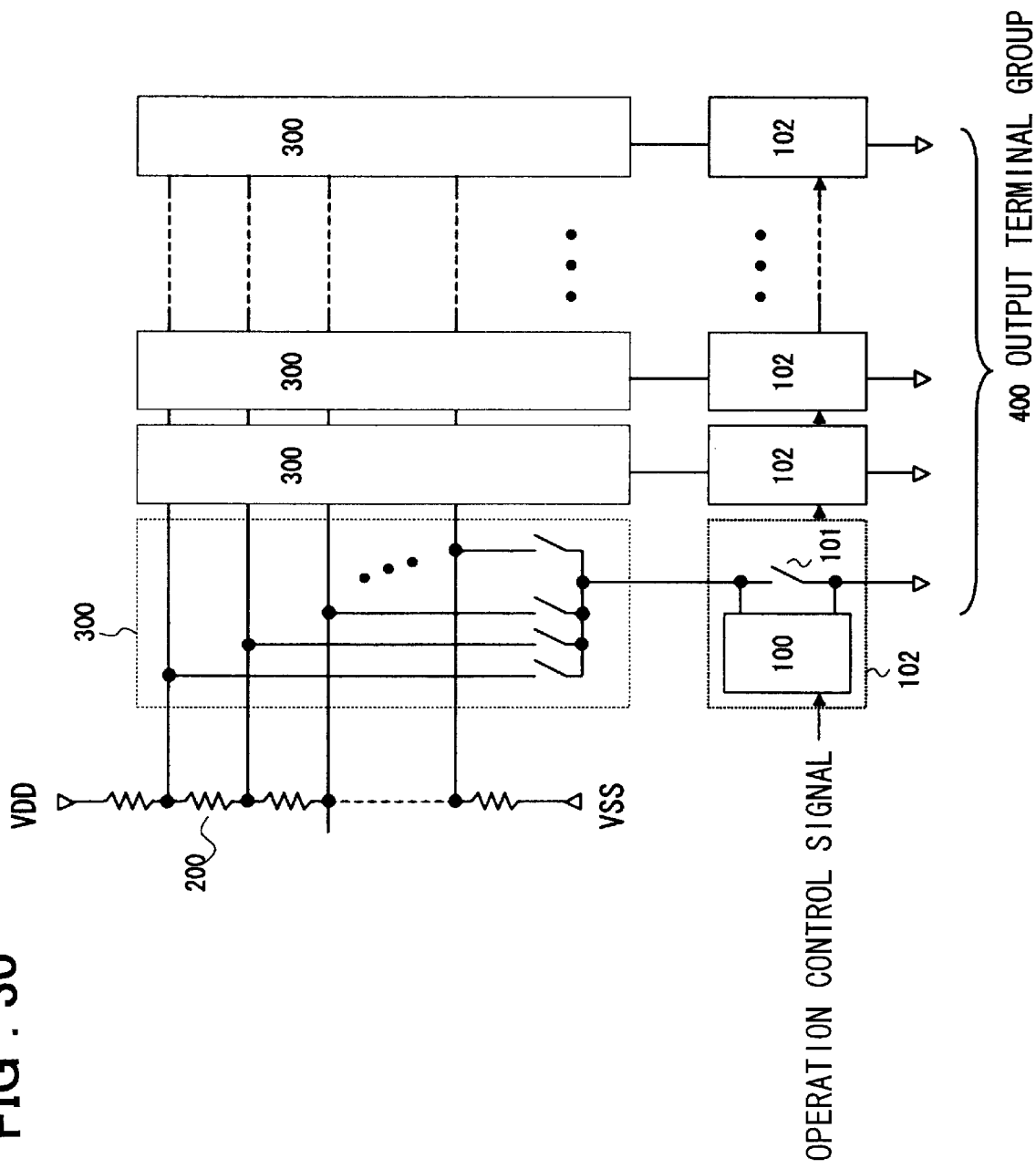
FIG. 30 is a diagram showing a modification of FIG. 29.

FIG. 30 shows a modification in which, when the characteristics of the elements in a buffer 100 exhibit a large variance in FIG. 29, the operation of the buffer 100 is halted and a switch 101 is turned on after drive to the vicinity of the desired voltage is achieved at high speed by the buffer 100, thereby supplying electric charge directly from the resistor string 200 to drive the data lines.

FIG. 31 is a diagram showing a specific example of an operation control method in a case where the driver circuit is used in the buffer of the data driver of a liquid crystal display device in the arrangements of FIGS. 14 to 28 in which drive is performed by switching between high-speed charging and high-speed discharging. High-speed drive is possible with regard to any driving voltage.

The high-speed charging and high-speed discharging operations are carried out by the operation of the charging means 31 and discharging means 32. When at least one is operating in each of the arrangements of FIGS. 14 to 28, operation of the other must be halted.

FIG. 31 illustrates a specific example of a method of controlling the charging means 31 and discharging means 32 with regard to gray-scale levels of a liquid crystal display.

It is assumed that the differential stages 21, 22, and 23, source-follower discharging means 41, source-follower charging means 42 and source-follower charging/discharging means 43 of FIGS. 14 to 28 are each controlled in conformity with control of the charging means 31 and discharging means 32. Since drive by the source-follower operation is such that driving speed declines particularly when a large-capacitance load is to be driven, it is necessary that control be carried out in such a manner that the charging means 31 and discharging means 32 operate at all times in order to achieve high-speed drive.

FIG. 31 shows a drive method for a case where higher- and lower-potential levels are output alternately in a data selection time period over which gray-scale levels are output to a data line continuously. This method is applicable in a case where dot-reversal drive is carried out in a liquid crystal display device.

The higher- and lower-levels of a plurality of gray-scale levels can be discriminated by a polarity-reversal signal which designates the positive or negative polarity of the driving voltage with respect to a fixed common voltage. If the higher level has been designated, the charging means 31 is caused to operate to thereby perform high-speed charging and drive the gray-scale voltage. If the low level has been designated, the discharging means 32 is caused to operate to thereby perform high-speed discharging and drive the gray-scale voltage. This makes it possible to realize high-speed drive in the driving of any gray-scale voltage.

It should be noted that the source-follower discharging means 41, source-follower charging means 42 and source-follower charging/discharging means 43 suppress overshoot and undershoot and act to stabilize the output voltage at high speed in each of the above arrangements.

Further, with an arrangement having the pre-charging means of output terminal 2, as in the arrangement shown in FIG. 16, the control method of FIG. 31 can be applied also in a case where common-reversal drive is performed in a liquid crystal display device.

In this case, pre-charging to an intermediate gray-scale level of a plurality of gray-scale levels is performed by the pre-charging means. The higher and lower levels at this time can be discriminated by a higher-order bit signal and polarity-reversal signal of a video digital signal that takes on different values about the central gray-scale as a boundary.

In one data selection time interval, a data line that has been pre-charged to an intermediate gray-scale level is driven by the control method of FIG. 31, thereby making it possible to realize high-speed drive in the driving of any gray-scale voltage.

FIG. 32 is a table illustrating a modification of FIG. 31. FIG. 32 shows a drive method in a case where high and low levels are output at will in a data selection time period over which gray-scale levels are output to a data line continuously. This method is applicable in a case where common-reversal drive is carried out in a liquid crystal display device.

In common-reversal drive, fluctuation of common voltage is accompanied by fluctuation of data-line voltage via a capacitance within one data selection time period except in a case where pre-charging to the prescribed voltage is carried out. As a result, charging or discharging is not uniquely decided at the start of one data election time period.

Accordingly, one data selection time period is divided into a first-half period t0–t1 and a second-half period t1–t2. In a case where the gray-scale voltage of the high level is driven, the discharging means 32 is made to operate in the first-half period t0–t1 and the charging means 31 is made to operate in the second-half period t1–t2.

Similarly, in a case where the gray-scale voltage of the lower level is driven, the charging means 31 is made to operate in the first-half period t0–t1 and the discharging means 32 is made to operate in the second-half period t1–t2. The first-half period t0–t1 is a period of time needed for at least the common voltage to stabilize.

The higher and lower levels can be discriminated by a plurality of higher-order bit signal and the polarity-reversal signal of a video digital signal. In simplest form, use is made of the most significant bit, which takes on different values about the central gray-scale as a boundary. By virtue of this method, it is possible to realize high-speed drive in the driving of any gray-scale voltage even in a case where data-line voltage fluctuates owning to fluctuation of the common voltage.

In the foregoing embodiments, the invention is described taking MOS transistors as an example. However, it goes without saying that the invention is applicable also to a driver circuit (buffer circuit) constructed by bipolar transistors, in which the circuit is constructed by combining voltage-follower feedback-type charging (discharging) means, which does not have a phase compensating capacitor, and emitter-follower discharging (charging) means.

In a case where the present invention is applied to an operational amplifier used as a voltage follower, consumption of power is reduced because it is unnecessary to use a phase compensating capacitor for preventing oscillation. A voltage follower, which is a non-inverting amplifier having an amplification of 1, inputs an input signal to the non-inverting input terminal of an operational amplifier, feeds the output signal back to an inverting input terminal and outputs a signal having a voltage of the same phase as that of the input signal. In a case where an operational amplifier is used as a voltage follower, it is necessary to maximize the capacitance value of the phase compensating capacitor. A slew-rate, however, declines. The present invention, however, raises the slew-rate without requiring use of a phase compensating capacitor and, moreover, makes it possible to deal with an input voltage having a large amplitude. The circuit includes, in addition to the differential stage of the operational amplifier, charging means (31 in FIG. 3A) for charging an output terminal based upon a difference voltage between the input signal and output signal, and source-follower discharging means (41 in FIG. 3A) having bias control means (51 in FIG. 3A) for controlling output bias voltage based upon the input signal and a source-follower transistor (412 in FIG. 3A) inserted into the discharge path of the output terminal (2 in FIG. 3A) of the operational amplifier and having the bias voltage, which is output from the bias control means (51 in FIG. 3A), applied thereto as an input. Further provided are discharging means (32 in FIG. 6A) for discharging the output terminal based upon a difference voltage between the input signal and output signal, and source-follower charging means (42 in FIG. 6A) having bias control means (52 in FIG. 6A) for controlling output bias voltage based upon the input signal and a source-follower transistor (422 in FIG. 6A) inserted into the charging path of the output terminal (2 in FIG. 6A) and having the bias voltage, which is output from the bias control means (52 in FIG. 6A), applied thereto as an input. The feedback-type charging means (11) and the feedback-type discharging means (12) or the charging means (31) and discharging means (32) are controlled by switches, which are turned on and off by an operation control signal, in such a manner that when one of these means is activated, the other is deactivated, as illustrated in FIGS. 14 and 19, etc. The same holds true with regard to the source-follower discharging means (41) and source-follower charging means (42). It should be noted that these circuits may all be incorporated within an operational amplifier. Aside from this, the differential stage may be constructed by an operational amplifier, and the charging means (31), discharging means (32) and source-follower discharging means (41), source-follower charging means (42) may be implemented by external circuits.

Thus, in the present invention as described above, if the follower-type discharging means (41 in FIG. 1) is combined with feedback-type charging means (11 in FIG. 1) equipped with a differential stage (21 in FIG. 1) and configured as a voltage follower, it is unnecessary to provide a phase compensating capacitor. As a result, this arrangement is ideal for reducing power consumption, raising speed and diminishing the scale of the circuitry. However, application of the follower-type discharging means (41 in FIG. 1) is not limited solely to a feedback-type amplifier circuit having such a differential construction. For example, in a case where the above-described follower-type discharging means (41 in FIG. 1) has been connected to the output terminal of a buffer circuit (which can be a buffer circuit that does not have a differential-input-type construction) for driving an output terminal upon receiving an input signal from an input terminal, the effect obtained is suppression of ringing of the output terminal and stabilization of the output signal at high speed. Similarly, in a case where the follower-type charging means (42 in FIG. 2) has been connected to the output terminal of the buffer circuit, the output signal is stabilized at high speed. It goes without saying that the follower-type discharging means (41 in FIG. 1) and follower-type charging means (42 in FIG. 2) may be connected to the output terminal of the buffer circuit. The follower-type discharging means and follower-type charging means employ the circuit arrangements of FIGS. 3 and 6, etc., as is.

One additional remark with regard to the description in the paragraph [0133] is that the transistors 431 and 432 of FIG. 18 may be replaced by switches which perform the same control as that of on and off of switches 563 and 553.

Figure 46:
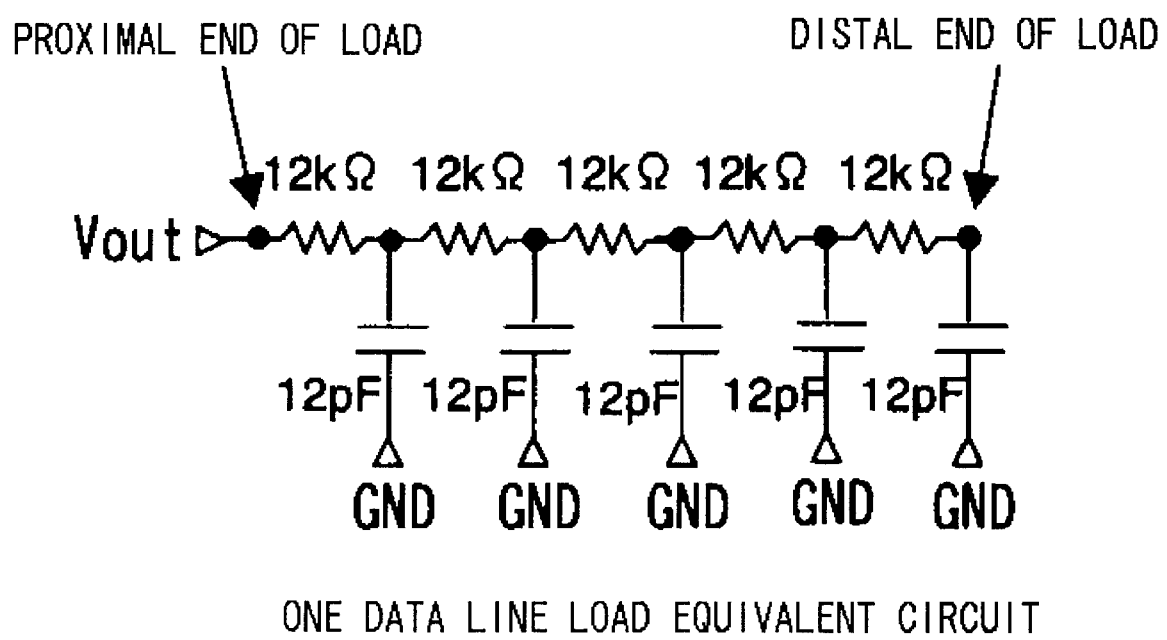
FIG. 46 shows an equivalent circuit of a large capacitance load used for an performance evaluation of the driver circuit of the embodiment of the present invention.

The some effect of the present invention is explained based on simulation results. In this simulation, evaluation was made of a large capacitance wiring load (load on one data line, 60 kΩ, 60 pF), such as data line of a display panel shown in FIG. 46, in order to show the low power performance and high speed performance of the driver circuit of the present invention. Referring to FIG. 46, the large capacitance wiring load is configured as an equivalent circuit comprised of five-stage integrating circuits connected in a cascaded manner, each made up of a resistor and a capacitor. An output terminal Vout of the driver circuit is connected in the proximal end of the load. The driver circuit shown in FIG. 15 is employed for the simulation. As for the power supply voltage, the higher potential side power supply voltage VDD is 7V, while the lower potential side power supply voltage VSS is 0V.

Figure 36:
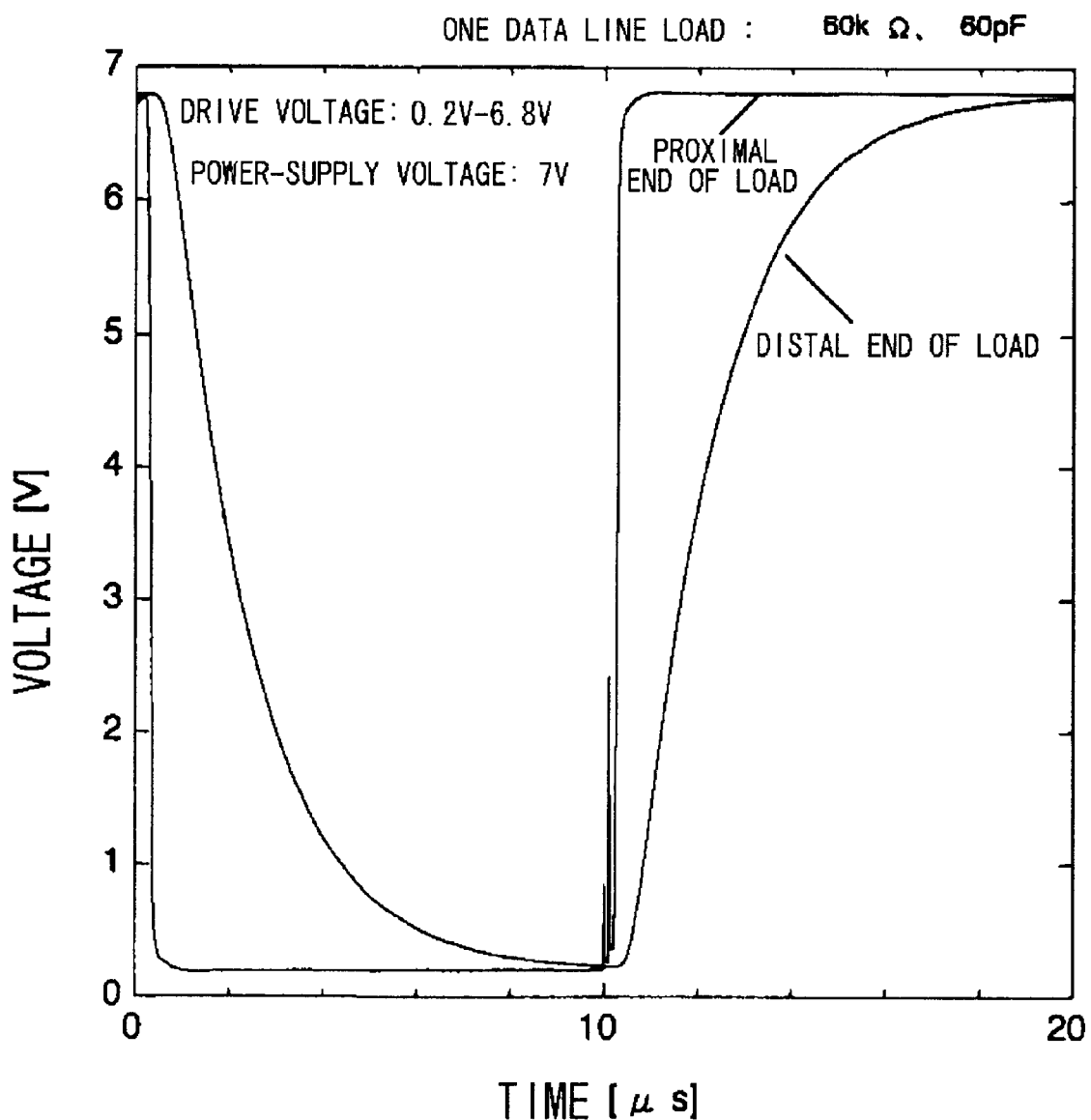
FIG. 36 shows output voltage waveforms of the proximal and distal ends of the load for the driving voltage of 0.2 V to 6.8 V corresponding to the maximum amplitude in the driver circuit shown in FIG. 15.

FIG. 36 shows output voltage waveforms of the proximal and distal ends of the load for the driving voltage of 0.2V to 6.8V corresponding to the maximum amplitude. FIG. 37 shows the output delay time for this case. The output delay time is the time needed for 3τ (change by 95%) of the amplitude voltage. The τ is a time constant of the CR circuits and t=3τ is 0.95(95% of the whole amplitude) in a pulse response curve of the exponential function 1-exp (-t/τ). As for the output delay time of the proximal end of the load with the driving voltage of 0.2V to 6.8V, rise=0.36 μs, fall=0.42 μs and as for the output delay time of the distal end of the load, rise=5.83 μs, fall=5.88 μs.

The load driving speed of the driver circuit may be evaluated based on the speed of voltage changes at the proximal end of the load.

From FIG. 37, the rate of voltage changes in the proximal end of the load is not more 0.5 μs for both the rise time (charging) and the fall time (discharging), thus testifying the high speed performance of the driver circuit according to the embodiment of the present invention.

Figure 38:
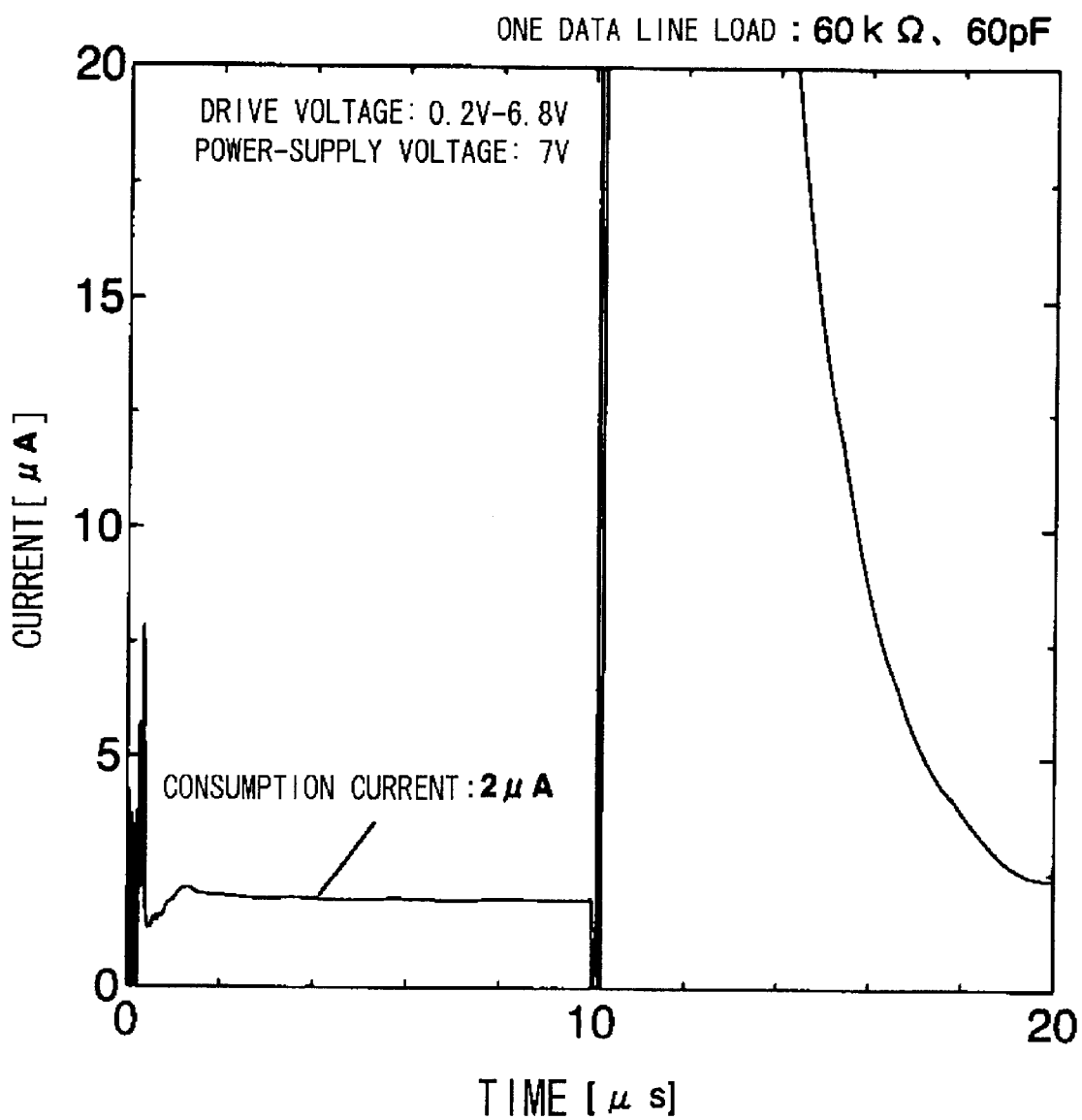
FIG. 38 shows change of the consumption current of the higher-potential side power supply VDD of the driver circuit in FIG. 36.

FIG. 38 shows changes in consumption current of the higher potential side power supply VDD of the driver circuit in the driving condition of FIG. 36. In FIG. 38, the current consumed during time 0 μs to 10 μs indicates static consumption current necessary to keep up the operation of the driver circuit, while that during time 10 μs to 20 μs indicates the dynamic consumption current corresponding to the static consumption current plus the charging current of the load capacitance. With a conventional feed-back type amplifier circuit equipped with a phase compensation capacitor, a static consumption current of an order of several tens μA is required in order to realise a high speed drive as shown in FIG. 36. As may be seen from FIG. 38, the static consumption current necessary to keep up the operation of the driver circuit in accordance with the embodiment of the present invention is sufficiently small and is approximately 2 μA, thus substantiating the low power performance of the driver circuit of the present invention. Meanwhile, if the load capacitance of the driver circuit according to the embodiment of the present invention is sufficiently smaller than that shown in FIG. 46, the static consumption current necessary to keep up the operation of the driver circuit of the present invention can be suppressed to a still smaller value.

Figure 39:
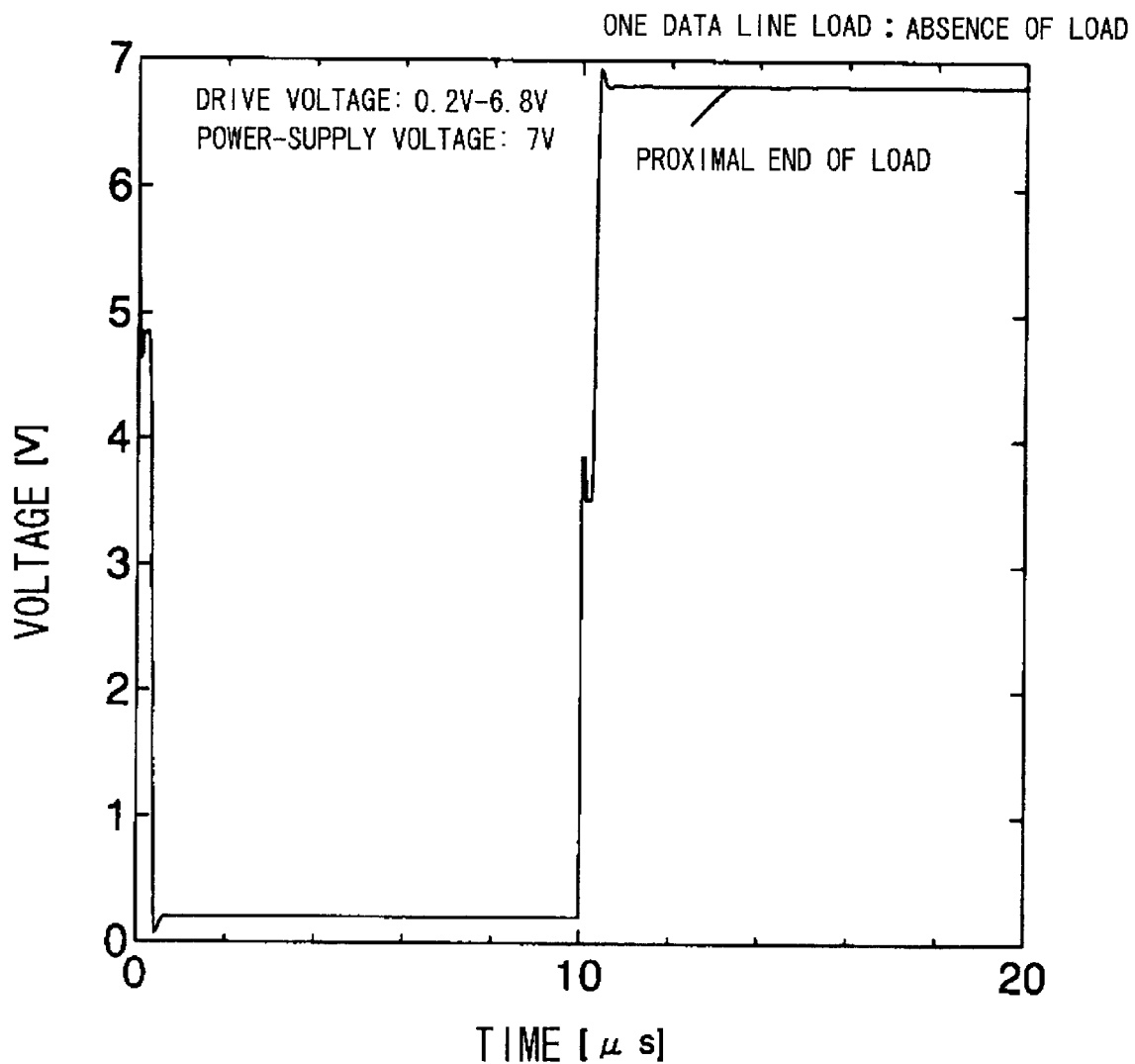
FIG. 39 shows an output waveform with no load.

FIG. 39 shows an output waveform in the absence of a load. It may be seen from FIG. 39 that, in the absence of load, the driver circuit of the present invention is not oscillated by the output stabilizing effect ascribable to the source follower operation, even if the driver circuit of the present invention is not equipped with a phase compensation capacitor. Although the above simulation is the result for a load of the large capacitance, the load can be driven at a sufficiently high speed with the low static consumption current on the order of hundreds of nA (nano-amperes) if the load capacitance is small.

With the driver circuit according to the present invention, low power and high speed driving can be realized from a small capacitance load to the large capacitance load. Each of the driver circuits, shown in FIGS. 16 to 18, explained as embodiments of the present invention, has the performance similar to that of FIG. 15. As compared to the driver circuit shown in FIG. 15, the driver circuits, shown in FIGS. 21 to 28, are complex in the configuration of the differential circuit and are many circuit paths, so that the static consumption current is slightly increased, however, a high speed driving can be achieved with a sufficiently small consumption current by virtue of not providing the phase compensation capacitor.

The peculiar phenomenon taking place in the driver circuit of the present invention when the driver circuit drives the large capacitance load is now explained by referring to the simulation results. The load and power supply voltage conditions are similar to those used in the above simulation.

Figure 40:
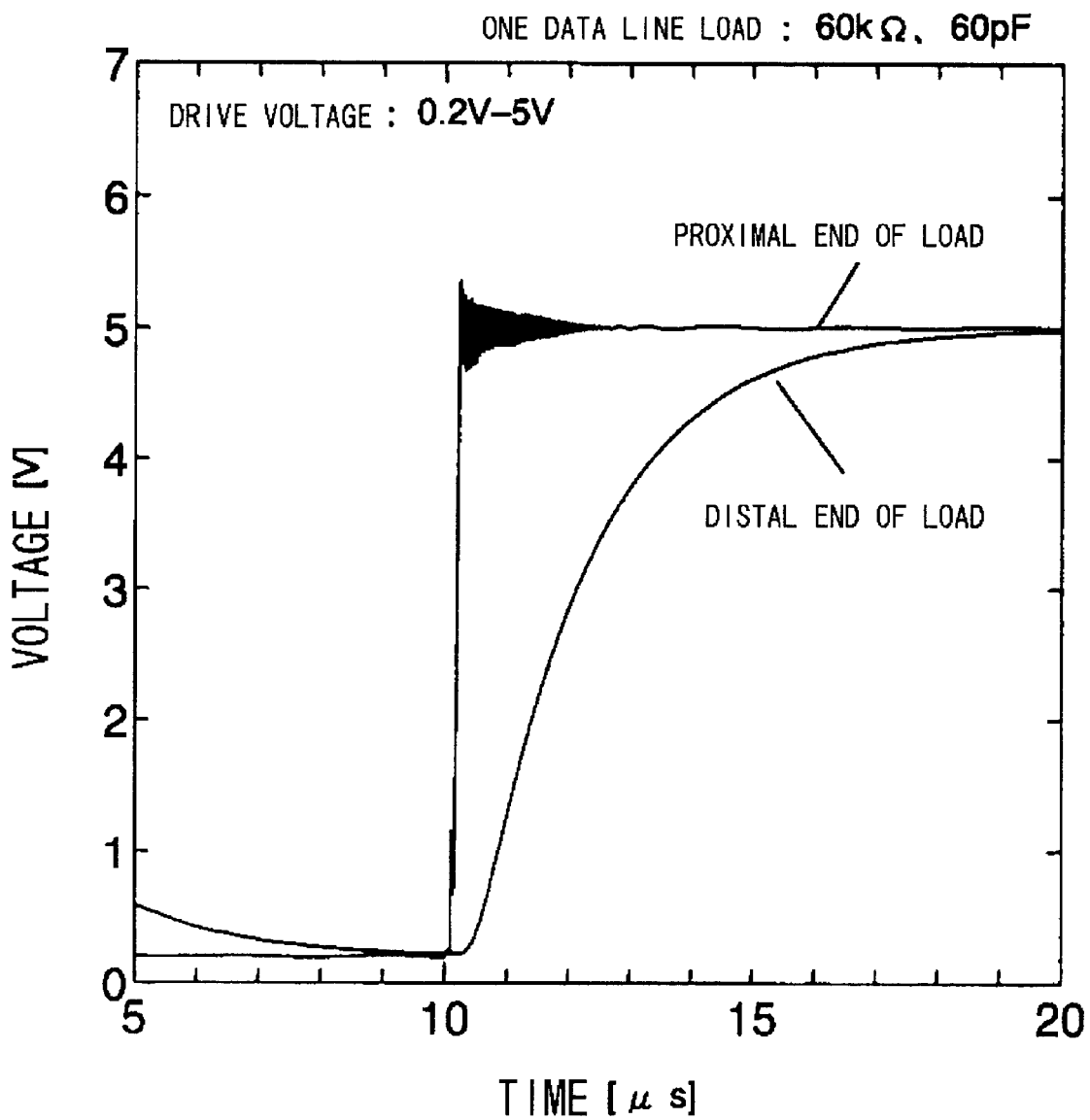
FIG. 40 shown output voltage waveforms in the proximal end of the load in case where a voltage in the vicinity of an intermediate voltage 5V of the power supply voltage is output to the large capacitance load by the driver circuit shown in FIG. 15.
Figure 41:
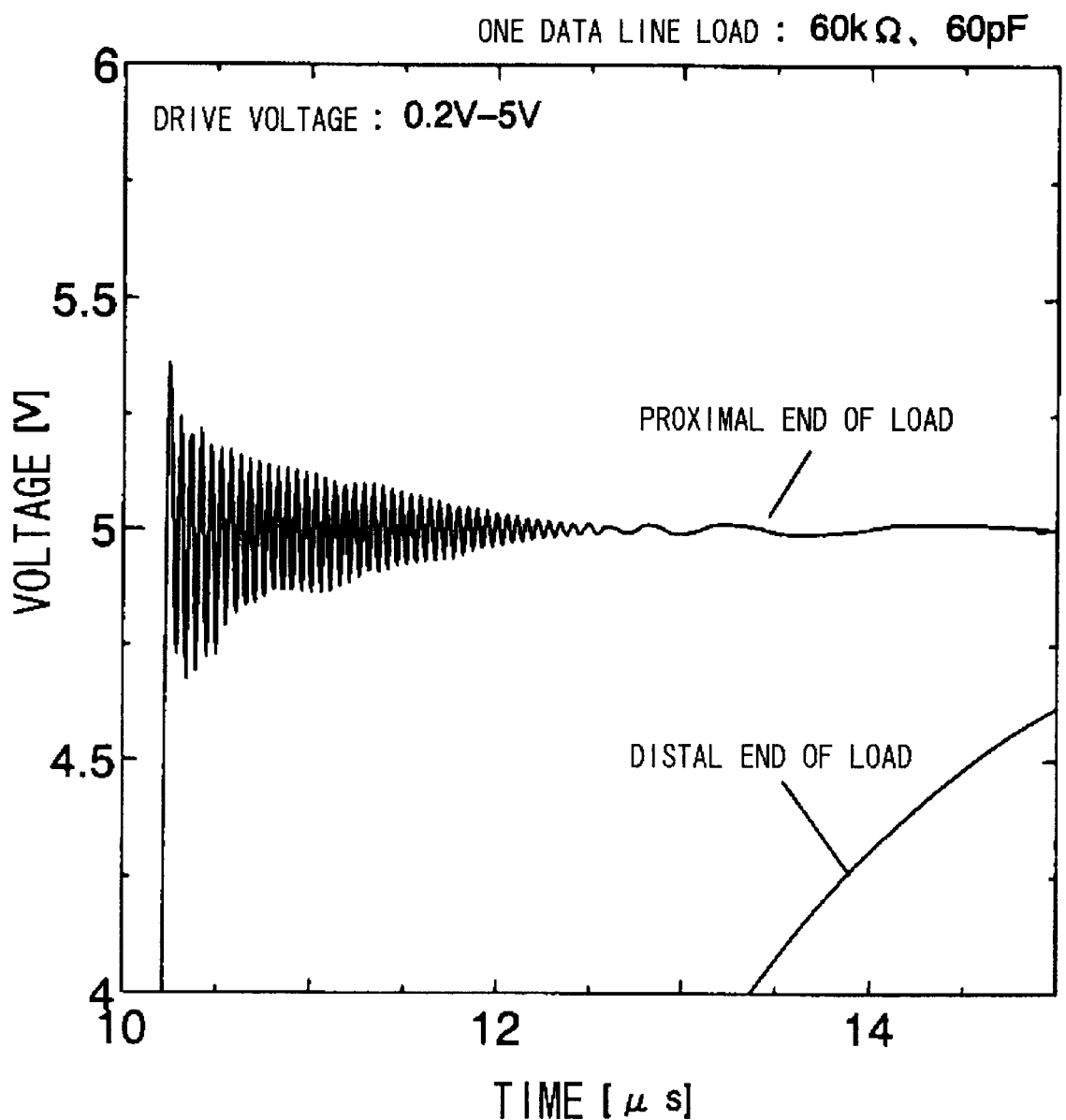
FIG. 41 is an partially enlarged view of FIG. 41.

FIGS. 40 and 41 show output voltage waveforms at the proximal and distal ends of the load in case a voltage of 5V in a mid portion of the range of the power supply voltage is output to the large capacitance wiring load shown in FIG. 46 by the driver circuit of FIG. 15 which is the embodiment of the present invention. FIGS. 40 and 41 are an overall view and an enlarged view. In FIGS. 40 and 41, are shown the state of damped vibration of the voltage in the proximal end of the load directly after the rise, respectively. Though not shown in FIGS. 40 and 41, a damped vibration is generated in the proximal end of the load directly after the fall as is the case with the rise. This phenomenon is peculiar to a large capacitance load, while it is not produced in case wiring load capacitance or wiring resistance is small. This damped vibration is produced by the phenomenon of relaxation of electric charge from the proximal end towards the distal ends of the load and by the high speed driving of the feedback-type charging (discharging) means.

Referring to FIGS. 40 and 41, the large capacitance wiring load is charged speedily as from time of 10 $\mu$s such that the voltage at the proximal end of the load is charged at a time up to the desired driving voltage of 5V. Since the feedback-type response of the driver circuit is subjected to delay, overshoot is produced. Simultaneously, there is produced the operation of suppressing the overshoot to pull down the voltage to a desired driving voltage. If the load capacitance is small, the voltage is quickly stabilized at a desired voltage. However, if, in case of the large capacitance load, the proximal end of the load is charged up to a desired driving voltage, quick follow-up of the distal end of the load is not produced. Thus, the voltage at the proximal end becomes lower than the desired driving voltage (undershoot) due to relaxation of the electric charge from the proximal end to the distal end of the load. This again effects high speed charging by the feedback-type charging (discharging) means. Thus, by high speed repetition of the overshoot by high speed charging and the undershoot by relaxation of the electric charge, vibrations are produced. As the voltage at the distal end of the load approaches to the voltage at the proximal end, the undershoot by relaxation of the electric charge becomes smaller so that oscillation is attenuated and is made stabilized at a desired driving voltage.

In distinction from oscillation, the damped vibration in the proximal end of the load as described above in the large capacitance wiring load driving converges promptly, and hence no practical problems are presumably presented.

Figure 42:
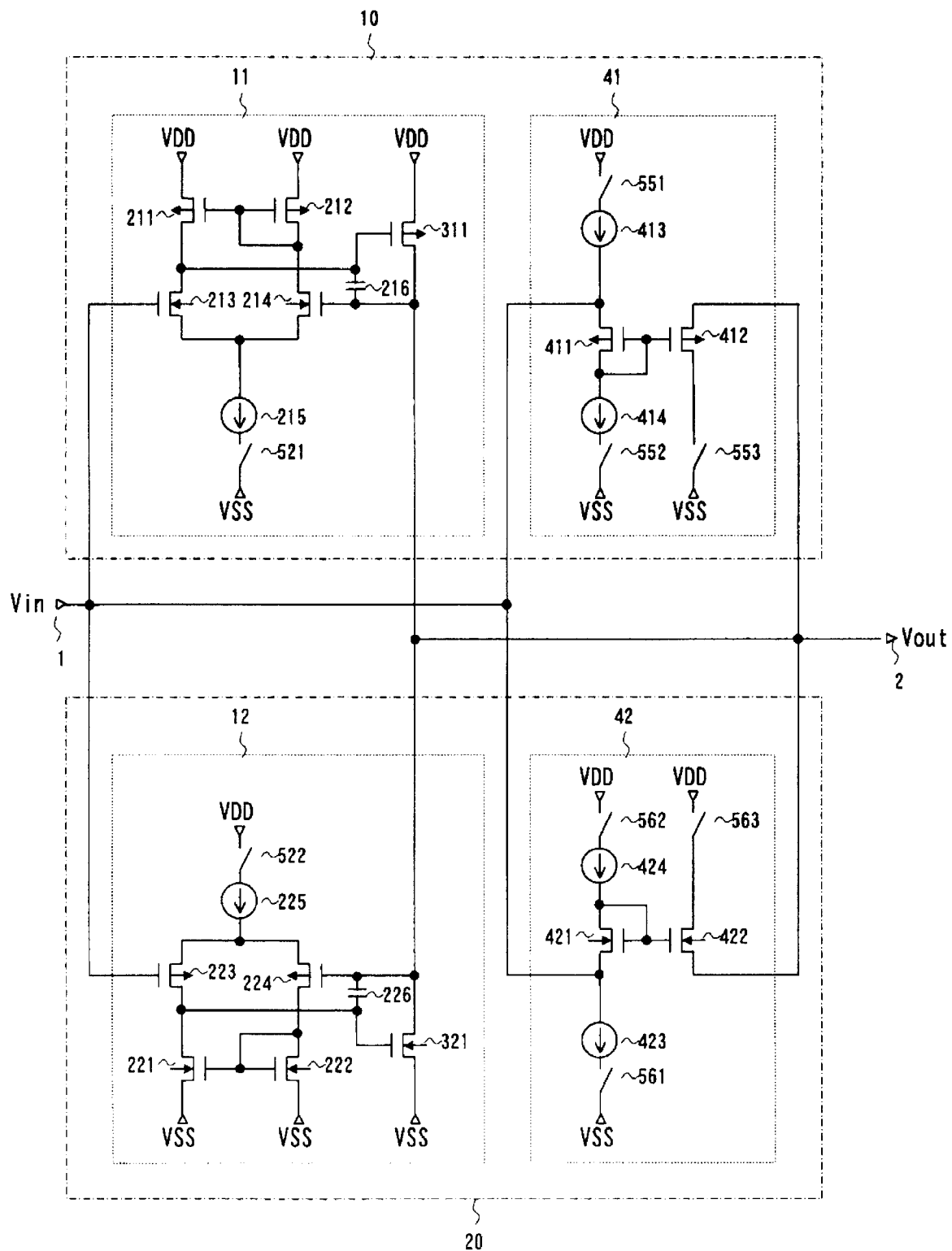
FIG. 42 shows a variation of the embodiment of the present invention (variation of FIG. 15)

However, if desired to achieve a smooth output waveform, a sufficiently small capacitor for suppressing the vibration may be provided within the inside of the driver circuit. FIG. 42 shows a modified embodiment of the present invention. FIG. 42 shows a driver circuit shown in FIG. 15 in which vibration suppressing capacitors 216 and 226, each of 0.1 pF, are provided between outputs of the differential stage (213 and 214) and the differential stage (223 and 224) and the output terminal 2 respectively.

Figure 43:
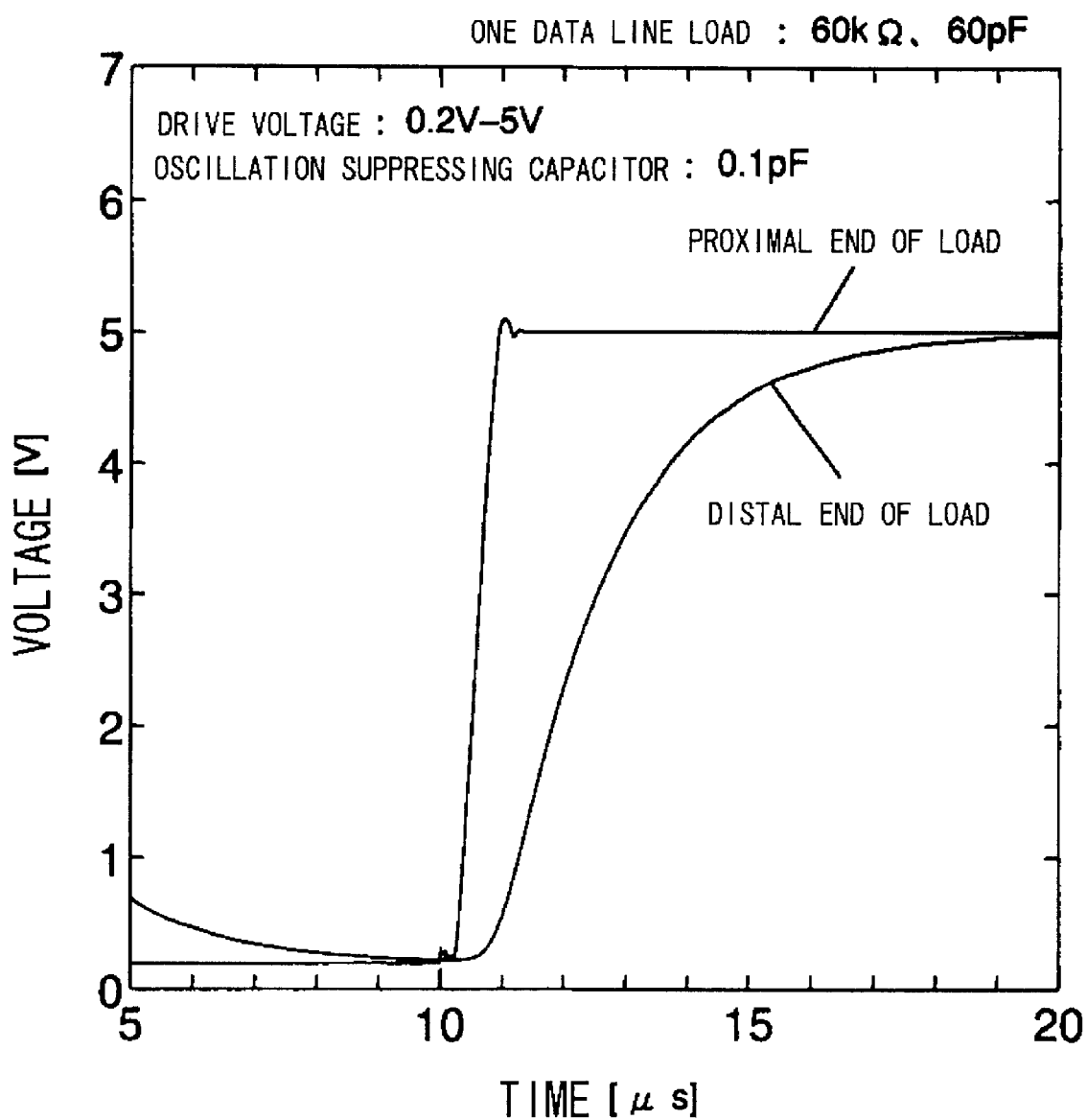
FIG. 43 shown output voltage waveforms in the proximal end of the load in case where a voltage in the vicinity of an intermediate voltage 5 V of the power supply voltage is output to the large capacitance load by the driver circuit shown in FIG. 42.
Figure 44:
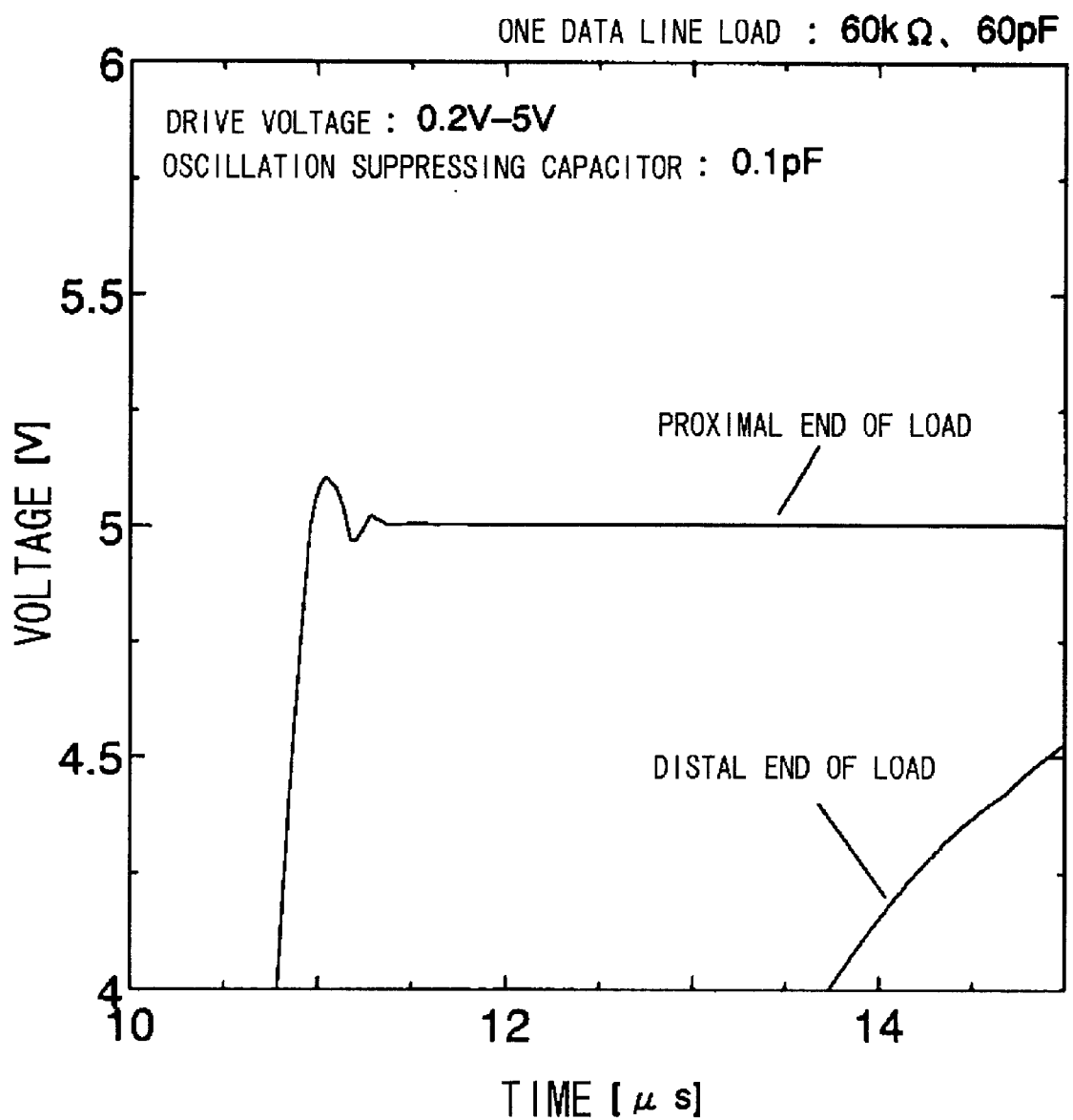
FIG. 44 is an partially enlarged view of FIG. 43.

FIG. 43 shows an output voltage waveform at the proximal end and the distal end of the load in case a voltage of 5V halfway in the power supply voltage range is output to the large capacitance wiring load shown in FIG. 46. FIG. 43 is an overall waveform diagram, whilst FIG. 44 is a partial enlarged view of FIG. 43. It may be seen from FIGS. 43 and 44 that the attenuating vibrations of FIGS. 40 and 41 may be removed by providing a capacitor of approximately 0.1 pF. Since a sufficiently small capacitance value suffices for the vibration suppressing capacitor provided in the driver circuit, the effect on the driver circuit is substantially nil. Moreover, the capacitor can be easily formed using a transistor capacitance.

In the respective driver circuits of FIGS. 16 to 18 and 21 to 28, forming the embodiments of the present invention, a smooth output voltage waveform may be obtained in driving the large capacitance load by annexing a vibration suppressing capacitor across an output of the differential pair and an output terminal, as in FIG. 15.

Figure 45:
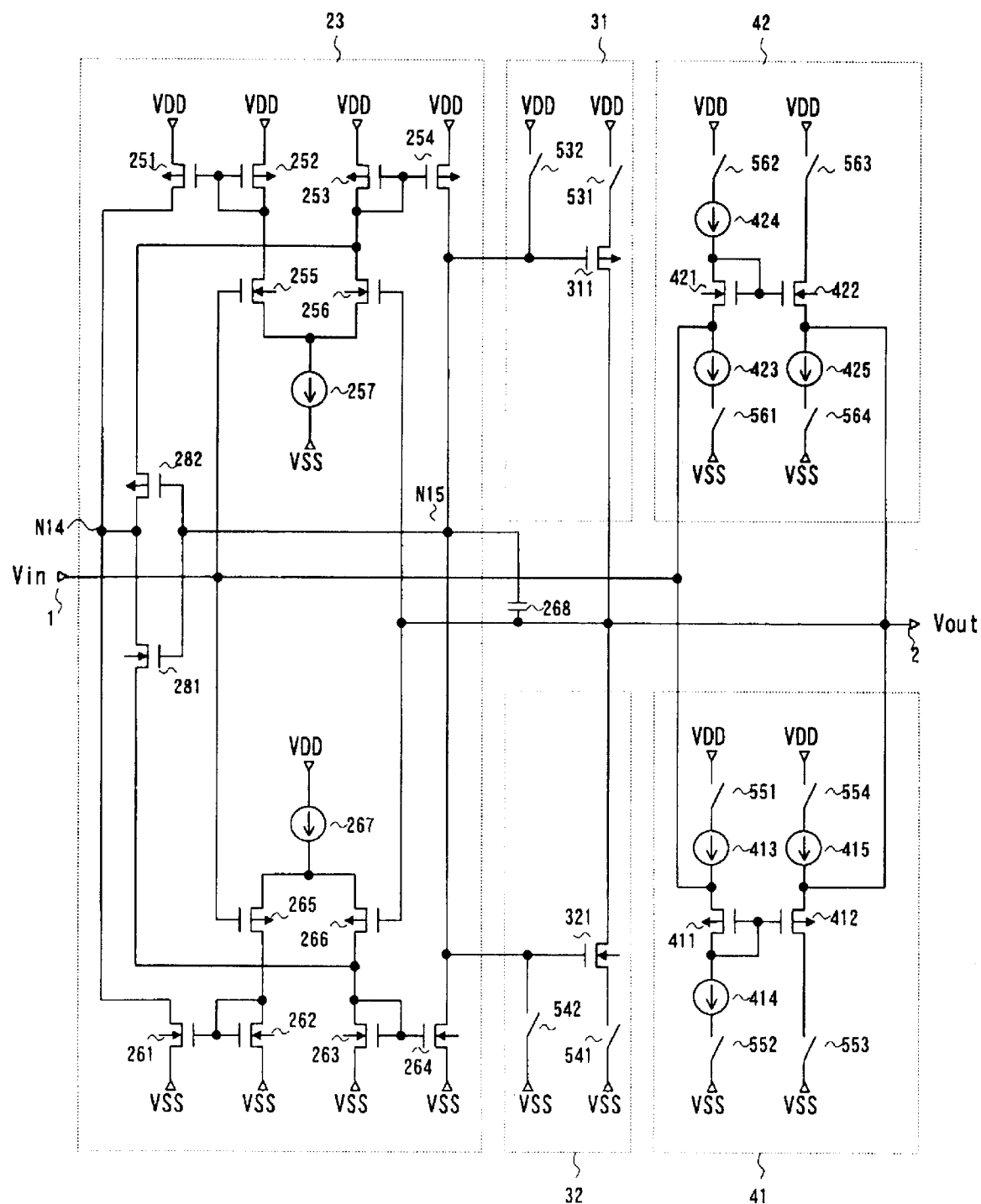
FIG. 45 shows a variation of the embodiment of the present invention (variation of FIG. 27)

FIG. 45 shows a configuration in which a vibration suppressing capacitor is added to the driver circuit shown in FIG. 27. In FIG. 45, a vibration suppressing capacitor 268 is provided across an output terminal 2 and an output terminal N15 of a differential circuit 23. Since the driver circuits shown in FIGS. 21 to 28 have the differential circuit 23 in common for the charging and discharging operations, it suffices to provide a single vibration suppressing capacitor.

The following information was derived as a result of our further investigations: The present invention provides a configuration for realizing output stabilization, without requiring the phase compensation capacitor, for realisation of a feedback-type amplifier circuit or a driver circuit of low power consumption. To this end, there is provided, in a feedback-type amplifier circuit having charging and discharging means exhibiting sufficiently low current driving capability when the output is at a desirable voltage, with one of the charging and discharging means being of a feedback-type configuration and the other being of a non-feedback-type configuration substantially free of response delay. The principle and the operation of this circuit is that, if, in an operation of changing the output to a desired voltage, one of the charging and discharging means is of the feedback type, response delay is produced to cause overshoot or undershoot, however, if the other of the charging and discharging means is of the feedback type and substantially free of response delay, the overshoot or undershoot can be promptly suppressed to stabilize the output. Thus, no phase compensation capacitor is needed, or the phase compensation capacitor may be suppressed to a sufficiently low value to suppress the current otherwise needed for charging or discharging the phase compensation capacitor to curtail the power consumption.

The configuration shown in FIGS. 1 to 32 and the configuration shown in FIGS. 36 to 46 show embodiments employing source follower charging means or source follower discharging means as charging or discharging means of non-feedback configuration.

In an instance shown for example in FIGS. 4 and 9, the charging means is a voltage follower circuit 11 of a feedback type, whilst discharging means is source follower discharging means 41 of the non-feedback type. In the source follower discharging means 41, a transistor 412 is of a source follower configuration, with the gate of the transistor being controlled to a voltage corresponding to an input voltage Vin. If the output exceeds a desired voltage, the gate to source voltage of the transistor 412 is increased to produce the discharging operation. That is, the source follower discharging means 41 is substantially free of response delay because the change in the output voltage, i.e., the gate-to-source voltage of the transistor 412 is instantaneously reflected in the discharging capability.

Thus, if overshoot is produced in a voltage follower circuit 11, the output voltage which has experienced overshoot can be promptly discharged to and stabilized at a desired voltage by the source follower discharging means 41. This principle holds for the configuration of the other embodiments employing source follower charging means or source follower discharging means.

However, in the present invention, a feedback-type amplifier circuit or driver circuit which does not need a phase compensation capacitor may be realized by the configuration of a non-feedback type, which is substantially free of response delay, other than the source follower configuration. FIG. 47 shows such an instance.

FIG. 47 shows a configuration of a further embodiment of the present invention. Referring to FIG. 47, the circuit of the present embodiment includes feedback-type charging means 11, capable of performing the charging operation by two inputs, namely an input voltage Vin and an output voltage Vout, to pull up the output voltage Vout, and discharging means 61 operating independently of the feedback-type charging means 11 responsive to the voltage difference between a desired voltage corresponding to the input voltage Vin and an output voltage Vout. FIG. 47 shows a configuration in which discharging means 61 is substituted for source follower discharging means 41 shown in FIG. 3. In FIG. 47, the same parts or components as those of FIG. 3 are depicted by the same reference numerals.

The feedback-type charging means 11 includes a differential stage 21, operating responsive to the voltage difference between two voltages, namely the input voltage Vin and the output voltage Vout, and charging means 31 for performing the charging operation responsive to an output of the differential stage 21. In the present embodiment, no phase compensation means (phase compensation capacitor) is provided or a sufficiently small phase compensation capacitor is used to enable high speed driving with a low power consumption.

In a driver circuit outputting a desired voltage as the output Vout responsive to an input voltage Vin, the feedback-type charging means 11 operates in accordance with the voltage differential between Vin and Vout, in such a manner that, if the output voltage Vout is lower than the desired voltage, the outpt voltage Vout is raised to a desired voltage by the charging operation innate to the feedback-type charging means. The feedback-type charging means 11 which is not equipped with phase compensation means is able to operate at an elevated speed with low power consumption.

However, in the case of the feedback-type configuration, there are occasions where there is a slight response delay for the change in the output voltage Vout until being reflected in the charging operation, due e.g., to parasitic capacitance of circuit elements, to cause the overshoot (overcharging).

On the other hand, the discharging means 61 is made up of an N-channel MOS transistor 601, having a drain and a source connected to an output terminal 2 and to the lower potential side power supply voltage VSS, respectively, and gate bias control means 62 which uses a desired voltage corresponding to the input voltage Vin as a reference voltage and is adapted for controlling the gate voltage of the N-channel MOS transistor 601 responsive to the output voltage Vout.

More specifically, the gate bias control means 62 controls the gate bias so that, during the time of driving the desired output voltage, the voltage difference between the output voltage Vout and the gate bias of the N-channel MOS transistor 601 will be kept substantially constant, in a manner free of delay with respect to changes in the output voltage.

The gate bias control means 62 controls the gate bias so that, when the output voltage is at a desired voltage, the gate to source voltage of the N-channel MOS transistor 601 will be in the vicinity of a threshold voltage. By so doing, the discharging means 61 has a discharging capability corresponding to the voltage difference between the desired voltage and the output voltge Vout, and hence, when the output voltage Vout is higher than a desired voltage, the output voltage Vout can be pulled down to a desired voltage by the discharge action of the transistor.

The operation of the discharging means 61 is explained further. In the discharging means 61, the voltage difference between the output voltage Vout and the gate bias of the N-channel MOS transistor 601 is kept at a substantially constant value, so that, if the output voltage Vout is higher than a desired voltage, the gate bias of the N-channel MOS transistor 601 is raised to increase the gate to source voltage of the N-channel MOS transistor 601 to produce the discharging action with a discharging capability corresponding to the voltage difference between the output voltage Vout and the desired voltage.

If the output voltage Vout is decreased to a desired voltage, the gate to source voltage of the N-channel MOS transistor 601 is in the vicinity of the threshold voltage, such that the discharging operation ceases.

On the other hand, if the output voltage Vout is lower than a desired voltage, the gate to source voltage of the N-channel MOS transistor 601 becomes lower than the threshold voltage, such that there occurs no discharging operation.

By the gate bias control of the N-channel MOS transistor 601 by the gate bias control means 62 occurring without delay with respect to change in the output voltage, the discharging means 61 is able to lower and stabilize the output voltage Vout, higher than a desired voltage, at a desired voltage.

Meanwhile, if, in the control of the gate bias control means 62, the output voltage Vout is lower than a desired voltage, it suffices if the gate to source voltage of the N-channel MOS transistor 601 is lower than the threshold value, while it does not matter if the voltage difference between the output voltage Vout and the gate bias is changed.

As described above, if, in the driver circuit of the present embodiment, the output voltage Vout is lower than a desired voltage, the output voltage Vout can be speedily raised to a desired voltage by the feedback-type charging means 11. Even if slight overshoot (overcharging) is produced in this case, the voltage can be pulled down quickly to a desired voltage by the discharging means 61 to provide a stable output.

On the other hand, if the output voltage Vout is higher than a desired voltage, the output voltage can be lowered to a desired voltage by the discharging means 61.

It should be noted that the feedback-type charging means 11, not having phase compensation capacitor, experiences but little response delay, ascribable to e.g., the parasitic capacitance of the circuit device. Thus, overshoot, if produced, can be suppressed to a sufficiently small value, so that, by combining the feedback-type charging means 11 with the discharging means 61, not only high speed charging but also high speed stabilization at a desired voltage can be achieved in charging.

FIG. 48 shows a specified instance of FIG. 47. That is, FIG. 48 shows a configuration in which the source follower discharging means 41 of FIG. 9 is changed to the discharging means 61, with the same components being designated with the same reference numerals. FIG. 48 shows a driver circuit in which the output voltage Vout is driven to a voltage equal to the input voltage Vin.

Referring to FIG. 48, a differential stage 21 in the feedback-type charging means 11 is made up of a differential input pair, formed by N-channel MOS transistors 213 and 214, and a differential stage having, as an active load therefor, a current mirror circuit formed by P-channel MOS transistors 212 and 211, and is of a feedback-type configuration in which an output voltage Vout is returned to the input side.

If Vout<Vin, the differential stage 21 and charging means 31, making up the feedback-type charging means 11, produces the charging action by a transistor 311, whereby the output voltage Vout is raised to Vin. With Vout>Vin, the transistor 311 is turned off so that no charging action is produced.

However, if, with Vout<Vin, the output voltage Vout is changed speedily to Vin, there is a slight response delay until changes in the output voltage are reflected in the charging action, thus producing the overshoot (overcharging).

The configuration of the discharging means 61 represents partial modification and application of a structure disclosed in JP Patent Kokai JP-A-11-259052, and is made up of an N-channel MOS transistor 601, having a drain and a source connected to the output terminal 2 and to the lower potential side power supply voltage VSS, respectively, and gate bias control means 62 having the input voltage Vin as the reference voltage and which is adapted for controlling the gate voltage of the N-channel MOS transistor 601 depending on the output voltage Vout.

The gate bias control means 62 includes a capacitor device 602, having one end connected to the gate of the N-channel MOS transistor 601, a switch 611, connected across the input terminal 1 and the opposite end of the capacitor device 602, a switch 613 connected across the output terminal 2 and the opposite end of the capacitor device 602, and a switch 612 for controlling the supply to or interruption of the supply of voltage Vref to the gate of the N-channel MOS transistor 601. This voltage Vref is applied as a gate bias voltage which will give the gate to source voltage of the N-channel MOS transistor 601 in the vicinity of the threshold voltage.

Figure 49:
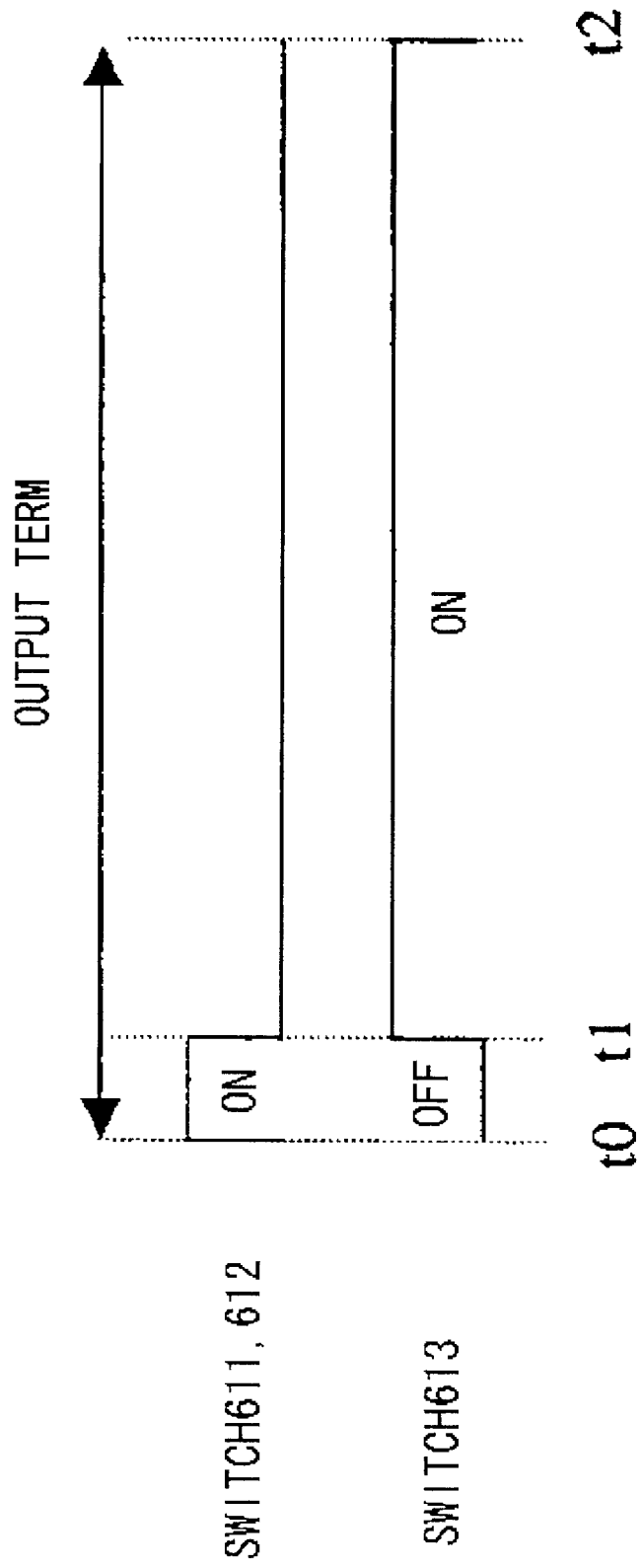
FIG. 49 illustrates timing diagrams showing the operations of switches in FIG. 48.

FIG. 49 is a timing chart showing the control of the switches 611 to 613 during one output period driving the output voltage Vout to a voltage equal to the input voltage Vin. The operation of the gate bias control means 62 in this embodiment is explained with reference to FIGS. 48 and 49.

At the beginning of one output cycle, both the switches 611 and 612 are turned on during time period t0 to t1. The voltage Vref is applied as gate bias to the N-channel MOS transistor 601 such that the gate to source voltage of the N-channel MOS transistor 601 is in the vicinity of the threshold voltage. The discharge current from the output terminal 2 to the lower potential side power supply voltage VSS is suppressed to a sufficiently small level.

When both the switches 611 and 612 are on, the voltage Vref is supplied to one end of the capacitor device 602, while the input voltage Vin is supplied to its opposite end to maintain the voltage difference between Vin and Vref.

After turning the switches 611 and 612 off at time t1, the switch 613 is turned on, with this state being kept during the time period t1–t2. The capacitor device 602 has its one end connected to the gate of the N-channel MOS transistor 601, while having its other end connected to the output terminal 2 via switch 3 in its ON state, such as to maintain the voltage difference between Vin and Vref maintained at both ends of the capacitor device 602.

Thus, if, when the switch 613 is turned on, the output voltage Vout is higher than Vin, the gate bias of the N-channel MOS transistor 601 is raised to increase the gate to source voltage of the N-channel MOS transistor 601 to produce the discharge action with the discharging capability corresponding to the voltage difference between the output voltage Vout and Vin.

When the output voltage Vout is lowered to Vin, the gate to source voltage of the N-channel MOS transistor 601 is in the vicinity of the threshold voltage, such that the discharge operation substantially ceases, thus stabilizing the output voltage Vout.

If, when the switch 613 is turned on, the output voltage Vout is lower than Vin, the gate to source voltage of the N-channel MOS transistor 601 becomes lower than the threshold voltage such that the discharge operation of the N-channel MOS transistor 601 is not produced.

Since the gate bias control means 62 is able to reflect changes in the output voltage substantially without delay in the gate bias of the N-channel MOS transistor 601 through the capacitor device 602, the discharging means 61 is able to discharge the output voltage higher than Vin promptly to Vin at which the voltage is to be stabilized.

In stead of the capacitor device 602, voltage latch means for performing the same operation may be adopted. The voltage latch means samples and latches the difference voltage between the input voltage Vin and the voltage Vref and causes the latched difference voltage to be held between the output terminal and the gate of N-channel MOS transistor 601.

As described above, if the output voltage Vout is lower than the input voltage Vin, the driver circuit of the present embodiment is able to pull up the output voltage Vout to Vin speedily by the feedback-type charging means 11. If a slight overshoot (overcharging) is produced, the output voltage can be pulled down to Vin promptly by the discharging means 61 to provide a stable output. If conversely the output Vout is higher than the input voltage Vin, it is pulled down by the discharging means 61 to Vin to provide a stable output.

It is noted that, since the discharge operation is executed by the N-channel MOS transistor, the operating range of the driving circuit shown in FIG. 48 may range from the low level power supply voltage VSS to the high level power supply voltage VDD.

Although the driver circuit corresponding to the combination of the feedback-type charging means 11 and the discharging means 61 has been explained above, the driver circuit may also be readily realized by a configuration comprising the combination of the feedback-type discharging means and charging means.

In this case, charging means of a similar structure (not source-follower type) corresponding to the discharging means 61 shown in FIG. 48 may be constructed in the same way except that the polarity is symmetric with the configuration of the discharging means 61.

More specifically, the charging means is made up by a P-channel MOS transistor, connected across the higher potential side power supply and the output terminal, a first switch inserted across the gate of the P-channel MOS transistor and the voltage Vref, a capacitor having one end connected to the gate of the P-channel MOS transistor, a second switch connected across the opposite end of the capacitor and the input terminal, and a third switch connected across the output terminal and the opposite end of the capacitor.

At the beginning of one output cycle of the driver circuit, both first and second switches are turned on during time period t0 to t1 (refer to FIG. 49). The voltage Vref is applied as gate bias to the P-channel MOS transistor such that the gate to source voltage of the P-channel MOS transistor is in the vicinity of the threshold voltage. The charge current to the output terminal 2 from the higher potential side power supply voltage VDD is suppressed to a sufficiently small level.

When both first and second switches are on, the voltage Vref is supplied to one end of the capacitor device, while the input voltage Vin is supplied to its. opposite end to maintain the voltage difference between Vin and Vref. After turning the first and second switches off at time t1 in FIG. 49, the third switch is turned on, with this state being kept during the time period t1–t2. The capacitor device has its one end connected to the gate of the P-channel MOS transistor, while having its other end connected to the output terminal via the third switch in its ON state, such as to maintain the voltage difference between Vin and Vref maintained at both ends of the capacitor device.

Thus, if, when the third switch is turned on, the output voltage Vout is higher than Vin, the gate bias of the P-channel MOS transistor is lowered to increase the gate to source voltage of the P-channel MOS transistor to produce the charge action with the charging capability corresponding to the voltage difference between the output voltage Vout and Vin.

When the output voltage Vout is raised to Vin, the gate to source voltage of the P-channel MOS transistor is in the vicinity of the threshold voltage, and hence the discharge operation substantially ceases, thus stabilizing the output voltage Vout.

If, when the third switch is turned on, the output voltage Vout is higher than Vin, the gate to source voltage of the P-channel MOS transistor 601 becomes less than the threshold voltage such that the charging operation of the P-channel MOS transistor is not produced.

In this case, since the gate bias control means of the charging means is able to reflect change in the output voltage substantially without delay in the gate bias of the P-channel MOS transistor through the capacitor device, the charging means is able to charge the output voltage lower than Vin promptly to Vin at which the voltage is to be stabilized.

In stead of the capacitor device, voltage latch means for performing the same operation may be adopted. The voltage latch means samples and latches the difference voltage between the input voltage Vin and the voltage Vref and causes the latched difference voltage to be held between the output terminal and the gate of P-channel MOS transistor.

Such a driver circuit may also be realized in which the source follower discharging means 41 and the source follower charging means 42 of the driver circuits of the respective embodiments of the present invention are substituted for the discharging means 61 shown in FIG. 48 and charging means of a similar structure.

The meritorious effects of the present invention are summarized as follows.

Thus, in accordance with the present invention as described above, voltage-follower feedback-type charging (discharging) means not having a phase compensating capacitor and source-follower discharging (charging) means are combined. As a result, it is possible to achieve operation of higher speed and stability than an operational amplifier and to reduce power consumption.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A feedback-type amplifier circuit comprising:
   feedback-type charging means including a differential stage for receiving an input-terminal voltage and an output-terminal voltage differentially as inputs, the input-terminal voltage being a data signal voltage;
   charging means for performing a charging operation at the output terminal based on an output from said differential stage;
   said feedback-type charging means operating as a voltage follower in which the output-terminal voltage is in-phase with the input-terminal voltage; and
   follower-type discharging means for performing a discharging operation at the output terminal by a follower operation of an active element based on a voltage difference between the input-terminal voltage and the output-terminal voltage.

2. The amplifier circuit as defined in claim 1, wherein said follower-type discharging means includes:
   bias control means, which receives the input-terminal voltage, for controlling an output bias voltage; and
   a follower transistor connected between the output terminal and a lower-potential side power supply and receiving the bias voltage output from said bias control means applied thereto as an input, an output current of said follower transistor controlled on the basis of a difference voltage between the output-terminal voltage and the bias voltage.

3. The amplifier circuit of claim 1, wherein the feedback-type charging means comprises a differential pair having differential input terminals connected to an input terminal and an output terminal and load elements each connected to each of a pair of outputs of said differential pair, and
   the charging means comprises a charging circuit that includes a transistor connected in a charging path of the output terminal, said transistor having a control terminal for receiving the voltage at a connection node of an output of said differential pair and said load element; and
   the follower-type discharging means comprises
   a follower transistor connected between the output terminal and a lower-potential side power supply, and
   a diode-connected transistor, which is inserted between the input terminal and the lower-potential side power supply and is driven by a constant-current source, said diode-connected transistor having a control terminal connected to the control terminal of said follower transistor.

4. The feedback-type amplifier circuit of claim 1, wherein, the feedback-type discharging means comprises
   a differential pair having differential input terminals connected to an input terminal and an output terminal,
   load elements each connected to each of a pair of outputs of said differential pair, and
   the discharging means comprises a discharging circuit that includes a transistor connected in a discharging path of the output terminal, said transistor having a control terminal to which is input the voltage at a connection node of an output of said differential pair and said load element; and
   the follower-type charging means comprises
   a follower transistor connected between the output terminal and a higher-potential side power supply, and
   a diode-connected transistor, which is inserted between the higher-potential side power supply and the input terminal and is driven by a constant-current source, said diode-connected transistor having a control terminal connected to the control terminal of said follower transistor.

5. The feedback-type amplifier circuit of claim 1, wherein, the feedback-type charging means comprises
   a differential stage including
      a differential pair which receives an input-terminal voltage and an output-terminal voltage differentially as inputs, and
      a current-mirror circuit having an input end and an output end connected to respective ones of a pair of outputs of said differential pair and constituting a load; and
   the charging means comprises a charging circuit that includes a transistor of a conductivity type identical with that of said current-mirror circuit, said transistor being connected between a higher-potential side power supply and the output terminal and having a control terminal for receiving the voltage at a connection node of the output end of said current-mirror circuit and the output of said differential pair; and the follower-type discharging means comprises
- a follower transistor connected between the output terminal and a lower-potential side power supply, and
- a diode-connected transistor, which is inserted between the input terminal and the lower-potential side power supply and is driven by a constant-current source, said diode-connected transistor having a control terminal connected to the control terminal of said follower transistor.

6. The feedback-type amplifier circuit of claim 1, wherein,
the feedback-type discharging means comprises
- a differential stage including
  - a differential pair for receiving an input-terminal voltage and an output-terminal voltage differentially as inputs, and
  - a current-mirror circuit having an input end and an output end connected to respective ones of a pair of outputs of said differential pair and constituting a load;
- the discharging means comprises a discharging circuit that includes a transistor of a conductivity type identical with that of said current-mirror circuit, said transistor being connected between a lower-potential side power supply and the output terminal and having a control terminal for receiving the voltage at a connection node of the output end of said current-mirror circuit and the output of said differential pair; and the follower-type charging means comprises
- a follower transistor connected between the output terminal and a higher-potential side power supply, and
- a diode-connected transistor, which is inserted between the higher-potential side power supply and the input terminal and is driven by a constant-current source, said diode-connected transistor having a control terminal connected to the control terminal of said follower transistor.

7. A feedback-type amplifier circuit comprising:
feedback-type charging means including:
- a differential stage including
  - a differential pair which receives an input-terminal voltage and an output-terminal voltage differentially as inputs, and
  - a current-mirror circuit having an input end and an output end connected to respective ones of a pair of outputs of said differential pair and constituting a load; and
- a charging circuit that includes a transistor of a conductivity type identical with that of said current-mirror circuit, said transistor being connected between a higher-potential side power supply and the output terminal and having a control terminal for receiving the voltage at a connection node of the output end of said current-mirror circuit and the output of said differential pair; and follower-type discharging means including
- a follower transistor connected between the output terminal and a lower-potential side power supply, and
- a diode-connected transistor, which is inserted between the input terminal arid the lower-potential side power supply and is driven by a constant-current source, said diode-connected transistor having a control terminal connected to the control terminal of said follower transistor, wherein said follower-type discharging means includes a constant-current source between the higher-potential side power supply and a connection node of said diode-connected transistor and the input terminal.

8. A feedback-type amplifier circuit comprising:
feedback-type discharging means including:
- a differential stage including
  - a differential pair for receiving an input-terminal voltage and an output-terminal voltage differentially as inputs, and
  - a current-mirror circuit having an input end and an output end connected to respective ones of a pair of outputs of said differential pair and constituting a load; and
- a discharging circuit that includes a transistor of a conductivity type identical with that of said current-mirror circuit, said transistor being connected between a lower-potential side power supply and the output terminal and having a control terminal for receiving the voltage at a connection node of the output end of said current-mirror circuit and the output of said differential pair; and follower-type charging means including
- a follower transistor connected between the output terminal and a higher-potential side power supply, and
- a diode-connected transistor, which is inserted between the higher-potential side power supply and the input terminal and is driven by a constant-current source, said diode-connected transistor having a control terminal connected to the control terminal of said follower transistor, wherein said follower-type charging means includes a constant-current source between the lower-potential side power supply and a connection node of said diode-connected transistor and the input terminal.

9. A feedback-type amplifier circuit comprising:
feedback-type charging means including:
- a differential stage including
  - a differential pair which receives an input-terminal voltage and an output-terminal voltage differentially as inputs, and
  - a current-mirror circuit having an input end and an output end connected to respective ones of a pair of outputs of said differential pair and constituting a load; and
- a charging circuit that includes a transistor of a conductivity type identical with that of said current-mirror circuit, said transistor being connected between a higher-potential side power supply and the output terminal and having a control terminal for receiving the voltage at a connection node of the output end of said current-mirror circuit and the output of said differential pair; and follower-type discharging means including
- a follower transistor connected between the output terminal and a lower-potential side power supply, and
- a diode-connected transistor, which is inserted between the input terminal and the lower-potential side power supply and is driven by a constant-current source, said diode-connected transistor having a control terminal connected to the control terminal of said follower transistor, wherein said follower-type discharging means includes a constant-current source between the higher-potential side power supply and a connection node of said follower transistor and the output terminal.

10. A feedback-type amplifier circuit comprising:
feedback-type discharging means including:
   a differential stage including
      a differential pair for receiving an input-terminal voltage and an output-terminal voltage differentially as inputs, and
      a current-mirror circuit having an input end and an output end connected to respective ones of a pair of outputs of said differential pair and constituting a load; and
   a discharging circuit that includes a transistor of a conductivity type identical with that of said current-mirror circuit, said transistor being connected between a lower-potential side power supply and the output terminal and having a control terminal for receiving the voltage at a connection node of the output end of said current-mirror circuit and the output of said differential pair; and
follower-type charging means including
   a follower transistor connected between the output terminal and a higher-potential side power supply, and
   a diode-connected transistor, which is inserted between the higher-potential side power supply and the input terminal and is driven by a constant-current source, said diode-connected transistor having a control terminal connected to the control terminal of said follower transistor,
wherein said follower-type charging means includes a constant-current source between the lower-potential side power supply and a connection node of said follower transistor and the output terminal.

11. A feedback-type amplifier circuit comprising:
feedback-type charging means including:
   a differential stage including
      a differential pair which receives an input-terminal voltage and an output-terminal voltage differentially as inputs, and
      a current-mirror circuit having an input end and an output end connected to respective ones of a pair of outputs of said differential pair and constituting a load; and
   a charging circuit that includes a transistor of a conductivity type identical with that of said current-mirror circuit, said transistor being connected between a higher-potential side power supply and the output terminal and having a control terminal for receiving the voltage at a connection node of the output end of said current-mirror circuit and the output of said differential pair; and
follower-type discharging means including
   a follower transistor connected between the output terminal and a lower-potential side power supply, and
   a diode-connected transistor, which is inserted between the input terminal and the lower-potential side power supply and is driven by a constant-current source, said diode-connected transistor having a control terminal connected to the control terminal of said follower transistor, wherein a constant current source is provided between the control terminal of said transistor of said charging circuit of said feedback-type charging means and the higher-potential side power supply, and a constant-current source is provided between the control terminal of said transistor of said charging circuit and the lower-potential side power supply.

12. A feedback-type amplifier circuit comprising:
feedback-type discharging means including:
   a differential stage including
      a differential pair for receiving an input-terminal voltage and an output-terminal voltage differentially as inputs, and
      a current-mirror circuit having an input end and an output end connected to respective ones of a pair of outputs of said differential pair and constituting a load; and
   a discharging circuit that includes a transistor of a conductivity type identical with that of said current-mirror circuit, said transistor being connected between a lower-potential side power supply and the output terminal and having a control terminal for receiving the voltage at a connection node of the output end of said current-mirror circuit and the output of said differential pair; and
follower-type charging means including
   a follower transistor connected between the output terminal and a higher-potential side power supply, and
   a diode-connected transistor, which is inserted between the higher-potential side power supply and the input terminal and is driven by a constant-current source, said diode-connected transistor having a control terminal connected to the control terminal of said follower transistor,
wherein a constant current source is provided between the control terminal of said transistor of said discharging circuit of said feedback-type discharging means and the higher-potential side power supply, and a constant-current source is provided between the control terminal of said transistor of said discharging circuit and the lower-potential side power supply.

13. A feedback-type amplifier circuit comprising:
feedback-type charging means including:
   a differential stage including
      a differential pair which receives an input-terminal voltage and an output-terminal voltage differentially as inputs, and
      a current-mirror circuit having an input end and an output end connected to respective ones of a pair of outputs of said differential pair and constituting a load; and
   a charging circuit that includes a transistor of a conductivity type identical with that of said current-mirror circuit, said transistor being connected between a higher-potential side power supply and the output terminal and having a control terminal for receiving the voltage at a connection node of the output end of said current-mirror circuit and the output of said differential pair; and
follower-type discharging means including
   a follower transistor connected between the output terminal and a lower-potential side power supply, and
   a diode-connected transistor, which is inserted between the input terminal and the lower-potential side power supply and is driven by a constant-current source, said diode-connected transistor having a control terminal connected to the control terminal of said follower transistor, wherein said differential stage has a plurality of transistors which receive the input-terminal voltage commonly as inputs;

said current-mirror circuit has its input end connected to the output of a transistor which receives the output-terminal voltage as an input, said current-mirror circuit having a plurality of output ends; and the plurality of output ends of said current-mirror circuit are commonly connected to a plurality of commonly connected outputs of the transistors which receive the input-terminal voltage commonly as inputs, and are connected to the control terminal of the transistor of said charging circuit.

14. A feedback-type amplifier circuit comprising:

feedback-type charging means including:
  a differential stage including
    a differential pair which receives an input-terminal voltage and an output-terminal voltage differentially as inputs, and
    a current-mirror circuit having an input end and an output end connected to respective ones of a pair of outputs of said differential pair and constituting a load; and
  a charging circuit that includes a transistor of a conductivity type identical with that of said current-mirror circuit, said transistor being connected between a higher-potential side power supply and the output terminal and having a control terminal for receiving the voltage at a connection node of the output end of said current-mirror circuit and the output of said differential pair; and follower-type discharging means including
  a follower transistor connected between the output terminal and a lower-potential side power supply, and
  a diode-connected transistor, which is inserted between the input terminal and the lower-potential side power supply and is driven by a constant-current source, said diode-connected transistor having a control terminal connected to the control terminal of said follower transistor, wherein a transistor which receives the input-terminal voltage as an input and which is one of a transistor pair constituting said differential pair in said differential stage has a current driving capability that is a prescribed multiple of a driving current capability of a transistor which receives the input-terminal voltage as an input and which is the other of said transistor pair;

said current-mirror circuit of said differential stage has its input end connected to the output of the transistor to which the terminal voltage is input, and a transistor constituting the output end has a current driving capability that is a prescribed multiple of a driving current capability of a transistor constituting the input end; and a connection node of the output end of said current-mirror circuit of said differential stage and the output of the transistor which receives the input-terminal voltage as an input is connected to the control terminal of the transistor of said charging circuit.

15. A feedback-type amplifier circuit comprising:

feedback-type discharging means including:
  a differential stage including
    a differential pair for receiving an input-terminal voltage and an output-terminal voltage differentially as inputs, and
    a current-mirror circuit having an input end and an output end connected to respective ones of a pair of outputs of said differential pair and constituting a load; and
  a discharging circuit that includes a transistor of a conductivity type identical with that of said current-mirror circuit, said transistor being connected between a lower-potential side power supply and the output terminal and having a control terminal for receiving the voltage at a connection node of the output end of said current-mirror circuit and the output of said differential pair; and follower-type charging means including
  a follower transistor connected between the output terminal and a higher-potential side power supply, and
  a diode-connected transistor, which is inserted between the higher-potential side power supply and the input terminal and is driven by a constant-current source, said diode-connected transistor having a control terminal connected to the control terminal of said follower transistor, wherein said differential stage has a plurality of transistors which receive the input-terminal voltage commonly as inputs;

said current-mirror circuit has its input end connected to the output of a transistor which receives the output-terminal voltage as an input, said current-mirror circuit having a plurality of output ends; and the plurality of output ends of said current-mirror circuit are commonly connected to a plurality of commonly connected outputs of the transistors which receives the input-terminal voltage commonly as inputs, and are connected to the control terminal of the transistor of said discharging circuit.

16. A feedback-type amplifier circuit comprising:

feedback-type discharging means including:
  a differential stage including
    a differential pair for receiving an input-terminal voltage and an output-terminal voltage differentially as inputs, and
    a current-mirror circuit having an input end and an output end connected to respective ones of a pair of outputs of said differential pair and constituting a load; and
  a discharging circuit that includes a transistor of a conductivity type identical with that of said current-mirror circuit, said transistor being connected between a lower-potential side power supply and the output terminal and having a control terminal for receiving the voltage at a connection node of the output end of said current-mirror circuit and the output of said differential pair; and follower-type charging means including
  a follower transistor connected between the output terminal and a higher-potential side power supply, and
  a diode-connected transistor, which is inserted between the higher-potential side power supply and the input terminal and is driven by a constant-current source, said diode-connected transistor having a control terminal connected to the control terminal of said follower transistor, wherein a transistor which receives the input-terminal voltage an as input and which is one of a transistor pair constituting said differential pair in said differential stage has a current driving capability that is a prescribed multiple of a driving current capability of a transistor which receives the input-terminal voltage as an input and which is the other of said transistor pair;

said current-mirror circuit of said differential stage has its input end connected to the output of the transistor to which the terminal voltage is input, and a transistor constituting the output end has a current driving capability that is a prescribed multiple of a driving current capability of a transistor constituting the input end; and a connection node of the output end of said current-mirror circuit of said differential stage and the output of the transistor which receives the input-terminal voltage as an input is connected to the control terminal of the transistor of said discharging circuit.

17. A feedback-type amplifier circuit comprising:

a first feedback-type amplifier circuit including:
  feedback-type charging means, for operating as a voltage follower, having
    a first differential stage which receives an input-terminal voltage and an output-terminal voltage differentially as inputs, and
    charging means for performing a charging operation at the output terminal based upon an output from said first differential stage; and
  follower-type discharging means for performing a discharging operation at the output terminal by follower operation of an active element in accordance with a voltage difference between the input-terminal voltage and the output-terminal voltage; and a second feedback-type amplifier circuit including:
  feedback-type discharging means, for operating as a voltage follower, having
    a second differential stage which receives the input-terminal voltage and the output-terminal voltage differentially as inputs, and
    discharging means for performing a discharging operation at the output terminal based upon an output from said second differential stage; and
  follower-type charging means for performing a charging operation at the output terminal by follower operation of an active element in accordance with a voltage difference between the input-terminal voltage and the output-terminal voltage;

wherein the input terminal is connected to one of said first and second feedback-type amplifier circuits via a first changeover switch, the changeover of which is controlled by an operation control signal; and the output terminal is connected to said first and second feedback-type amplifier circuits via a second changeover switch, the changeover of which is controlled by the operation control signal.

18. The amplifier circuit as defined in claim 17, wherein said follower-type discharging means comprises:

first bias control means, which receives the input-terminal voltage, for controlling output bias voltage; and a follower transistor connected between the output terminal and a lower-potential side power supply and having the bias voltage output from said first bias control means applied thereto as an input; and said follower-type charging means has:

second bias control means, which receives the input-terminal voltage, for controlling output bias voltage; and a follower transistor connected between a higher-potential side power supply and the output terminal and having the bias voltage output from said second bias control means applied thereto as an input.

19. A feedback-type amplifier circuit comprising:

a first feedback-type amplifier circuit which includes:
  feedback-type charging means having:
    a first differential stage including
      a first differential pair receiving an input-terminal voltage and an output-terminal voltage differentially as inputs and driven by a first constant-current source, and
      a first current-mirror circuit having an input end connected to an output end of a transistor which receives the output-terminal voltage as an input and which is one of a transistor pair constituting said first differential pair, and an output end connected to an output end of a transistor which receives the input-terminal voltage as an input and which is the other of said transistor pair; and
    a charging circuit that includes a first transistor of a conductivity type identical with that of said first current-mirror circuit, said first transistor being connected between a higher-potential side power supply and the output terminal and having a control terminal for receiving the voltage at a connection node of the output end of said first current-mirror circuit and the output of said first differential pair; and
  follower-type discharging means having:
    a follower second transistor connected between the output terminal and a lower-potential side power supply; and
    a diode-connected third transistor, which is inserted between the input terminal and the lower-potential side power supply and is driven by a second constant-current source, said third transistor having a control terminal connected to the control terminal of said follower second transistor;

a second feedback-type amplifier circuit which includes:
  feedback-type discharging means having:
    a second differential stage including
      a second differential pair, receiving the input-terminal voltage and the output-terminal voltage differentially as inputs, and driven by a third constant-current source, and
      a second current-mirror circuit having an input end, which is connected to an output end of a transistor to which the output-terminal voltage is input and which is one of a transistor pair constituting said second differential pair, and an output end connected to an output end of a transistor to which the input-terminal voltage is input and which is the other of said transistor pair; and
    a discharging circuit that includes a fourth transistor of a conductivity type identical with that of said second current-mirror circuit, said fourth transistor being connected between a lower-potential side power supply and the output terminal and having a control terminal for receiving the voltage at a connection node of the output end of said second current-mirror circuit and the output of said second differential pair; and follower-type discharging means having:
- a follower fifth transistor connected between the output terminal and a higher-potential side power supply; and
- a diode-connected sixth transistor, which is inserted between the higher-potential side power supply and the input terminal and is driven by a fourth constant-current source, said sixth transistor having a control terminal connected to the control terminal of said follower fifth transistor; and control means for deactivating at least one of said feedback-type charging means and feedback-type discharging means and controlling activation and deactivation of said first differential stage, said follower-type discharging means, said second differential stage and said follower-type charging means.

20. The amplifier circuit as defined in claim 19, further comprising:
- a first switch connected in series with said first constant-current source between said first differential stage and the lower-potential side power supply;
- a second switch connected in series with said second transistor between the output terminal and the lower-potential side power supply;
- a third switch connected in series with said second constant-current source between said third transistor and the lower-potential side power supply;
- a fourth switch connected in series with said third constant-current source between said second differential stage and the higher-potential side power supply;
- a fifth switch connected in series with said fifth transistor between the output terminal and the higher-potential side power supply; and
- a sixth switch connected in series with said fourth constant-current source between said sixth transistor and the higher-potential side power supply;

wherein said first to third switches and said fourth to sixth switches are each on/off controlled by an operation control signal, and at least one of said first and fourth switches is turned off.

21. The amplifier circuit as defined in claim 20, wherein a fifth constant-current source and a seventh switch are serially connected between the higher-potential side power supply and a node between said third transistor and the input terminal; and
- a sixth constant-current source and an eighth switch are serially connected between the lower-potential side power supply and a node between said sixth transistor and the input terminal; and
- said seventh switch being turned on and off in sync with said second and third switches and said eighth switch being turned on and off in sync with said fifth and sixth switches by the operation control signal.

22. The amplifier circuit as defined in claim 19, further comprising a ninth switch provided between the output terminal and a pre-charging power supply.

23. The amplifier circuit as defined in claim 19, wherein said follower-type discharging means has a seventh current source and a ninth switch serially connected between the higher-potential side power supply and a node between said follower second transistor and the output terminal; and said follower-type charging means has an eighth current source and a tenth switch serially connected between the lower-potential side power supply and a node between said follower fifth transistor and the output terminal.

24. The amplifier circuit as defined in claim 19, wherein said follower-type discharging means has a seventh transistor, which is biased by a prescribed bias voltage, connected in parallel with said third transistor between the input terminal and said second constant-current source; and said follower-type charging means has an eighth transistor, which is biased by a prescribed bias voltage, connected in parallel with said sixth transistor between the input terminal and said fourth constant-current source.

25. A feedback-type amplifier circuit comprising:
- a differential stage receiving an input-terminal voltage and an output-terminal voltage differentially as inputs;
- charging means for performing a charging operation at the output terminal based upon an output from said differential stage;
- follower-type discharging means for performing a discharging operation at the output terminal by a follower operation of an active element in accordance with a voltage difference between the input-terminal voltage and the output-terminal voltage;
- discharging means for performing a discharging operation at the output terminal based upon an output from said differential stage; and
- follower-type charging means for performing a charging operation at the output terminal by a follower operation of an active element in accordance with a voltage difference between the input-terminal voltage and the output-terminal voltage;

wherein operation of said charging means, said discharging means, said follower-type discharging means and said follower-type charging means is controlled by the value of an operation control signal applied thereto.

26. A feedback-type amplifier circuit comprising:
- a differential stage receiving an input-terminal voltage and an output-terminal voltage differentially as inputs;
- charging means for performing a charging operation at the output terminal based upon an output from said differential stage;
- discharging means for performing a discharging operation at the output terminal based upon an output from said differential stage; and
- follower-type charging/discharging means for performing a charging operation at the output terminal by follower operation of an active element in accordance with a voltage difference between the input-terminal voltage and the output-terminal voltage, and a discharging operation at the output terminal by follower operation of an active element in accordance with a voltage difference between the input-terminal voltage and the output-terminal voltage;

wherein operation of said charging means, said discharging means and said follower-type charging/discharging means is controlled by the value of an operation control signal applied thereto.

27. A feedback-type amplifier circuit comprising:
- a first differential stage including a first differential pair, receiving an input-terminal voltage and an output-terminal voltage differentially as inputs, driven by a first constant-current source and first and second current-mirror circuits having respective ones of input ends connected to respective ones of a pair of outputs of said first differential pair;

a charging circuit that includes a first transistor of a conductivity type identical with that of said second current-mirror circuit, said first transistor being connected between a higher-potential side power supply and the output terminal and having a control terminal connected to the output end of said second current-mirror circuit;

a second differential stage including a second differential pair, receiving the input-terminal voltage and the output-terminal voltage differentially as inputs, driven by a second constant-current source, and third and fourth current-mirror circuits having respective ones of input ends connected to respective ones of a pair of outputs of said second differential pair;

a discharging circuit that includes a second transistor of a conductivity type identical with that of said fourth current-mirror circuit, said second transistor being connected between a lower-potential side power supply and the output terminal and having a control terminal connected to the output end of said fourth current-mirror circuit;

output ends of said first and third current-mirror circuit being connected together and output ends of said second and fourth current-mirror circuits being connected together;

follower-type discharging means for performing a discharging operation at the output terminal by follower operation of a third transistor in accordance with a voltage difference between the input-terminal voltage and the output-terminal voltage;

follower-type charging means for performing a charging operation at the output terminal by follower operation of a fourth transistor in accordance with a voltage difference between the input-terminal voltage and the output-terminal voltage; and control means for deactivating at least one of said discharging circuit and said charging circuit and controlling activation and deactivation of said follower-type discharging means and said follower-type charging means.

28. The amplifier circuit as defined in claim 27, further comprising:

a first switch serially connected to said first transistor between the higher-potential side power supply and the output terminal; and a second switch serially connected to said second transistor between the lower-potential side power supply and the output terminal;

wherein at least one of said first and second switches is turned off by an operation control signal.

29. The amplifier circuit as defined in claim 27, further comprising:

a fifth transistor, which is of a conductivity type identical with that of said second current-mirror circuit, inserted between a connection node of the input end of said second current-mirror circuit and an output of said first differential pair and a connection node of the output ends of said first and third current-mirror circuits, said fifth transistor having a control terminal for receiving the voltage at a connection node of the output ends of said second and fourth current-mirror circuits; and a sixth transistor, which is of a conductivity type identical with that of said fourth current-mirror circuit, inserted between a connection node of the input end of said fourth current-mirror circuit and an output of said second differential pair and a connection node of the output ends of said first and third current-mirror circuits, said sixth transistor having a control terminal for receiving the voltage at a connection node of the output ends of said second and fourth current-mirror circuits.

30. The amplifier circuit as defined in claim 27, wherein said charging circuit is provided with a third switch between the control terminal of said first transistor and the higher-potential side power supply, and said discharging circuit is provided with a fourth switch between the control terminal of said second transistor and the lower-potential side power supply.

31. A feedback-type amplifier circuit comprising:

a first differential stage including a first differential pair, receiving an input-terminal voltage and an output-terminal voltage differentially as inputs, driven by a first constant-current source, and first and second current-mirror circuits having respective ones of input ends connected to respective ones of a pair of outputs of said first differential pair;

a charging circuit that includes a first transistor of a conductivity type identical with that of said second current-mirror circuit, said first transistor being connected between a higher-potential side power supply and the output terminal and having a control terminal connected to the output end of said second current-mirror circuit;

a second differential stage including a second differential pair, receiving the input-terminal voltage and the output-terminal voltage differentially as inputs, driven by a second constant-current source, and third and fourth current-mirror circuits having respective ones of input ends connected to respective ones of a pair of outputs of said second differential pair;

a discharging circuit that includes a second transistor of a conductivity type identical with that of said fourth current-mirror circuit, said second transistor being connected between a lower-potential side power supply and the output terminal and having a control terminal connected to the output end of said fourth current-mirror circuit;

output ends of said first and third current-mirror circuit being connected together and output ends of said second and fourth current-mirror circuits being connected together;

a third transistor, which is of a conductivity type identical with that of said second current-mirror circuit, inserted between a connection node of the input end of said second current-mirror circuit and an output of said first differential pair and a connection node of the output ends of said first and third current-mirror circuits, said third transistor having a control terminal for receiving the voltage at a node between the output ends of said second and fourth current-mirror circuits; and a fourth transistor, which is of a conductivity type identical with that of said fourth current-mirror circuit, inserted between a connection node of the input end of said fourth current-mirror circuit and an output of said second differential pair and a connection node of the output ends of said first and third current-mirror circuits, said fourth transistor having a control terminal for receiving the voltage at a node between the output ends of said second and fourth current-mirror circuits;

follower-type charging/discharging means for performing a charging operation at the output terminal by a follower operation of a fifth transistor in accordance with a voltage difference between the input-terminal voltage and the output-terminal voltage, and a discharging operation at the output terminal by a follower operation of a sixth transistor in accordance with a voltage difference between the input-terminal voltage and the output-terminal voltage; and control means for deactivating at least one of said discharging circuit and said charging circuit and controlling activation and deactivation of said follower-type charging/discharging means.

32. The amplifier circuit as defined in claim 31, further comprising:

a first switch serially connected to said first transistor between the higher-potential side power supply and the output terminal;

a second switch serially connected to said second transistor between the lower-potential side power supply and the output terminal;

a third switch inserted between the control terminal of said first transistor and the higher-potential side power supply; and a fourth switch inserted between the control terminal of said second transistor and the lower-potential side power supply.

33. The amplifier circuit as defined in claim 27, wherein said follower-type discharging means has a diode-connected seventh transistor, which is inserted between the input terminal and the lower-potential side power supply and has a control terminal connected to the control terminal of said follower third transistor;

a third constant-current source and a fifth switch are serially connected between said seventh transistor and the lower-potential side power supply;

a sixth switch is serially connected between said third transistor and the lower-potential side power supply;

a fourth constant-current source and a seventh switch are serially connected between the higher-potential side power supply and a node between said third transistor and the output terminal;

a fifth constant-current source and an eighth switch are serially connected between the higher-potential side power supply and a node between said seventh transistor and the input terminal;

said follower-type charging means has a diode-connected eighth transistor inserted between the input terminal and higher-potential side power supply and having a control terminal connected to the control terminal of said follower fourth transistor;

a sixth constant-current source and a ninth switch are serially connected between said eighth transistor and the higher-potential side power supply;

a tenth switch is connected between said fourth transistor and the higher-potential side power supply;

a seventh constant-current source and an eleventh switch are serially connected between the lower-potential side power supply and a node between said fourth transistor and the output terminal; and an eighth constant-current source and a twelfth switch are serially connected between the lower-potential side power supply and a node between said eighth transistor and the input terminal.

34. The amplifier circuit as defined in claim 31, wherein said charging circuit is provided with a thirteenth switch between the control terminal of said first transistor and the higher-potential side power supply; and said discharging circuit is provided with a fourteenth switch between the control terminal of said second transistor and the lower-potential side power supply.

35. The amplifier as defined in claim 29, wherein said follower-type discharging means includes:

a diode-connected seventh transistor, which is inserted between the input terminal and the lower-potential side power supply and has a control terminal connected to the control terminal of said follower third transistor;

a third constant-current source being connected between said seventh transistor and the lower-potential side power supply;

a fifth switch being connected in series with the third transistor between the output terminal and the lower-potential side power supply; and a ninth transistor, which is biased by a prescribed bias voltage, connected in parallel with said seventh transistor between the input terminal and said third constant-current source; and said follower-type charging means includes:

a diode-connected eighth transistor, which is inserted between the input terminal and the higher-potential side power supply and has a control terminal connected to the control terminal of said follower fourth transistor;

a fourth constant-current source being connected between said eighth transistor and the higher-potential side power supply;

a sixth switch being connected in series with the fourth transistor between the output terminal and the higher-potential side power supply; and a tenth transistor, which is biased by a prescribed bias voltage, connected in parallel with said eighth transistor between the input terminal and said fourth constant-current source.

36. A feedback-type amplifier circuit characterized in that the feedback-type amplifier circuit as defined in claim 1 does not include phase compensating means comprising a capacitor element.

37. A driver circuit characterized in that said feedback-type amplifier circuit set as defined in claim 17 constructs an output circuit to which is input a voltage selected by a selector circuit from a plurality of voltages extracted from a plurality of taps of a resistor string connected between first and second reference voltages.

38. The driver circuit as defined in claim 37, wherein said output circuit includes a switch for outputting the input voltage as is or cutting off the output voltage.

39. The driver circuit as defined in claim 37, wherein capacitance load connected to the output terminal is driven.

40. A liquid crystal display device in which a driver circuit of the liquid crystal display device has the driver circuit as defined in claim 37.

41. An operational amplifier used as a voltage-follower circuit having a non-inverting input terminal for receiving an input signal and an inverting input terminal for receiving an output signal fed back as an input, operational amplifier comprising:

charging means for charging an output terminal of the operational amplifier based upon an output of a differential stage which receives the input signal and the output signal differentially;

discharging means for discharging an output terminal of the operational amplifier based upon an output of a differential stage which receives the input signal and the output signal differentially;

first bias control means for controlling output bias based upon the input signal;

follower-type discharging means having a source-follower or emitter-follower transistor, which is inserted into a discharging path of the output terminal of said operational amplifier, and receives the bias voltage output from said first bias control means;

second bias control means for controlling output bias based upon the input signal;

follower-type charging means having a source-follower or emitter-follower transistor, which is inserted into a charging path of the output terminal of said operational amplifier, and receives the bias voltage output from said second bias control means; and control means for deactivating at least one of said charging means and said discharging means.

42. A feedback-type amplifier circuit comprising:

feedback-type charging means, including a differential stage for receiving an input-terminal voltage and an output-terminal voltage differentially as inputs and charging means for performing a charging operation at the output terminal based on an output from said differential stage, said feedback-type charging means operating as a voltage follower in which the output-terminal voltage is in-phase with the input-terminal voltage; and follower-type discharging means for performing a discharging operation at the output terminal by a follower operation of an active element based on a voltage difference between the input-terminal voltage and the output-terminal voltage, wherein a capacitor for suppressing vibration of an output waveform during load driving is provided across an output of said differential stage and said output terminal.

43. A feedback-type amplifier circuit comprising:

feedback-type charging means including a differential pair having differential input terminals connected to an input terminal and an output terminal, load elements each connected to each of a pair of outputs of said differential pair, and a charging circuit that includes a transistor connected in a charging path of the output terminal, said transistor having a control terminal for receiving the voltage at a connection node of an output of said differential pair and said load element; and follower-type discharging means including a follower transistor connected between the output terminal and a lower-potential side power supply, and a diode-connected transistor, which is inserted between the input terminal and the lower-potential side power supply and is driven by a constant-current source, said diode-connected transistor having a control terminal connected to the control terminal of said follower transistor, wherein a capacitor for suppressing vibrations of an output waveform during load driving is provided across an output of said differential pair and said output terminal.

44. A feedback-type amplifier circuit as defined in claim 17 wherein one or plurality of capacitors for suppressing vibrations of an output waveform during load driving are provided across an output of said first deferential stage and said output terminal and across an output of said second differential stage and said output terminal.

45. A feedback-type amplifier circuit as defined in claim 19 wherein one or plurality of capacitors for suppressing vibrations of an output waveform during load driving are provided across an output end of a transistor fed with said input terminal voltage of said first differential pair as an input and said output terminal and across an output end of a transistor fed with said input terminal voltage of said second differential pair as an input and said output terminal.

46. An operational amplifier used as a voltage-follower circuit having a non-inverting input terminal for receiving an input signal and an inverting input terminal for receiving an output signal fed back as an input, said operational amplifier comprising:

discharging means for discharging an output terminal of the operational amplifier based upon an output of a differential which receives the input signal and the output signal differentially as inputs;

bias control means for controlling an output bias voltage based upon the input signal; and charging means having a source-follower or emitter-follower transistor, which is inserted into a charging path of the output terminal of said operational amplifier and receives the bias voltage output from said bias control means, wherein a capacitor for suppressing vibrations of an output waveform during load driving is provided across an output of said differential stage and said output terminal.

47. A feedback-type amplifier circuit comprising:

feedback-type charging means, including a differential stage for receiving an input-terminal voltage and an output-terminal voltage differentially as inputs and charging means for performing a charging operation at the output terminal based on an output from said differential stage, said feedback-type charging means operating as a voltage follower in which the output-terminal voltage is in-phase with the input-terminal voltage; and discharging means including a transistor connected across said output terminal and a lower potential side power supply, and bias control means for controlling the bias voltage applied to a control terminal of said transistor;

said discharging means having a bias voltage supply terminal for providing a predetermined bias voltage to the control terminal of said transistor, and voltage holding means for sampling and latching a difference voltage between the input-terminal voltage and the bias voltage from the bias voltage supply terminal to hold the latched difference voltage between the output terminal and the control terminal of said transistor.

48. A feedback-type amplifier circuit comprising:

feedback-type charging means including a differential pair having differential input terminals connected to an input terminal and an output terminal, load elements each connected to each of a pair of outputs of said differential pair, and a charging circuit that includes a transistor connected in a charging path of the output terminal, said transistor having a control terminal for receiving the voltage at a connection node of an output of said differential pair and said load element; and discharging means including a transistor connected in a discharging path of said output terminal and bias control means for controlling the bias voltage applied to a control terminal of said transistor;

said discharging means having a bias voltage supply terminal for providing a predetermined bias voltage to the control terminal of said transistor connected in the discharging path, and voltage holding means for sampling and latching a difference voltage between the input-terminal voltage and the bias voltage from the bias voltage supply terminal to hold the latched difference voltage between the output terminal and the control terminal of said transistor.

49. A feedback-type amplifier circuit comprising:

feedback-type charging means including:
- a differential stage including
  - a differential pair which receives an input-terminal voltage and an output-terminal voltage differentially as inputs, and
  - a current-mirror circuit having an input end and an output end connected to respective ones of a pair of outputs of said differential pair and constituting a load; and
- a charging circuit that includes a transistor of a first conductivity type identical with that of said current-mirror circuit, said transistor being connected between a higher-potential side power supply and the output terminal and having a control terminal to which is input the voltage at a node between the output end of said current-mirror circuit and the output of said differential pair; and discharging means including a transistor of a second conductivity type connected between the output terminal and a lower-potential side power supply, and bias control means for controlling the bias voltage applied to a control terminal of said transistor of the second conductivity type;

said discharging means having a bias voltage supply terminal for providing a predetermined bias voltage to the control terminal of said transistor of said discharging means, and voltage holding means for sampling and latching a difference voltage between the input-terminal voltage and the bias voltage from the bias voltage supply terminal to hold the latched difference voltage between the output terminal and the control terminal of said transistor of said discharging means.

50. The feedback-type amplifier circuit as defined in claim 17, comprising:

discharging means including a transistor connected across said output terminal and the lower potential side power supply, and bias control means for controlling the bias voltage, applied to a control terminal of said transistor, in place of said follower-type discharging means;

said bias control means of said discharging means having a bias voltage supply terminal for providing a predetermined bias voltage to the control terminal of said transistor of said discharging means, and voltage holding means for sampling and latching a difference voltage between the input-terminal voltage and the bias voltage from the bias voltage supply terminal to hold the latched difference voltage between the output terminal and the control terminal of said transistor of said discharging means.

51. A feedback-type amplifier circuit comprising:

feedback-type charging means, including a differential stage for receiving an input-terminal voltage and an output-terminal voltage differentially as inputs and charging means for performing a charging operation at the output terminal based on an output from said differential stage, said feedback-type charging means operating as a voltage follower in which the output-terminal voltage is in-phase with the input-terminal voltage; and discharging means including a transistor connected across said output terminal and a lower potential side power supply, and bias control means for controlling the bias voltage applied to a control terminal of said transistor;

in said discharging means, a predetermined bias voltage being supplied to the control terminal of said transistor at the beginning of an output period, there being provided a capacitor having one end and the opposite end fed with said input terminal voltage and with said bias voltage, through switches turned in an ON-state, respectively, to hold a differential voltage between the input terminal voltage and the bias voltage; a switching action of switches then being carried out for connecting said output terminal and said control terminal of said transistor to the one end and the opposite end of the capacitor, respectively.

52. A feedback-type amplifier circuit comprising:

feedback-type charging means including
- a differential pair having differential input terminals connected to an input terminal and an output terminal,
- load elements each connected to each of a pair of outputs of said differential pair, and
- a charging circuit that includes a transistor connected in a charging path of the output terminal, said transistor having a control terminal for receiving the voltage at a connection node of an output of said differential pair and said load element; and discharging means including a transistor connected in a discharging path of said output terminal and bias control means for controlling the bias voltage applied to a control terminal of said transistor;

in said discharging means, a predetermined bias voltage being supplied to the control terminal of said transistor connected in a discharging path at the beginning of an output period, there being provided a capacitor having one end and the opposite end fed with said input terminal voltage and with said bias voltage, through switches turned in an ON-state, respectively, to hold a differential voltage between the input terminal voltage and the bias voltage; a switching action of switches then being carried out for connecting said output terminal and said control terminal of said transistor connected in a discharging path to the one end and the opposite end of the capacitor, respectively.

53. A feedback-type amplifier circuit comprising:

feedback-type charging means including:
- a differential stage including
  - a differential pair which receives an input-terminal voltage and an output-terminal voltage differentially as inputs, and
  - a current-mirror circuit having an input end and an output end connected to respective ones of a pair of outputs of said differential pair and constituting a load; and
- a charging circuit that includes a transistor of a first conductivity type identical with that of said current-mirror circuit, said transistor being connected between a higher-potential side power supply and the output terminal and having a control terminal to which is input the voltage at a node between the output end of said current-mirror circuit and the output of said differential pair; and discharging means including a transistor of a second conductivity type connected between the output terminal and a lower-potential side power supply, and bias control means for controlling the bias voltage applied to a control terminal of said transistor of the second conductivity type;

in said discharging means, a predetermined bias voltage being supplied to the control terminal of said transistor of said discharging means at the beginning of an output period, there being provided a capacitor having one end and the opposite end fed with said input terminal voltage and with said bias voltage, through switches turned in an ON-state, respectively, to hold a differential voltage between the input terminal voltage and the bias voltage; a switching action of switches then being carried out for connecting said output terminal and said control terminal of said transistor of said discharging means to the one end and the opposite end of the capacitor, respectively.

54. The feedback-type amplifier circuit as defined in claim 17, comprising:

discharging means including a transistor connected across said output terminal and the lower potential side power supply, and bias control means for controlling the bias voltage, applied to a control terminal of said transistor, in place of said follower-type discharging means;

in said discharging means, a predetermined bias voltage being supplied to the control terminal of said transistor of said discharging means at the beginning of an output period, there being provided a capacitor having one end and the opposite end fed with said input terminal voltage and with said bias voltage, through switches turned in an ON-state, respectively, to hold a differential voltage between the input terminal voltage and the bias voltage; a switching action of switches then being carried out for connecting said output terminal and said control terminal of said transistor of said discharging means to the one end and the opposite end of the capacitor, respectively.

55. The feedback-type amplifier circuit as defined in claim 51, wherein said transistor of said discharging means is an MOS transistor having a drain and a source connected to an output terminal and to a higher potential side power supply, respectively;

said bias control means includes a first switch connected across a gate of said MOS transistor and a gate bias voltage input terminal;

a capacitor having one end connected to the gate of said MOS transistor; and a second switch connected across the said input terminal and the opposite end of said capacitor; and a third switch connected across the said output terminal and the opposite end of said capacitor;

said first and second switches being turned on and said third switch being turned off at the beginning of said output period; said first and second switches being turned off and said third switch being turned on, subsequently.

56. A feedback-type amplifier circuit comprising:

feedback-type discharging means, including a differential stage for receiving an input-terminal voltage and an output-terminal voltage differentially as inputs and discharging means for performing a discharging operation at the output terminal based on an output from the differential stage, said feedback-type discharging means operating as a follower in which the output-terminal voltage is in-phase with the input-terminal voltage; and charging means including a transistor connected across said output terminal and a higher potential side power supply, and bias control means for controlling the bias voltage applied to a control terminal of said transistor;

said charging means having a bias voltage supply terminal for providing a predetermined bias voltage to the control terminal of said transistor, and voltage holding means for sampling and latching a difference voltage between the input-terminal voltage and the bias voltage from the bias voltage supply terminal to hold the latched difference voltage between the output terminal and the control terminal of said transistor.

57. A feedback-type amplifier circuit comprising:

feedback-type discharging means including a differential pair having differential input terminals connected to an input terminal and an output terminal, load elements each connected to each of a pair of outputs of said differential pair, and a discharging circuit that includes a transistor connected in a discharging path of the output terminal, said transistor having a control terminal to which is input the voltage at a connection node of an output of said differential pair and said load element; and charging means including a transistor connected in a charging path of said output terminal, and bias control means for controlling the bias voltage applied to a control terminal of said transistor connected in the charging path;

said charging means having a bias voltage supply terminal for providing a predetermined bias voltage to the control terminal of said transistor connected in the charging path, and voltage holding means for sampling and latching a difference voltage between the input-terminal voltage and the bias voltage from the bias voltage supply terminal to hold the latched difference voltage between the output terminal and the control terminal of said transistor connected in the charging path.

58. A feedback-type amplifier circuit comprising:

feedback-type discharging means including:

a differential stage including a differential pair for receiving an input-terminal voltage and an output-terminal voltage differentially as inputs, and a current-mirror circuit having an input end and an output end connected to respective ones of a pair of outputs of said differential pair and constituting a load; and a discharging circuit that includes a transistor of a first conductivity type identical with that of said current-mirror circuit, said transistor being connected between a lower-potential side power supply and the output terminal and having a control terminal for receiving the voltage at a connection node of the output end of said current-mirror circuit and the output of said differential pair; and follower-type charging means including a transistor of a second conductivity type connected across said output terminal and a higher potential side power supply, and bias control means for controlling the bias voltage applied to a control terminal of said transistor of the second conductivity type;

said charging means having a bias voltage supply terminal for providing a predetermined bias voltage to the control terminal of said transistor of said charging means, and voltage holding means for sampling and latching a difference voltage between the input-terminal voltage and the bias voltage from the bias voltage supply terminal to hold the latched difference voltage between the output terminal and the control terminal of said transistor of said charging means.

59. The feedback-type amplifier circuit as defined in claim 17, comprising:

charging means including a transistor connected across said output terminal and the higher potential side power supply, and bias control means for controlling the bias voltage, applied to a control terminal of said transistor, in place of said follower-type charging means;

said bias control means of said charging means having a bias voltage supply terminal for providing a predetermined bias voltage to the control terminal of said transistor of said charging means, and voltage holding means for sampling and latching a difference voltage between the input-terminal voltage and the bias voltage from the bias voltage supply terminal to hold the latched difference voltage between the output terminal and the control terminal of said transistor of said charging means.

60. A feedback-type amplifier circuit comprising:

feedback-type discharging means, including
a differential stage for receiving an input-terminal voltage and an output-terminal voltage differentially as inputs and
discharging means for performing a discharging operation at the output terminal based on an output from the differential stage, said feedback-type discharging means operating as a follower in which the output-terminal voltage is in-phase with the input-terminal voltage; and charging means including a transistor connected across said output terminal and a higher potential side power supply, and bias control means for controlling the bias voltage applied to a control terminal of said transistor;

in said charging means, a predetermined bias voltage being supplied to the control terminal of said transistor at the beginning of an output period, there being provided a capacitor having one end and the opposite end fed with said input terminal voltage and with said bias voltage, through switches turned in an ON-state, respectively, to hold a differential voltage between the input terminal voltage and the bias voltage; a switching action of switches then being carried out for connecting said output terminal and said control terminal of said transistor to the one end and the opposite end of the capacitor, respectively.

61. A feedback-type amplifier circuit comprising:

feedback-type discharging means including
a differential pair having differential input terminals connected to an input terminal and an output terminal,
load elements each connected to each of a pair of outputs of said differential pair, and
discharging circuit that includes a transistor connected in a discharging path of the output terminal, said transistor having a control terminal to which is input the voltage at a connection node of an output of said differential pair and said load element; and charging means including a transistor connected in a charging path of said output terminal, and bias control means for controlling the bias voltage applied to a control terminal of said transistor connected in the charging path;

in said charging means, a predetermined bias voltage being supplied to the control terminal of said transistor connected in the charging path at the beginning of an output period, there being provided a capacitor having one end and the opposite end fed with said input terminal voltage and with said bias voltage, through switches turned in an ON-state, respectively, to hold a differential voltage between the input terminal voltage and the bias voltage; a switching action of switches then being carried out for connecting said output terminal and said control terminal of said transistor connected in the charging path to the one end and the opposite end of the capacitor, respectively.

62. A feedback-type amplifier circuit comprising:

feedback-type discharging means including:
a differential stage having
a differential pair for receiving an input-terminal voltage and an output-terminal voltage differentially as inputs, and
a current-mirror circuit having an input end and an output end connected to respective ones of a pair of outputs of said differential pair and constituting a load; and
a discharging circuit that includes a transistor of a first conductivity type identical with that of said current-mirror circuit, said transistor being connected between a lower-potential side power supply and the output terminal and having a control terminal for receiving the voltage at a connection node of the output end of said current-mirror circuit and the output of said differential pair; and charging means including a transistor of a second conductivity type connected across said output terminal and a higher potential side power supply, and bias control means for controlling the bias voltage applied to a control terminal of said transistor of the second conductivity type;

in said charging means, a predetermined bias voltage being supplied to the control terminal of said transistor of said charging means at the beginning of an output period, there being provided a capacitor having one end and the opposite end fed with said input terminal voltage and with said bias voltage, through switches turned in an ON-state, respectively, to hold a differential voltage between the input terminal voltage and the bias voltage; a switching action of switches then being carried out for connecting said output terminal and said control terminal of said transistor of said charging means to the one end and the opposite end of the capacitor, respectively.

63. The feedback-type amplifier circuit as defined in claim 17, comprising:

charging means including a transistor connected across said output terminal and the higher potential side power supply, and bias control means for controlling the bias voltage, applied to a control terminal of said transistor, in place of said follower-type charging means;

in said charging means, a predetermined bias voltage being supplied to the control terminal of said transistor of said charging means at the beginning of an output period, there being provided a capacitor having one end and the opposite end fed with said input terminal voltage and with said bias voltage, through switches turned in an ON-state, respectively, to hold a differential voltage between the input terminal voltage and the bias voltage; a switching action of switches then being carried out for connecting said output terminal and said control terminal of said transistor of said charging means to the one end and the opposite end of the capacitor, respectively.

64. The feedback-type amplifier circuit as defined in claim 60, wherein said transistor of said charging means is an MOS transistor having a drain and a source connected to an output terminal and to a higher potential side power supply, respectively;

said bias control means includes
a first switch connected across a gate of said MOS transistor and a gate bias voltage input terminal;
a capacitor having one end connected to the gate of said MOS transistor; and
a second switch connected across the said input terminal and the opposite end of said capacitor; and
a third switch connected across the said output terminal and the opposite end of said capacitor;

said first and second switches being turned on and said third switch being turned off at the beginning of said output period; said first and second switches being turned off and said third switch being turned on, subsequently.

65. A feedback-type amplifier circuit comprising:

feedback-type charging means, including a differential stage for receiving an input-terminal voltage and an output-terminal voltage differentially as inputs and charging means for performing a charging operation at the output terminal based on an output from said differential stage, said feedback-type charging means operating as a voltage follower in which the output-terminal voltage is in-phase with the input-terminal voltage the input-terminal voltage being a data signal voltage; and follower-type discharging means for performing a discharging operation at the output terminal by a follower operation of an active element based on a voltage difference between the input-terminal voltage and the output-terminal voltage, wherein of all transistors of said follower-type amplifier are MOS type transistors.

66. The amplifier circuit as defined in claim 65, wherein said follower-type discharging means includes:

bias control means, which receives the input-terminal voltage, for controlling an output bias voltage; and a follower transistor connected between the output terminal and a lower-potential side power supply and receiving the bias voltage output from said bias control means applied thereto as an input, an output current of said follower transistor controlled on the basis of a difference voltage between the output-terminal voltage and the bias voltage.

67. The amplifier circuit of claim 65, wherein, the feedback-type charging means comprises a differential pair having differential input terminals connected to an input terminal and an output terminal and load elements each connected to each of a pair of outputs of said differential pair;

the charging means comprises a charging circuit that includes a transistor connected in a charging path of the output terminal, said transistor having a control terminal for receiving the voltage at a connection node of an output of said differential pair and said load element; and the follower-type discharging means comprises
a follower transistor connected between the output terminal and a lower-potential side power supply, and
a diode-connected transistor, which is inserted between the input terminal and the lower-potential side power supply and is driven by a constant-current source, said diode-connected transistor having a control terminal connected to the control terminal of said follower transistor.

68. The feedback-type amplifier circuit of claim 65, wherein, the feedback-type discharging means comprises
a differential pair having differential input terminals connected to an input terminal and an output terminal, and
load elements each connected to each of a pair of outputs of said differential pair;

the discharging means comprises a discharging circuit that includes a transistor connected in a discharging path of the output terminal, said transistor having a control terminal to which is input the voltage at a connection node of an output of said differential pair and said load element; and the follower-type charging means comprises
a follower transistor connected between the output terminal and a higher-potential side power supply, and
a diode-connected transistor, which is inserted between the higher-potential side power supply and the input terminal and is driven by a constant-current source, said diode-connected transistor having a control terminal connected to the control terminal of said follower transistor.

69. A feedback-type amplifier circuit comprising:

feedback-type charging means including:
a differential stage including
a differential pair which receives an input-terminal voltage and an output-terminal voltage differentially as inputs, and
a current-mirror circuit having an input end and an output end connected to respective ones of a pair of outputs of said differential pair and constituting a load;
a charging circuit that includes a transistor of a conductivity type identical with that of said current-mirror circuit, said transistor being connected between a higher-potential side power supply and the output terminal and having a control terminal for receiving the voltage at a connection node of the output end of said current-mirror circuit and the output of said differential pair; and follower-type discharging means including
a follower transistor connected between the output terminal and a lower-potential side power supply, and a diode-connected transistor, which is inserted between the input terminal and the lower-potential side power supply and is driven by a constant-current source, said diode-connected transistor having a control terminal connected to the control terminal of said follower transistor, wherein all transistors of said follower-type amplifier are MOS type transistors.

70. The amplifier circuit as defined in claim 69, wherein said follower-type discharging means includes a constant-current source between the higher-potential side power supply and a connection node of said diode-connected transistor and the input terminal.

71. The amplifier circuit as defined in claim 69, wherein said follower-type discharging means includes a constant-current source between the higher-potential side power supply and a connection node of said follower transistor and the output terminal.

72. The amplifier circuit as defined in claim 69, wherein a constant current source is provided between the control terminal of said transistor of said charging circuit of said feedback-type charging means and the higher-potential side power supply, and a constant-current source is provided between the control terminal of said transistor of said charging circuit and the lower-potential side power supply.

73. The amplifier circuit as defined in claim 69, wherein an output of a transistor which receives the output-terminal voltage as an input and which is one of a transistor pair constituting said differential pair is connected to the input end of said current-mirror circuit, and an output of a transistor which receives the input-terminal voltage as an input and which is the other of said transistor pair is connected to the output end of said current-mirror circuit.

74. The amplifier circuit as defined in claim 69, wherein said differential stage has a plurality of transistors which receive the input-terminal voltage commonly as inputs;

said current-mirror circuit has its input end connected to the output of a transistor which receives the output-terminal voltage as an input, said current-mirror circuit having a plurality of output ends; and the plurality of output ends of said current-mirror circuit are commonly connected to a plurality of commonly connected outputs of the transistors which receive the input-terminal voltage commonly as inputs, and are connected to the control terminal of the transistor of said charging circuit.

75. The amplifier circuit as defined in claim 69, wherein a transistor which receives the input-terminal voltage as an input and which is one of a transistor pair constituting said differential pair in said differential stage has a current driving capability that is a prescribed multiple of a driving current capability of a transistor which receives the input-terminal voltage as an input and which is the other of said transistor pair;

said current-mirror circuit of said differential stage has its input end connected to the output of the transistor to which the terminal voltage is input, and a transistor constituting the output end has a current driving capability that is a prescribed multiple of a driving current capability of a transistor constituting the input end; and a connection node of the output end of said current-mirror circuit of said differential stage and the output of the transistor which receives the input-terminal voltage as an input is connected to the control terminal of the transistor of said charging circuit.

* * * * *